(12) United States Patent
Gabara

(10) Patent No.: US 7,508,280 B2
(45) Date of Patent: *Mar. 24, 2009

(54) FREQUENCY ADJUSTMENT TECHNIQUES IN COUPLED LC TANK CIRCUITS

(75) Inventor: Thaddeus John Gabara, Murray Hill, NJ (US)

(73) Assignee: LC Tank LLC, Murray Hill, NJ (US)

( * ) Notice: Subject to any disclaimer, the term of this patent is extended or adjusted under 35 U.S.C. 154(b) by 27 days.

This patent is subject to a terminal disclaimer.

(21) Appl. No.: 11/184,428

(22) Filed: Jul. 19, 2005

(65) Prior Publication Data

US 2007/0018739 A1   Jan. 25, 2007

(51) Int. Cl.
*H03B 5/12* (2006.01)
*G01D 5/20* (2006.01)

(52) U.S. Cl. .................. 331/181; 331/46; 331/55; 331/117 FE; 331/167

(58) Field of Classification Search .......... 331/117 FE, 331/181, 36 L, 46, 55, 117 R, 167
See application file for complete search history.

(56) References Cited

U.S. PATENT DOCUMENTS

| | | | |
|---|---|---|---|
| 4,286,704 | A | 9/1981 | Wood |
| 5,396,195 | A | 3/1995 | Gabara |
| 5,475,345 | A | 12/1995 | Gabara |
| 5,528,199 | A | 6/1996 | Dunlop |
| 5,872,489 | A | 2/1999 | Chang |
| 5,966,063 | A | 10/1999 | Sato |
| 6,060,759 | A | 5/2000 | Dhong |
| 6,175,285 | B1 | 1/2001 | Gabara |
| 6,225,677 | B1 | 5/2001 | Kobayashi |
| 6,249,192 | B1 | 6/2001 | Gabara |
| 6,304,146 | B1 * | 10/2001 | Welland ............ 331/2 |
| 6,317,008 | B1 | 11/2001 | Gabara |
| 6,323,735 | B1 * | 11/2001 | Welland et al. ........ 331/36 L |
| 6,621,365 | B1 * | 9/2003 | Hallivuori et al. ...... 331/179 |
| 6,650,220 | B2 | 11/2003 | Sia |
| 6,661,325 | B2 | 12/2003 | Suh |
| 6,714,086 | B1 | 3/2004 | Landrith |
| 6,891,444 | B2 | 5/2005 | Jacobsson |
| 6,911,870 | B2 | 6/2005 | Gierkink |

(Continued)

OTHER PUBLICATIONS

Mohan et al., Simple Accurate Expressions for Planar Sprial Inductances, IEEE J. of Solid-state Circuits, vol. 34, No. 10, Oct. 1999, pp. 1419-1424.

(Continued)

*Primary Examiner*—Robert Pascal
*Assistant Examiner*—James E Goodley
(74) *Attorney, Agent, or Firm*—Thaddeus Gabara

(57) ABSTRACT

CMOS LC tank circuits and flux linkage between inductors can be used to distribute and propagate clock signals over the surface of a VLSI chip or µprocessor. The tank circuit offers an adiabatic behavior that recycles the energy between the reactive elements and minimizes losses in a conventional sense. Flux linkage can be used to orchestrate a number of seemingly individual and distributed CMOS LC tank circuits to behave as one unit. Several frequency-adjusting techniques are presented which can be used in an distributed clock network environment which includes an array of oscillators. A passive flux linkage, mechanical, and finite state machine technique of frequency adjustment of oscillators are described.

23 Claims, 47 Drawing Sheets

U.S. PATENT DOCUMENTS

| | | | |
|---|---|---|---|
| 6,943,635 | B1 | 9/2005 | Kaltenecker |
| 6,982,605 | B2 * | 1/2006 | Mondal et al. .......... 331/117 R |
| 7,005,930 | B1 | 2/2006 | Kim |
| 7,038,443 | B2 * | 5/2006 | Proksch et al. ......... 324/207.18 |
| 7,078,998 | B2 | 7/2006 | Zhang |
| 7,109,810 | B2 | 9/2006 | Senthilkumar |
| 7,138,877 | B2 | 11/2006 | Vu |
| 7,317,354 | B2 | 1/2008 | Lee |
| 2003/0001652 | A1 | 1/2003 | O'Mahony |
| 2003/0206067 | A1 | 11/2003 | Wong |

OTHER PUBLICATIONS

Hall et al., Clock Distribution Using Cooperative Ring Oscillators, Proc. IEEE 17th Conf. Advanced Research in VLSI, 1997, pp. 62-75.

Galton et al., Clock Distribution Using Coupled Oscillators, Proc. of the 1996 IEEE Inter. Symp. on Cir. and Systems, May 12-15, vol. 3, pp. 217-220.

Wood et al., Rotary Traveling-Wave Oscillator Arrays: A New Clock Technology, IEEE J. of Solid-state Circuits, vol. 36, No. 11, Nov. 2001, pp. 1654-1665.

Rofougaran, et al, "A 900MHz CMOS LC-Oscillator with Quadrature Outputs", SP24.6, 1996 IEEE International Solid State Conference, pp. 392-393.

Chan, S., "Uniform-Phase Uniform-Amplitude Resonant-Load Global Clock Distributions", IEEE J. Solid State, vol. 40, Issue 1, Jan. 2005, pp. 102-109.

* cited by examiner

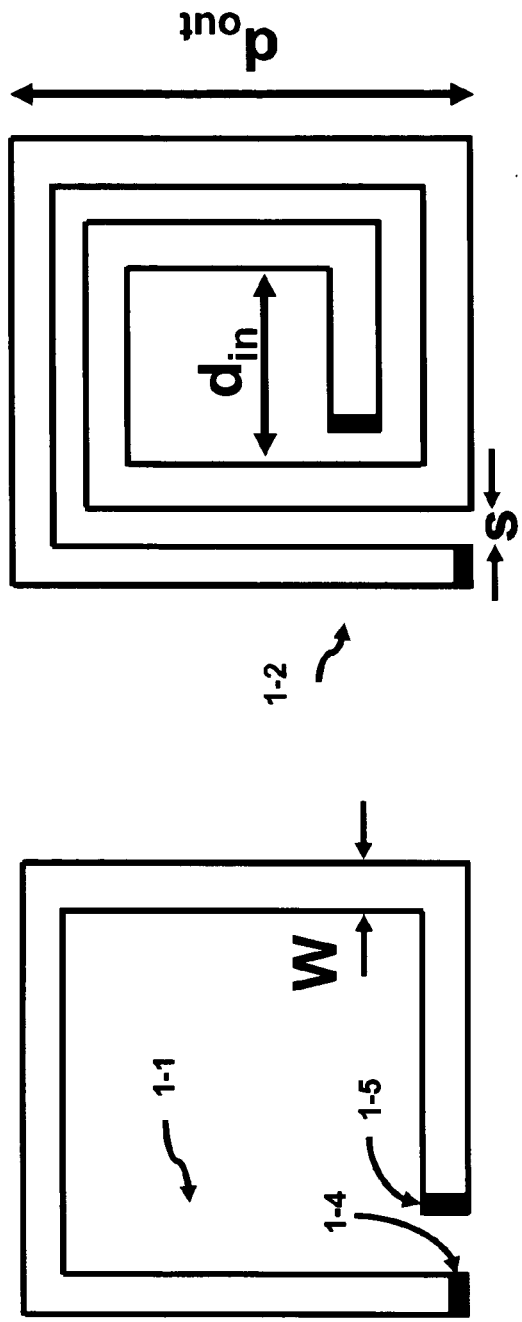
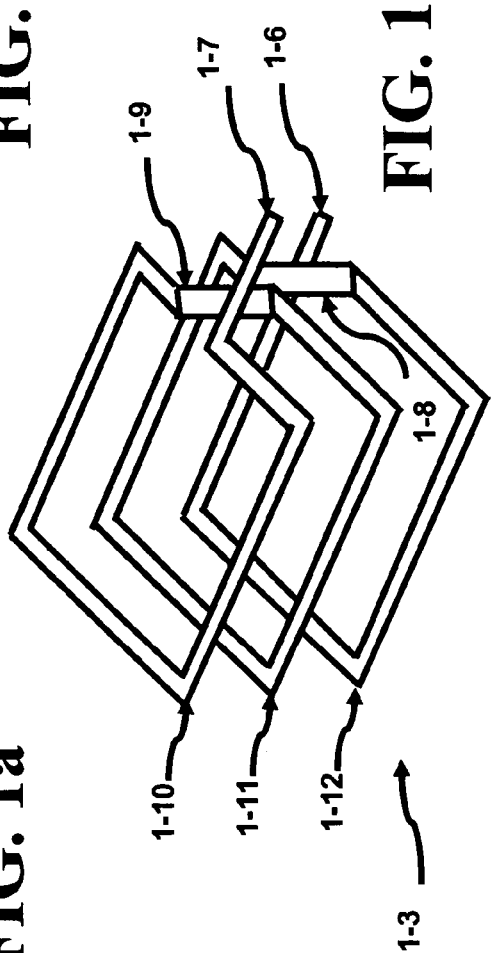
FIG. 1a
FIG. 1b
FIG. 1c

| $L_{equ}$ (nH) | N (turns) | $D_{out}$ (μm) | $D_{in}$ (μm) | W (μm) | SQ (□'s) | $R_{equ}$ (Ω) | $C_{ox}$ (pF) |
|---|---|---|---|---|---|---|---|
| 0.565 | 1 | 250 | 210 | 20 | 43.4 | 0.434 | 0.35 |
| 1.266 | 1 | 500 | 460 | 20 | 93.4 | 0.934 | 0.725 |
| 1.99 | 1 | 750 | 710 | 20 | 143.4 | 1.434 | 1.1 |
| 2.73 | 1 | 1000 | 960 | 20 | 193.4 | 1.934 | 1.48 |
| 3.46 | 1 | 1250 | 1210 | 20 | 243.4 | 2.434 | 1.86 |

| $L_{equ}$ (nH) | N (turns) | $D_{out}$ (μm) | $D_{in}$ (μm) | W (μm) | SQ (□'s) | $R_{equ}$ (Ω) | $C_{ox}$ (pF) |
|---|---|---|---|---|---|---|---|
| 0.633 | 1 | 250 | 230 | 10 | 86.8 | 0.868 | 0.175 |
| 1.364 | 1 | 500 | 480 | 10 | 186.8 | 1.868 | 0.3625 |
| 2.097 | 1 | 750 | 730 | 10 | 286.4 | 2.864 | 0.55 |
| 2.83 | 1 | 1000 | 980 | 10 | 386.8 | 3.868 | 0.74 |
| 3.56 | 1 | 1250 | 1230 | 10 | 486.8 | 4.868 | 0.93 |

FIG. 1f

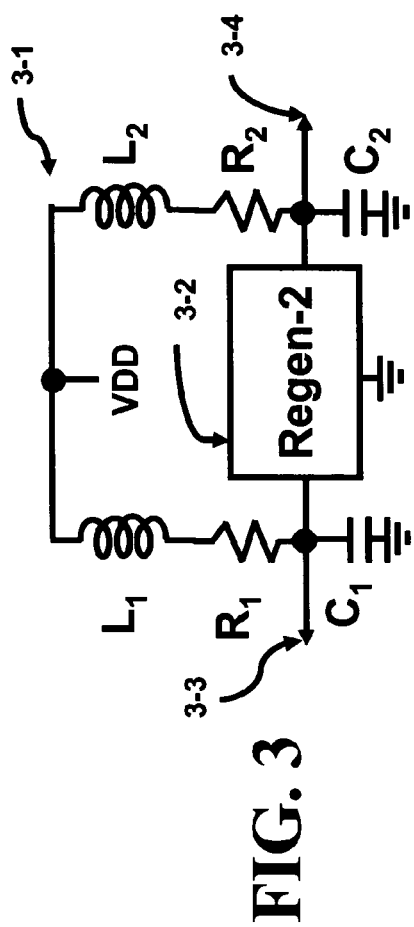
FIG. 3
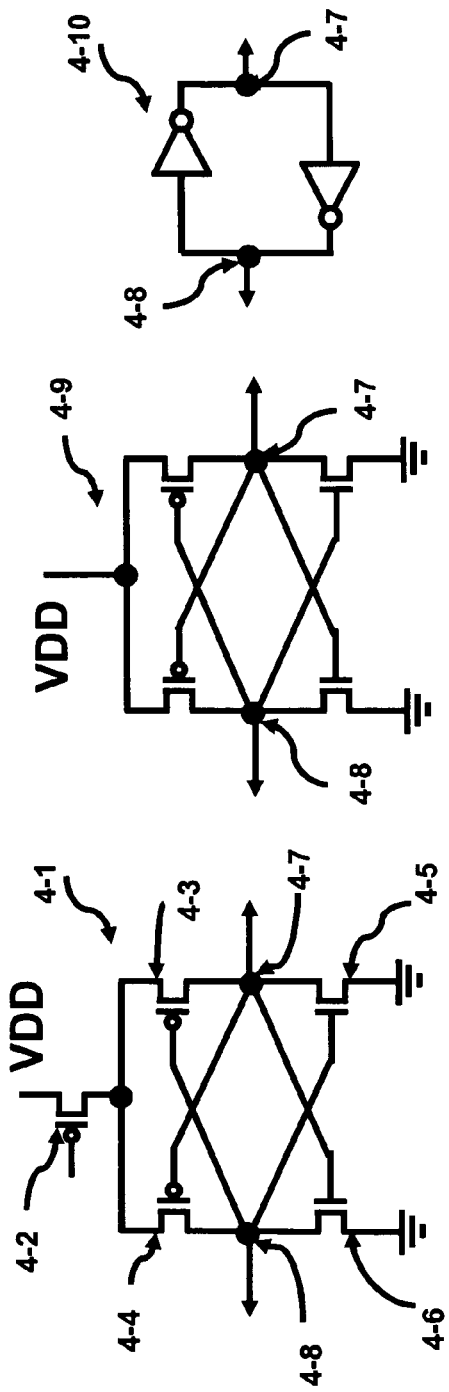
FIG. 4a
FIG. 4b
FIG. 4c

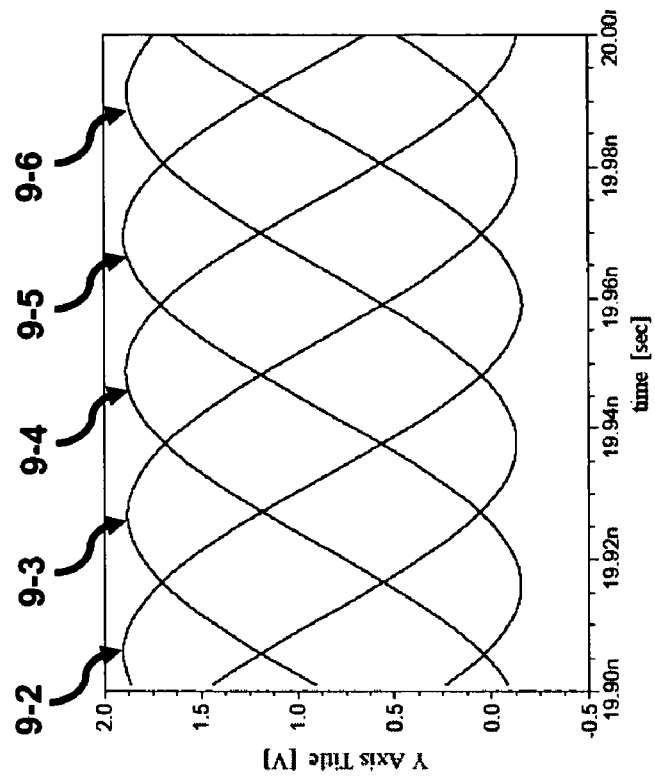
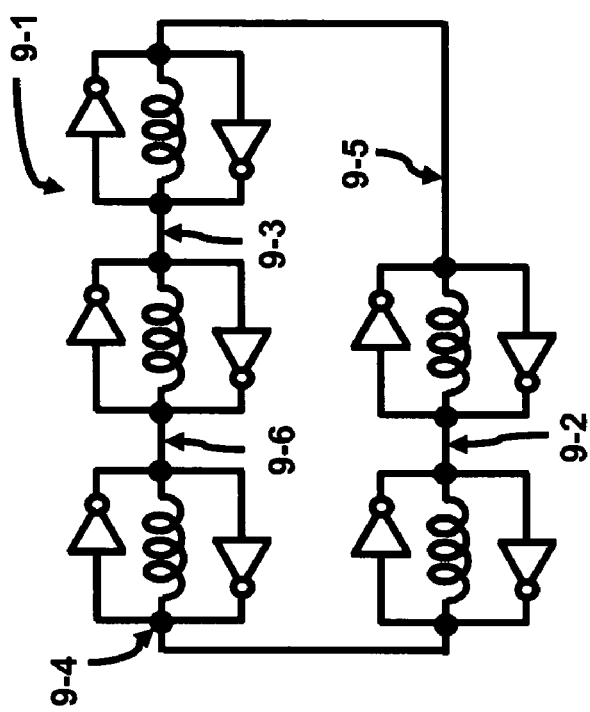
FIG. 9b
FIG. 9a

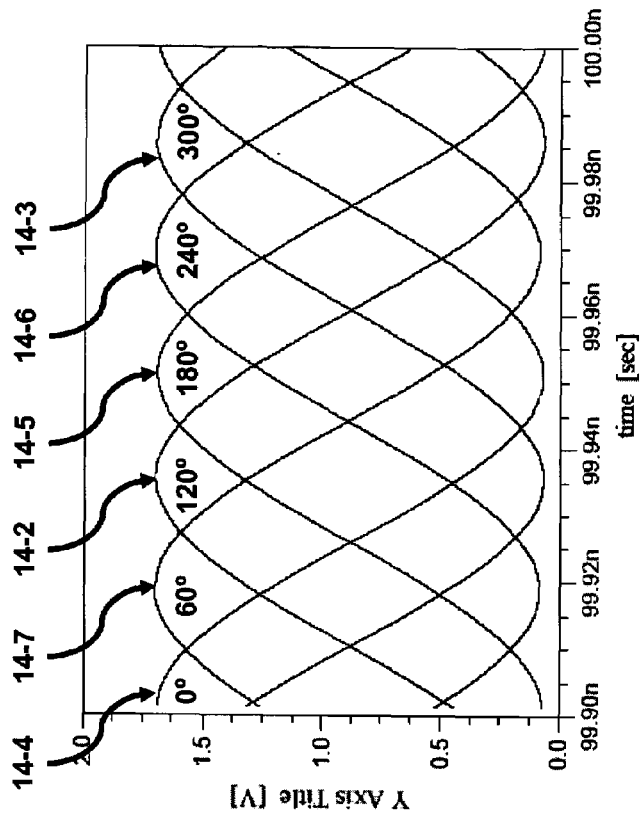
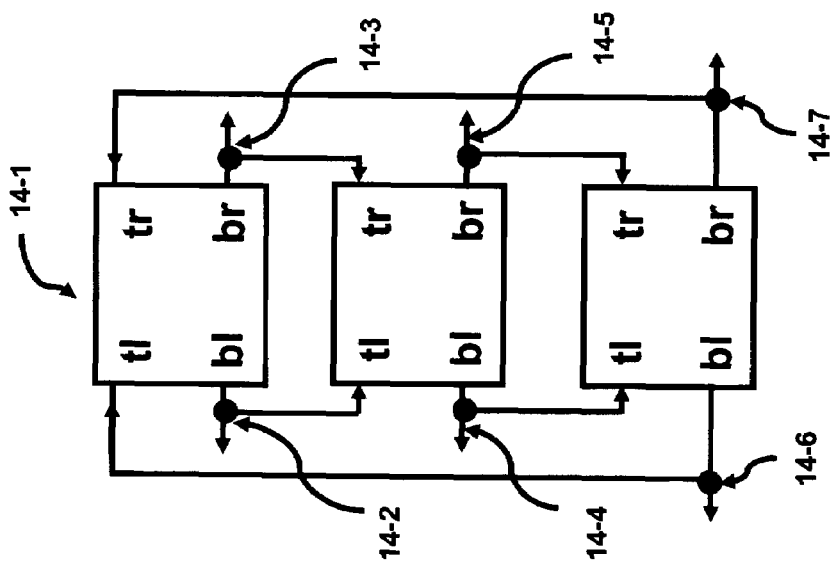
FIG. 14b
FIG. 14a 21-10, 21-11, 21-12, 21-13,
21-14, 21-15, 21-16, 21-17

21-10, 21-11, 21-12, 21-13,
21-14, 21-15, 21-16, 21-17

| item | Layout FIG. 21b | Future μ processor |
|---|---|---|
| Area/cell | 500μm X 250μm | 500μm X 250μm |
| Total Area | 1000μm X 1000μm | 16000μm X 16000μm |
| # of cells | 8 | 2048 |
| C/cell | 1.0pF | 1.0pF |
| $C_{tot}$ | 8.0pF | 2048pF |
| Power/cell | 2mW | 2mW |
| Total Power | 16mW | 4.1W |

FIG. 21g

| Frequency | 8 GHz |
|---|---|
| Process | 0.13μm |
| VDD | 1.2V |
| $R_{sheet}$ | 0.01Ω/□ |
| $W_p/W_n$ | 30μm/15μm |
| L | 0.633nH |
| R | 0.868Ω |
| # of L | 2 |
| $L_{equ}$ | 0.322nH |
| $R_{equ}$ | 0.434Ω |
| Range of k | 0.4 to 0.03 |

FIG. 21f

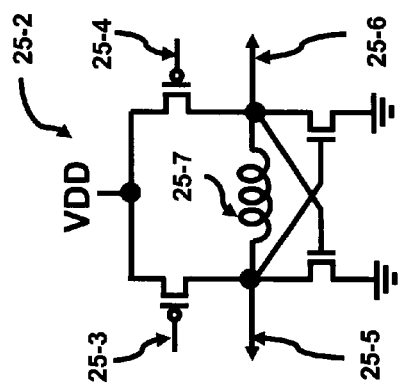
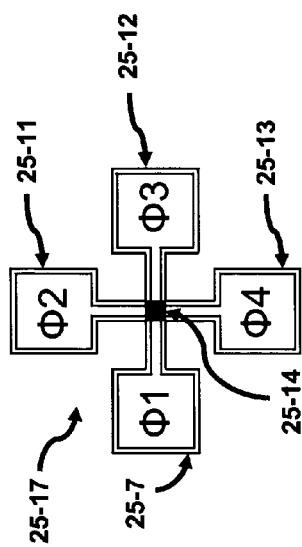
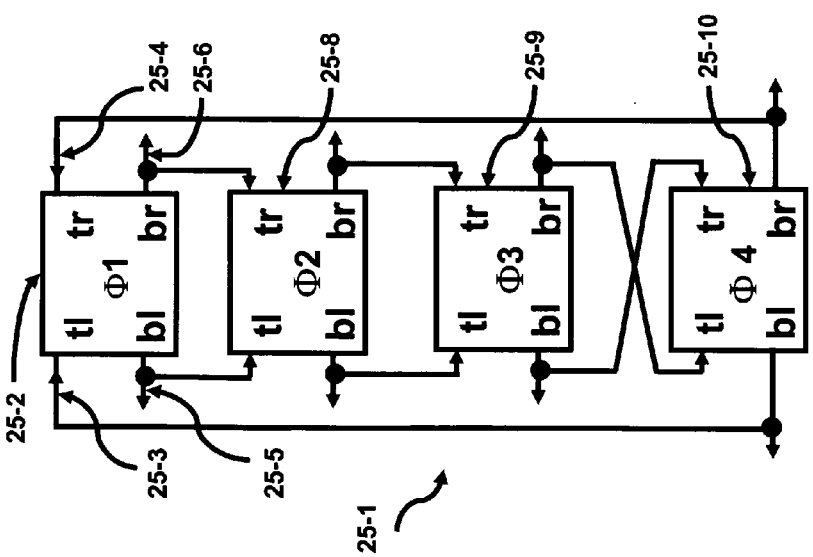
FIG. 25b
FIG. 25c
FIG. 25a

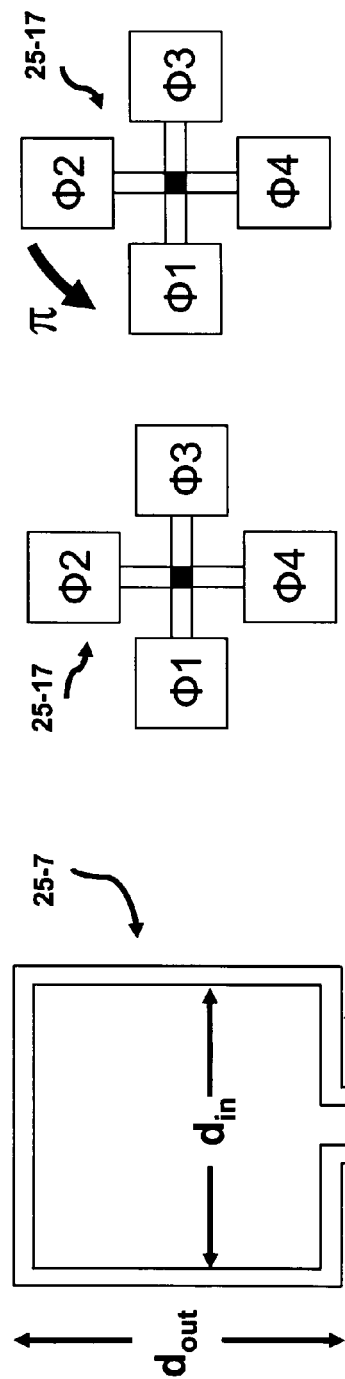
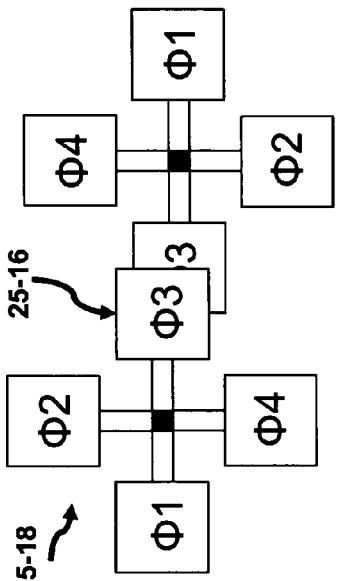
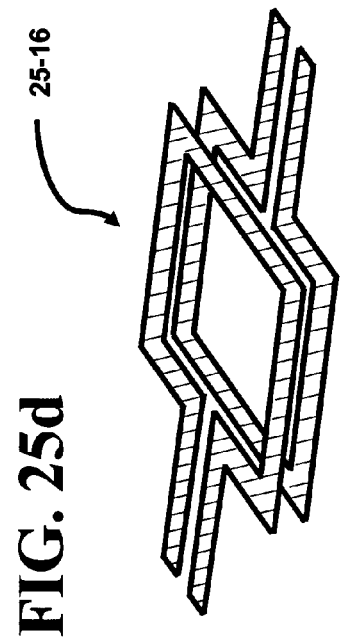
FIG. 25d
FIG. 25e
FIG. 25f
FIG. 25g

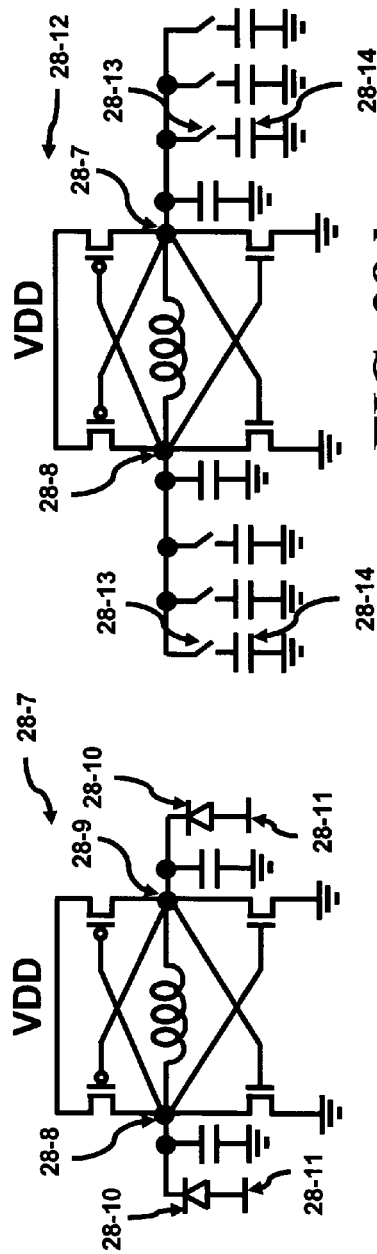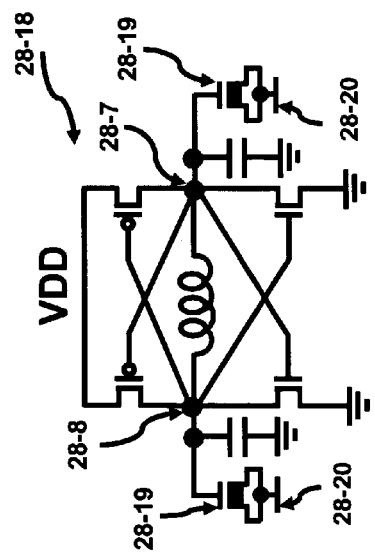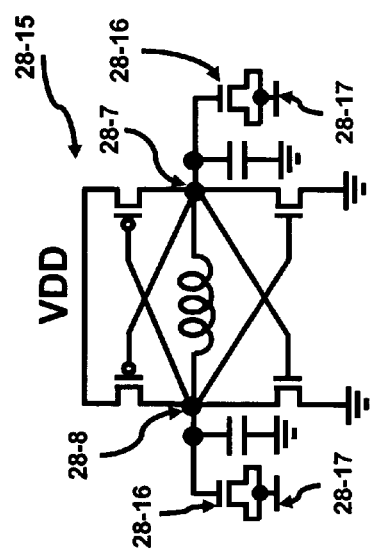
FIG. 28c
FIG. 28d
FIG. 28e
FIG. 28f

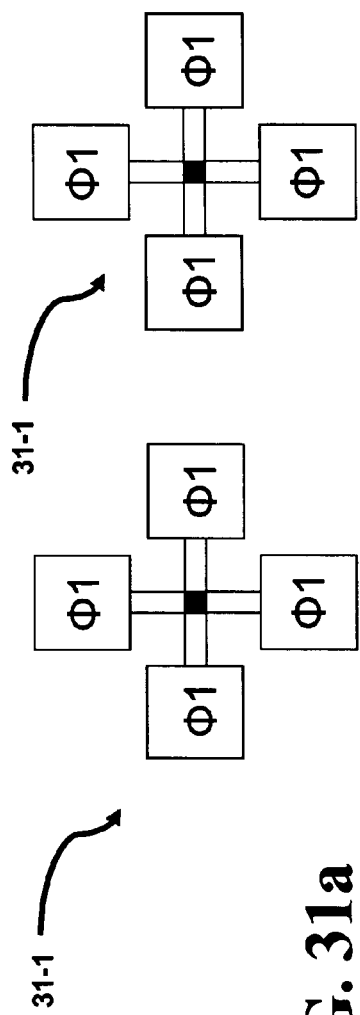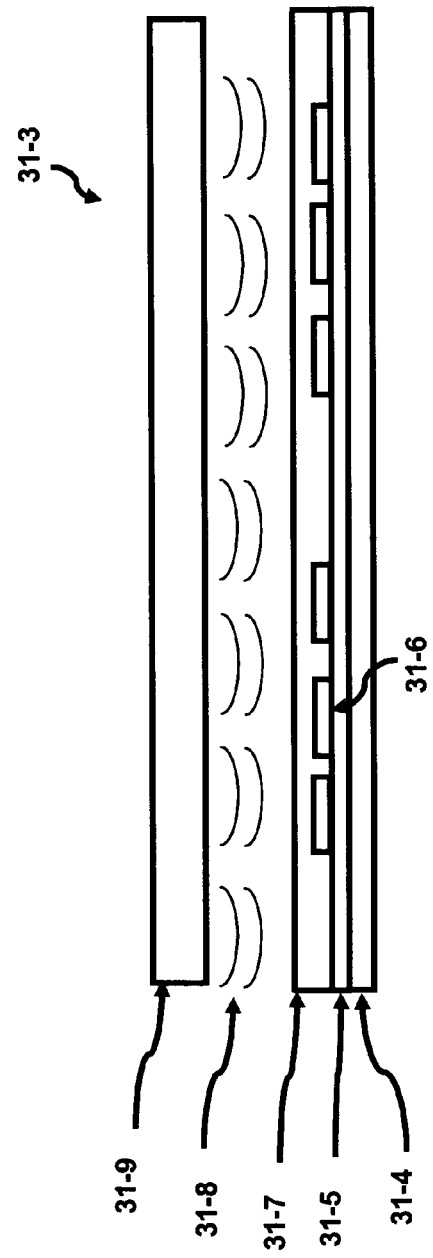
FIG. 31a
FIG. 31b

FREQUENCY ADJUSTMENT TECHNIQUES IN COUPLED LC TANK CIRCUITS

CROSS-REFERENCE TO RELATED APPLICATIONS

The present application is related to the co-filed U.S. applications Ser. No. 11/184,768, 11/184,767 and 11/185,001 filed on Jul. 19, 2005, which are invented by the same inventor as the present application and incorporated herein by reference in their entireties.

BACKGROUND OF THE INVENTION

Electronic consumer products are pushing both the bounds of computation complexity and high clocking frequencies. The systems that are experiencing these problems include: VLSI (Very Large Scale Integration), microprocessors, ASIC's (Application Specific Integrated Circuit), SOC (System On a Chip) and FPGA's (Field Programmable Gate Arrays). All of these systems operate at clock frequencies that increase dramatically each year. This higher clock frequency coupled with the increased size of the die creates some fundamental problems in heat removal from the die and clock distribution over the surface of the die.

The power dissipation typically follows the rule:

$$P = \frac{1}{2}CV^2 f \quad (1)$$

which for a 1 pF load being clocked at a frequency of 10 GHz is 7.2 mW. Adiabatic techniques can reduce these power dissipation levels. It would be worthwhile to investigate if these techniques can be used advantageously to help solve these problems.

Some of the basic circuit blocks to help achieve the ability for mobility, low power, and high computation require the necessity of a clock oscillator block. Tank circuits have been used to generate oscillatory clock signals. These circuits use LC (inductor-capacitor) elements to form the tank circuit and they have the adiabatic quality that may be used to reduce the power dissipation.

For example, U.S. Pat. No. 5,396,195 issued Mar. 7, 1995 to Gabara proposed a basic LC tank circuit in an MOS technology. The circuit consists of a tank circuit driven by a cross-coupled MOS circuit. The oscillations generated by the MOS LC tank circuit fabricated in a 0.9 um CMOS technology operated with a supply voltage of 3.3V. The power dissipation was reduced by a factor of a 10× when a capacitive load was driven using an LC tank circuit as compared to being driven using conventional digital techniques. This circuit has been used in a multitude of applications ranging from wireless to on-chip clock generation modules. Many of the inductors used in this type of tank circuit have the form of the horizontal planar inductor as illustrated in FIG. 1a and FIG. 1b. These type of inductors typically require a large amount of area to form the inductor.

The calculation of the values of planar inductors are provided in a published paper, "Simple Accurate Expressions for Planar Spiral Inductances", IEEE J. Solid-State Circuits, Vol. 34, No. 10, October 1999, by Mohan et al., hereafter referred to as the "Mohan" reference.

In addition, the Q or quality factor of these inductors that are fabricated in CMOS are typically low. The quality factor or Q is a primary parameters in the evaluation of tank circuits.

$$Q = 2\pi \frac{\text{Maximum energy stored in tank circuit}}{\text{Energy dissipated per cycle}} \quad (2)$$

The Q indicates the amount of energy dissipated by the tank circuit to maintain oscillations. The tank circuit is more energy efficient as the value of the Q term increases which indicates that the energy dissipated in the tank circuit decreases. One way to decrease the dissipation is to reduce the parasitic resistance of the inductor.

An oscillator block provides the ability to regulate the flow of computation data within a VLSI (Very Large Scale Integration). For instance, the on chip clock frequency of a high-end microprocessor is expected to reach 10 GHz before the end of this decade. In addition, the power dissipation for the microprocessor is expected to be about 200 W, where the clock network will consume almost half of this power or 100 W. Thus, for this microprocessor, the higher frequencies and larger power dissipation values indicate a need to have clock circuits that can easily generate a 10 GHz signal and should be able to reduce the power dissipation of the clock network. The clock network of these VLSI chips typically contains large values of capacitance that need to be driven.

Currently, H-trees are used to distribute clocks over the surface of a die. Almost half of the power dissipated in chip designs occurs in the clock network of VLSI and microprocessor chips. This is largely due to the capacitive and resistive load of the clock network.

Several authors have addressed the clocking issue to determine achieve lower power, lower skew, and higher frequency of operation.

In O'Mahony et al., a U.S. PGPUB. 2003/0001652 A1 published Jan. 2, 2003, they use a hierarchical clock distribution. The clock is sent to a plurality of clock grids by way of transmissions lines, and then each grid distributes the clock to the load. They use salphasic clocking which takes advantage of standing waves along a transmission line. The position of the receiver points must conform to positions that are multiple of one-half wavelength from one another dependant on the clock frequency. This will lock the frequency of the die into a range dependant on the half-wavelength. The loads however do not have to obey this constraint.

In Galton et al., "Clock Distribution Using Coupled Oscillators", Proceeding of the 1996 IEEE Inter. Symp. On Circuits and Systems, May 12-15, Vol. 3, pp. 217-220, they suggest using strongly coupled RC oscillators to distribute a clock signal over the die. Their technique uses transmission line that can be less than a quarter of a wavelength long. In addition, the transmission line can be lossy to couple the RC oscillators. Injection locking is used to lock all the oscillators in frequency.

In Hall et al., "Clock Distribution Using Cooperative Ring Oscillators", Proc. IEEE 17$^{th}$ Conf. Advanced Research in VLSI, 1997, pp. 62-75, a cooperative ring oscillator is used to distribute a clock signal within the die. They also provide multiple clock phases in the distribution. Their circuit expands the ring oscillator from a simple ring to an N-dimensional mesh. This array does not have to be regular. One of the concerns is aggregation that is the non-ideal characteristic variations of the VLSI interconnect. This is a concern since interconnect that is used to connect the inverters of the ring oscillators. This factor dissipates power and introduces skew into the network.

In Wood et al., "Rotary Traveling-Wave Oscillator Arrays: A New Clock Technology", IEEE J. Solid-State Circuits, Vol. 36, No. 11, November 2001, a rotary traveling wave oscillator array is presented. It consists of a balanced set of transmission lines with distributed CMOS latches to power the oscillation and ensure rotation lock. A waveform propagates along the balanced transmission line that is looped at its ends so that the wave continues to propagate. In their design it is important that careful attention is required to guard against magnetic field coupling between the clock conductors since it will affect the potential performance of their oscillators.

The technique presented here does not need to be constrained by half-wavelength or quarter-wavelength considerations as in O'Mahoney or Galton. In addition, Galton suffers from lossy transmission lines that are used to couple the RC oscillators together as well as the loss in the RC oscillator. As pointed out by Hall, the power dissipation in their technique is an issue for two factors; the ring oscillators dissipates power and the propagation of the signals in the interconnect dissipate power. The technique presented here uses adiabatic techniques to help overcome the particular losses of Hall and Galton. Finally, in Wood, magnetic field coupling is an undesirable condition; the technique presented here thrives on magnetic field coupling.

The need for frequency adjustment of an array of oscillators is an important factor to overcome the limitation of any clock distribution network that is based on a wavelength-based layout. The wavelength-based layout will have a limited range of tuning and it would be desirable to extend the tuning range of a distributed clock network. The technique presented here provides such an outlet.

BRIEF SUMMARY OF THE INVENTION

Clock networks and clock generation in VLSI chips is a critical issue to high performance circuit operation. The distribution and minimization of power dissipation of the clock network is an important consideration when designing VLSI circuits. The adiabatic behavior of resonant circuits can be utilized to help resolve both of these designs considerations. Inductors and capacitors play a key role in energy recycling and distribution. The CMOS tank circuit or oscillator serves as the fundamental building block to create, distribute and maintain high frequency behavior in VLSI designs at low power dissipation levels.

The basic invention is connect many CMOS tank circuits together and use the electrical and flux linkage of the resonant circuits to achieve a unified circuit behavior that is beneficial to the generation and propagation of clock signals over a surface region of the VLSI die. Thus, this network will distribute and synchronize a clock signal over the surface of a die. The need arises to be able to adjust the frequency of operation of the network. For instance, the effect of process, voltage and temperature variations may need to be compensated.

Yet another aspect of this invention is to adjust the frequency of an oscillator and LC tank circuits using several different techniques. A Finite State Machine in conjunction with a comparator circuit can be used to test and adjust the frequency of each of the oscillators. In one case a global coarse adjustment can be performed to move the target frequency of the entire clock array. This allows the movement of the frequency of operation of the entire array at once. In another case, a passive flux linkage circuit can be used to adjust the frequency of operation. This method can adjust the frequency by almost a factor of two. Finally, a mechanical flux linkage a circuit is described that can be used to adjust the frequency of a system of oscillators. This can also adjust the frequency by a factor of two.

BRIEF DESCRIPTION OF THE SEVERAL VIEWS OF THE DRAWINGS

FIG. 1a-b illustrates two planar inductor structures.

FIG. 1c presents a view of a planar inductor that has a helix structure.

FIG. 1f provides the calculated parameters of several inductors with a width of 10 μm.

FIG. 3 shows a Hartley oscillator connected to a regenerative circuit.

FIG. 4a-f shows several examples of a regenerative circuit.

FIG. 5c provides a simplified circuit representation of FIG. 5a.

FIG. 6a provides a simplified circuit representation of FIG. 5a.

FIG. 9a depicts a five-stage closed loop LC tank circuit in accordance with the present invention.

FIG. 9b provides the simulated waveforms of the five-stage closed loop LC tank circuit in accordance with the present invention.

Figure 13B:
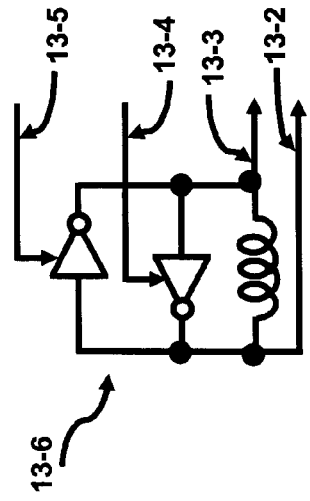
Figure 13C:
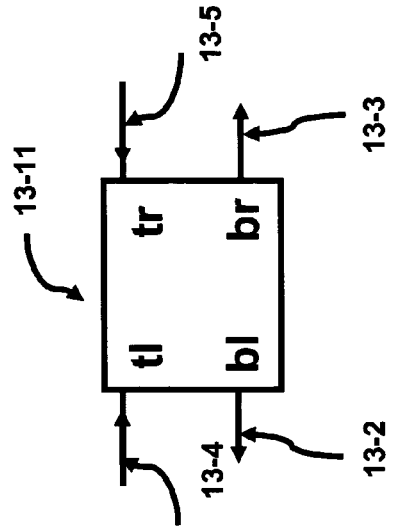
Figure 13A:
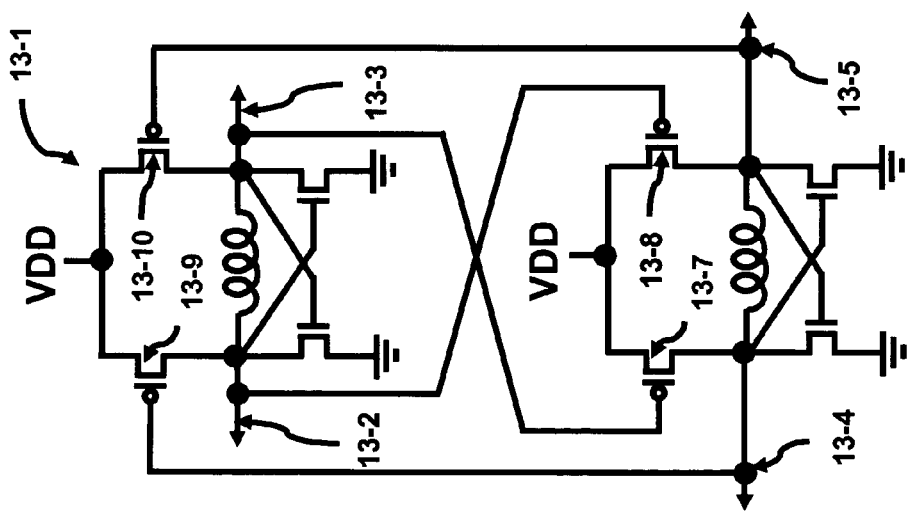

12b depicts the simulated waveforms of the balanced three-phase closed loop LC tank circuit in accordance with the present invention FIG. 13a provides a two-stage balanced closed loop with active transistors in an LC tank circuit in accordance with the present invention.

Figure 13E:
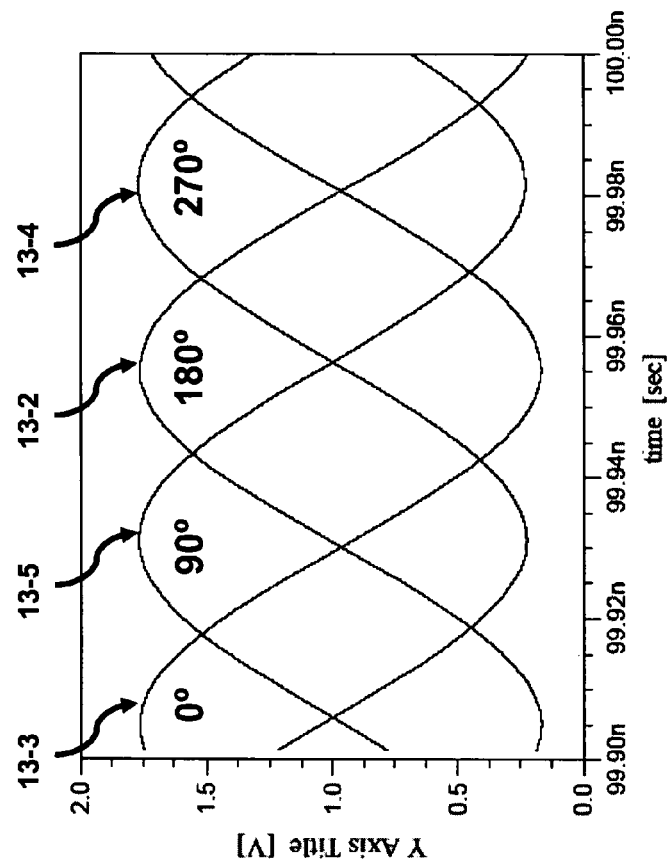
Figure 13D:
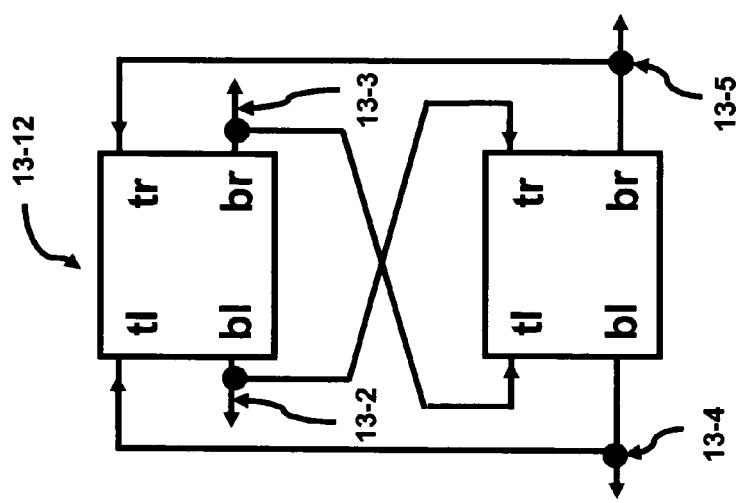

FIG. 13b-c depicts a simplified circuit representation of a single component of the two-stage balanced closed loop with active transistors in an LC tank circuit in accordance with the present invention FIG. 13d provides a simplified block diagram of a two-stage balanced closed loop with active transistors in an LC tank circuit in accordance with the present invention.

FIG. 13e illustrates the waveforms of a two-stage balanced closed loop with active transistors in an LC tank circuit in accordance with the present invention.

FIG. 14a provides a three-stage balanced closed loop with active transistors in an LC tank circuit in accordance with the present invention.

FIG. 14b illustrates the waveforms of a three-stage balanced closed loop with active transistors in an LC tank circuit in accordance with the present invention.

Figure 15B:
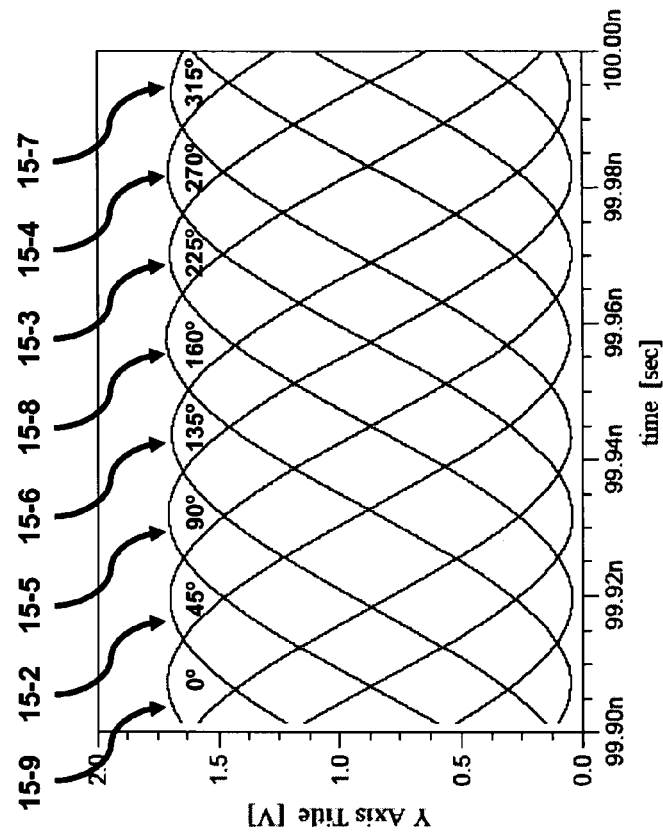
Figure 15A:
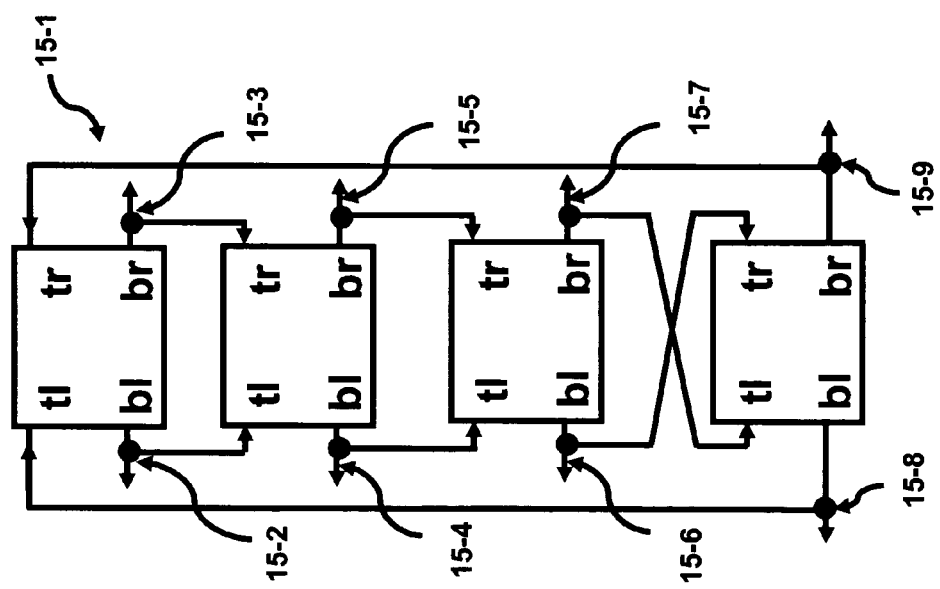

FIG. 15a provides a four-stage balanced closed loop with active transistors in an LC tank circuit in accordance with the present invention.

FIG. 15b illustrates the waveforms of a four-stage balanced closed loop with active transistors in an LC tank circuit in accordance with the present invention.

Figure 5A:
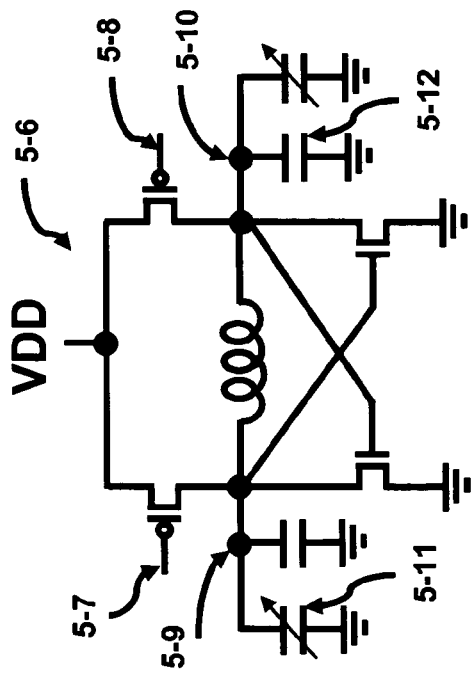
FIG. 5a shows circuit schematics where an inductor, capacitors and regenerative circuit are combined together.
Figure 16A:
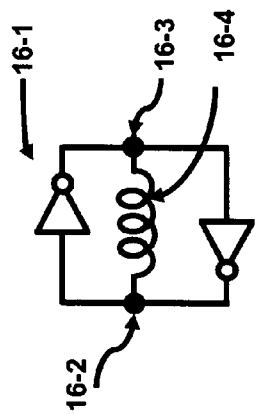

FIG. 16a provides a simplified circuit representation of FIG. 5a.

Figure 16B:
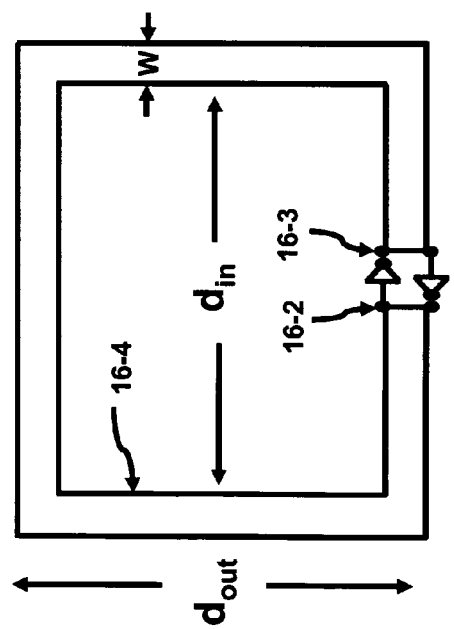

FIG. 16b depicts a regenerative circuit connected to a physical inductor.

Figure 17A:
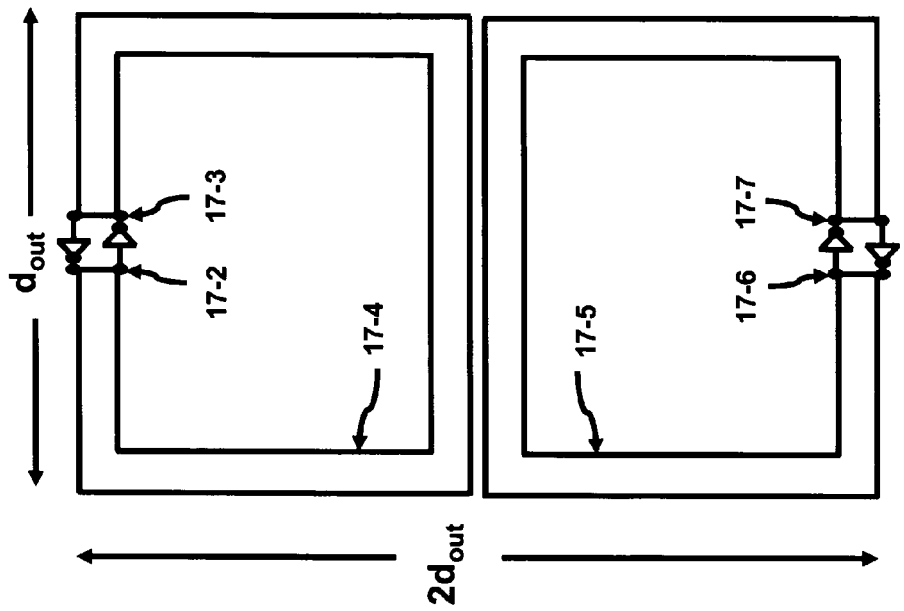

FIG. 17a illustrates two instances of a regenerative circuit connected to a physical inductor where the inductors have flux linkage in accordance with the present invention.

Figure 17C:
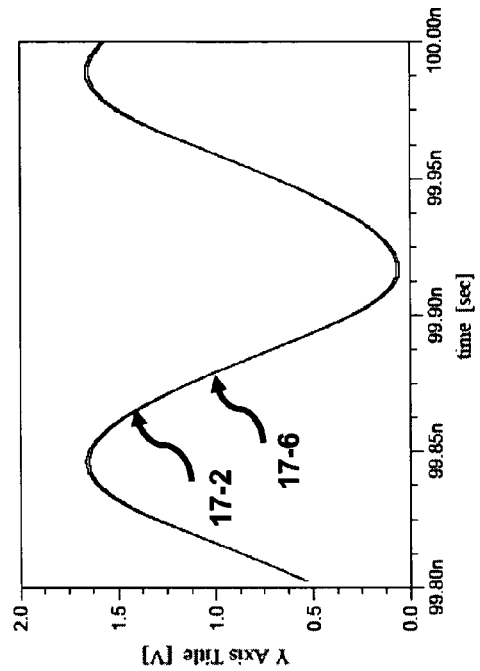
Figure 17B:
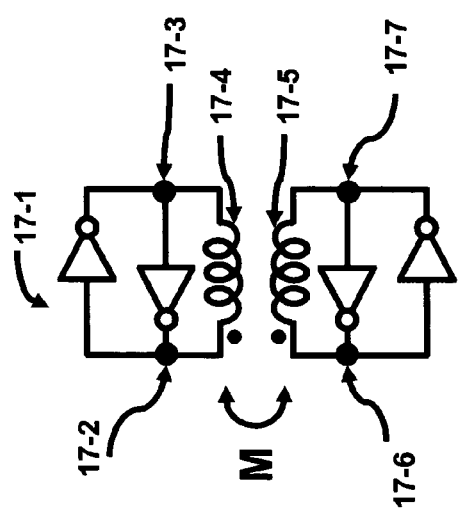

FIG. 17b illustrates a circuit representation of two instances of a regenerative circuit connected to an inductor where the inductors have flux linkage in accordance with the present invention.

FIG. 17c shows the simulation waveforms of two instances of a regenerative circuit connected to an inductor where the inductors have flux linkage in accordance with the present invention.

Figure 17E:
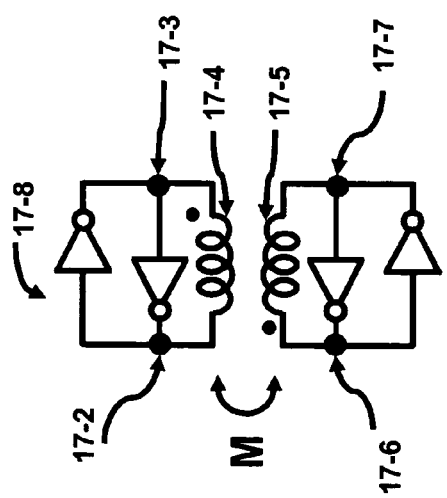
Figure 17D:
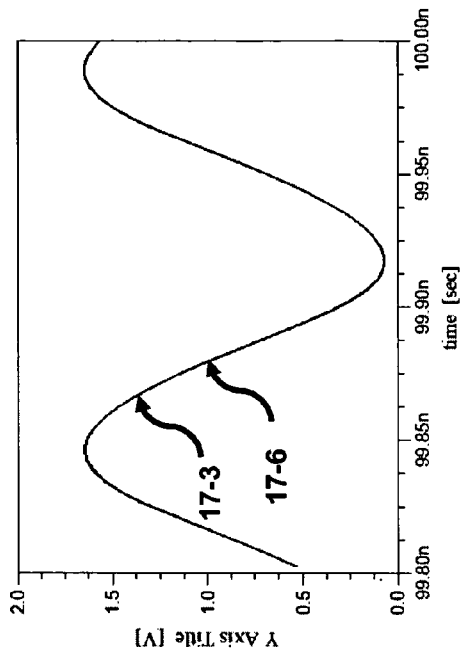

FIG. 17d illustrates a circuit representation of two instances of a regenerative circuit connected to a inductor where the inductors have a reversed flux linkage in accordance with the present invention.

FIG. 17e shows the simulation waveforms of two instances of a regenerative circuit connected to an inductor where the inductors have a reversed flux linkage in accordance with the present invention.

Figure 18:
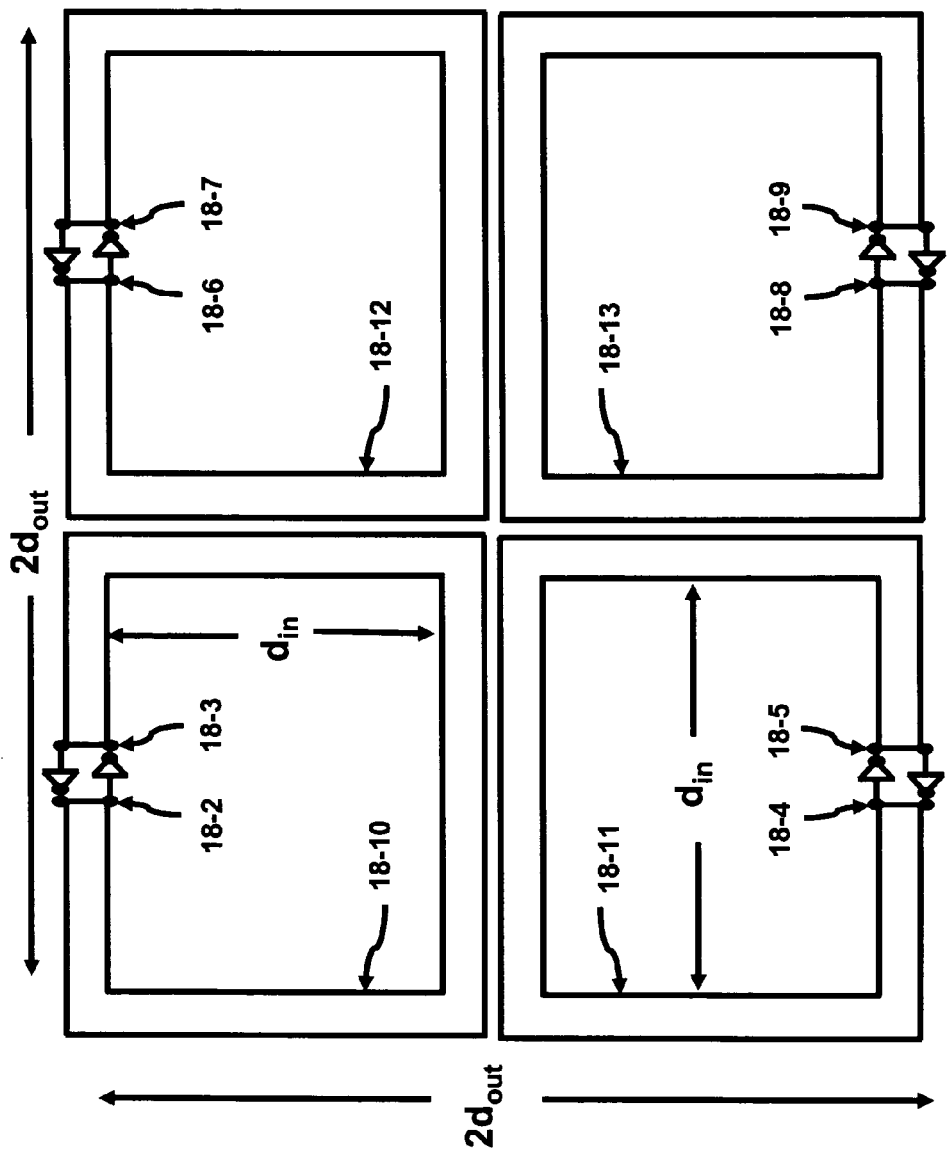

FIG. 18 illustrates four instances of a regenerative circuit connected to a physical inductor where the inductors have flux linkage in accordance with the present invention.

Figure 19B:
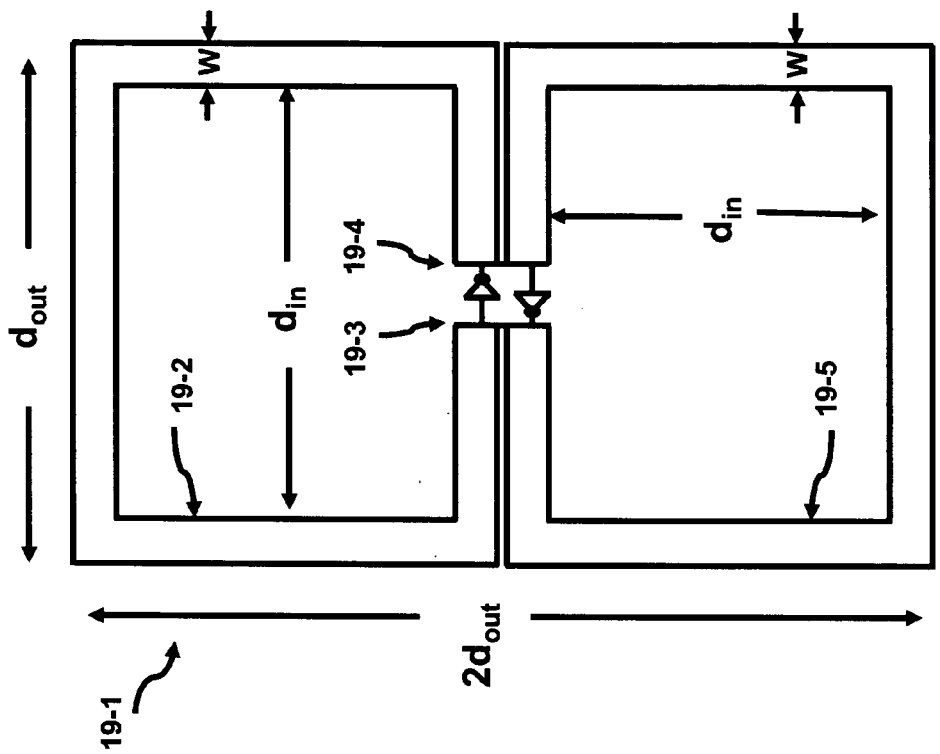
Figure 19A:
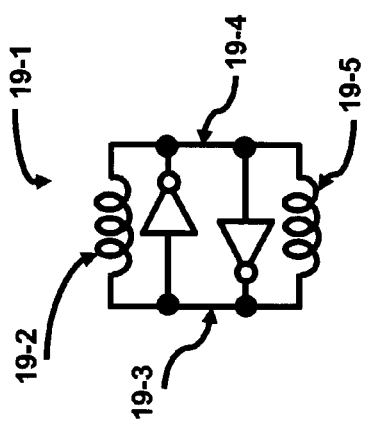

FIG. 19a depicts a circuit representation of one instance of a regenerative circuit connected to two inductors where the inductors may have flux linkage in accordance with the present invention.

FIG. 19b shows the physical layout of one instance of a regenerative circuit connected to two physical inductors where the inductors may have flux linkage in accordance with the present invention.

Figure 20A:
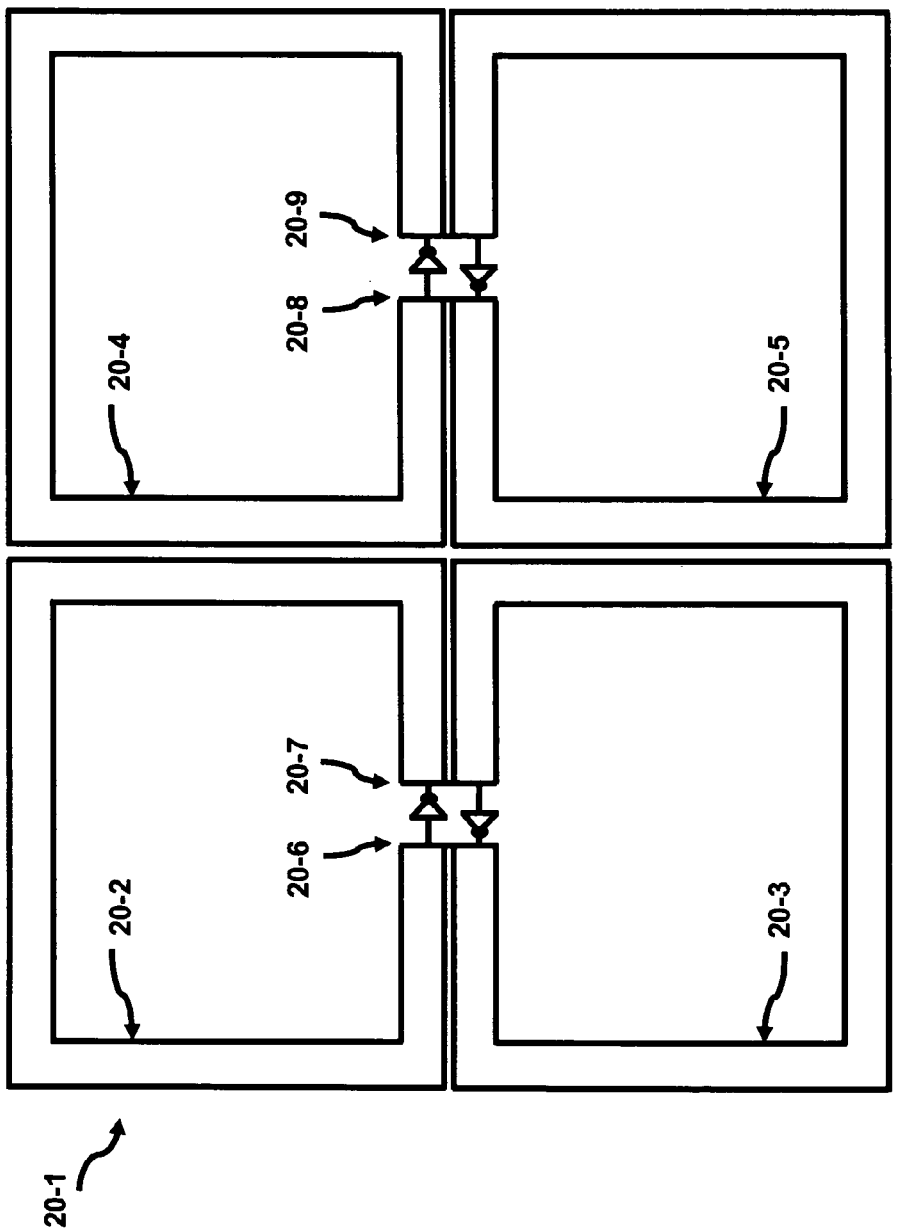

FIG. 20a depicts the physical layout of two instances of a regenerative circuit connected to two inductors where the inductors have flux linkage in accordance with the present invention.

Figure 20B:
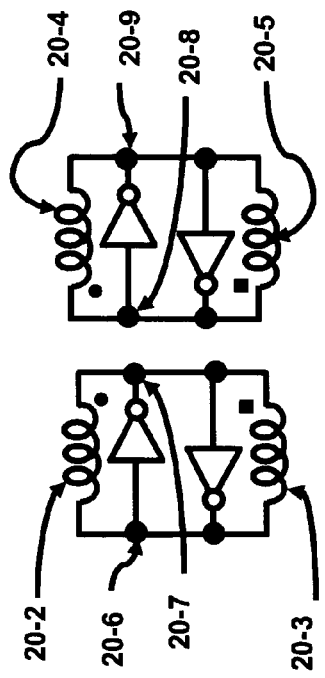

FIG. 20b shows the circuit representation of two instances of a regenerative circuit connected to two inductors where the inductors have flux linkage in accordance with the present invention.

Figure 21A:
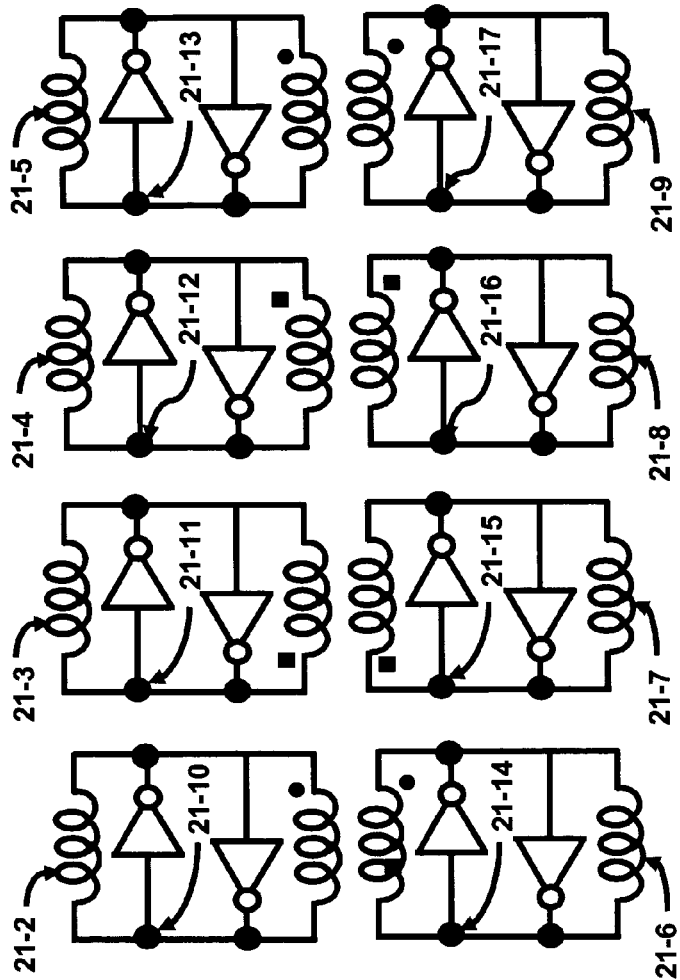
Figure 21B:
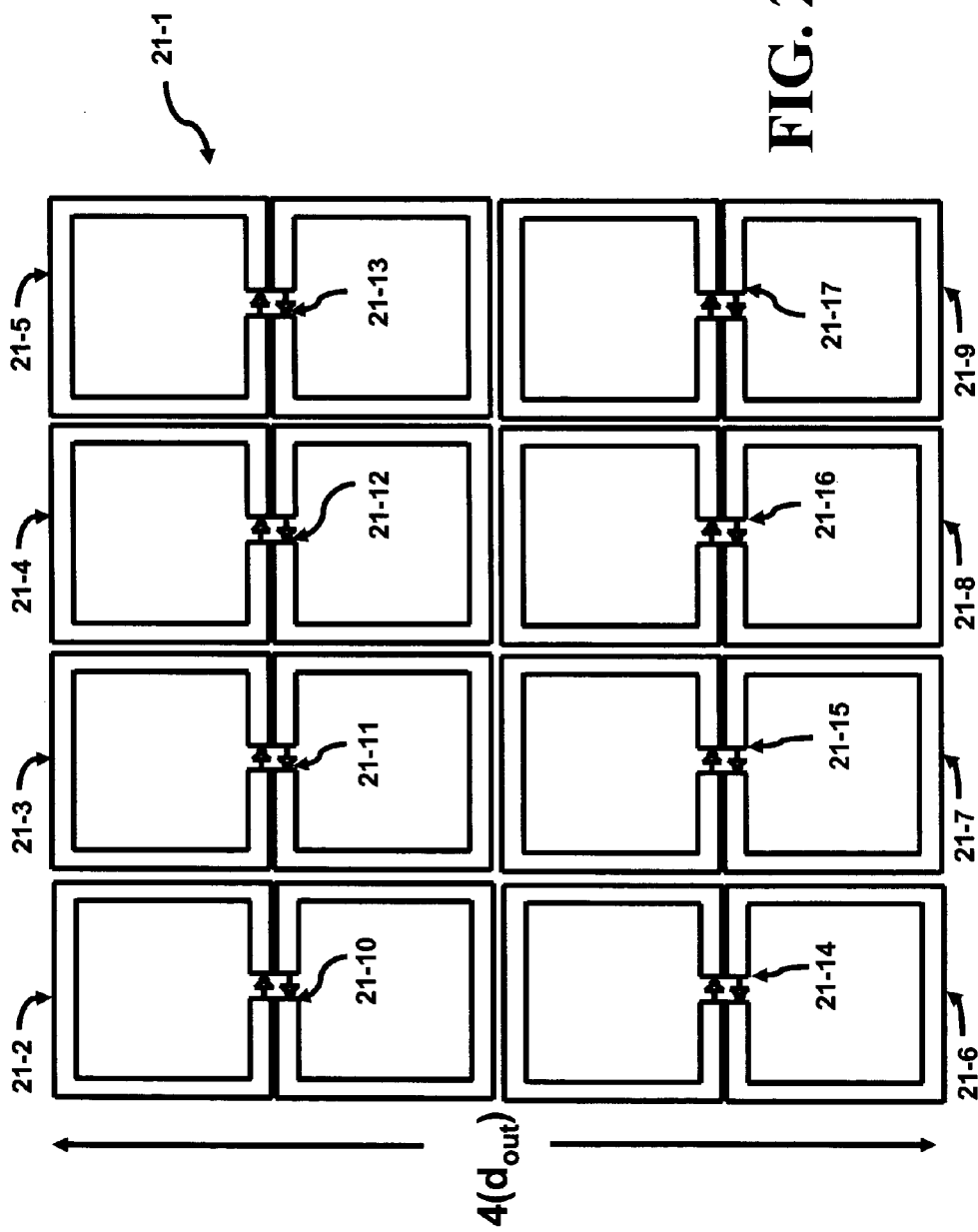

FIG. 21a presents the circuit representation of eight instances of a regenerative circuit connected to two inductors where the inductors have flux linkage in accordance with the present invention. FIG. 21b depicts the physical layout of eight instances of a regenerative circuit connected to two inductors where the inductors have flux linkage in accordance with the present invention.

Figure 21C:
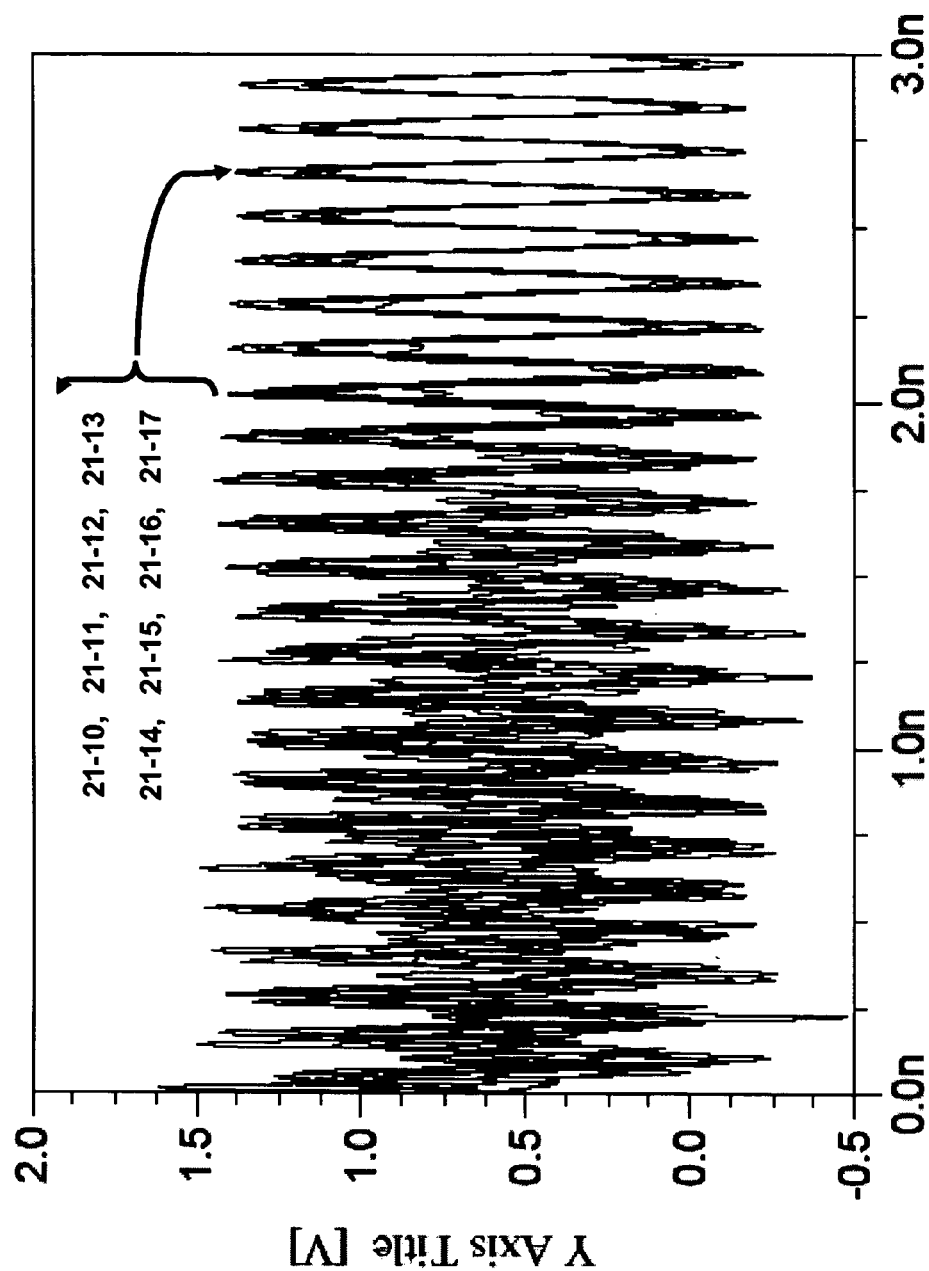

FIG. 21c illustrates the simulation waveforms for the physical layout of eight instances of a regenerative circuit connected to two inductors where the inductors have flux linkage in accordance with the present invention.

Figure 21D:
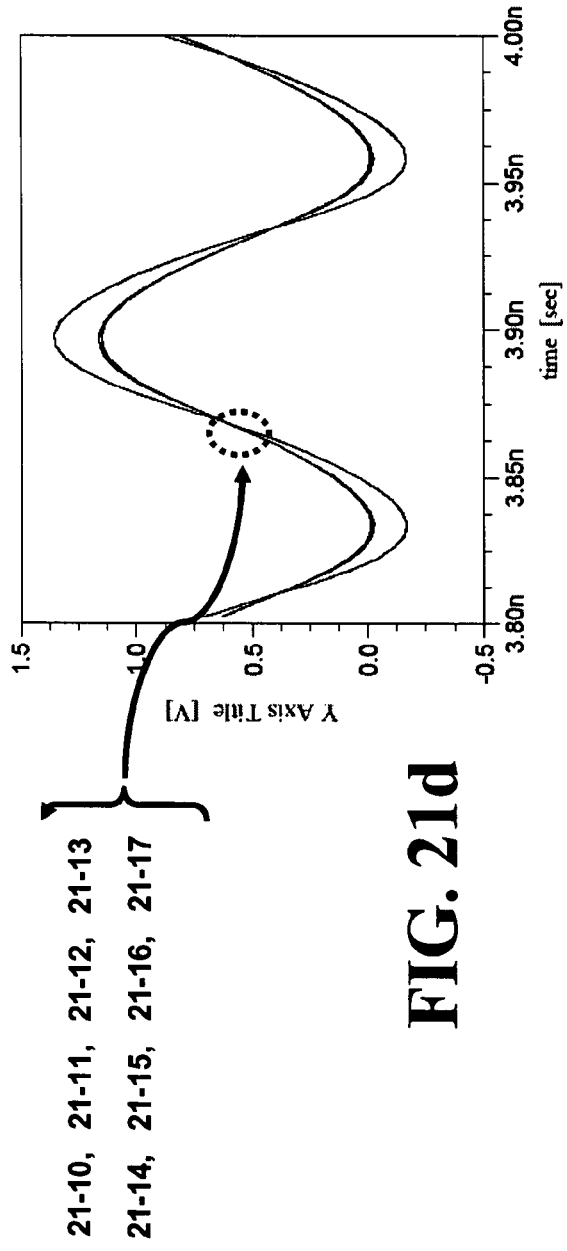

FIG. 21d illustrates a close-up region of the simulation waveforms for the physical layout of eight instances of a regenerative circuit connected to two inductors where the inductors have flux linkage in accordance with the present invention.

Figure 21E:
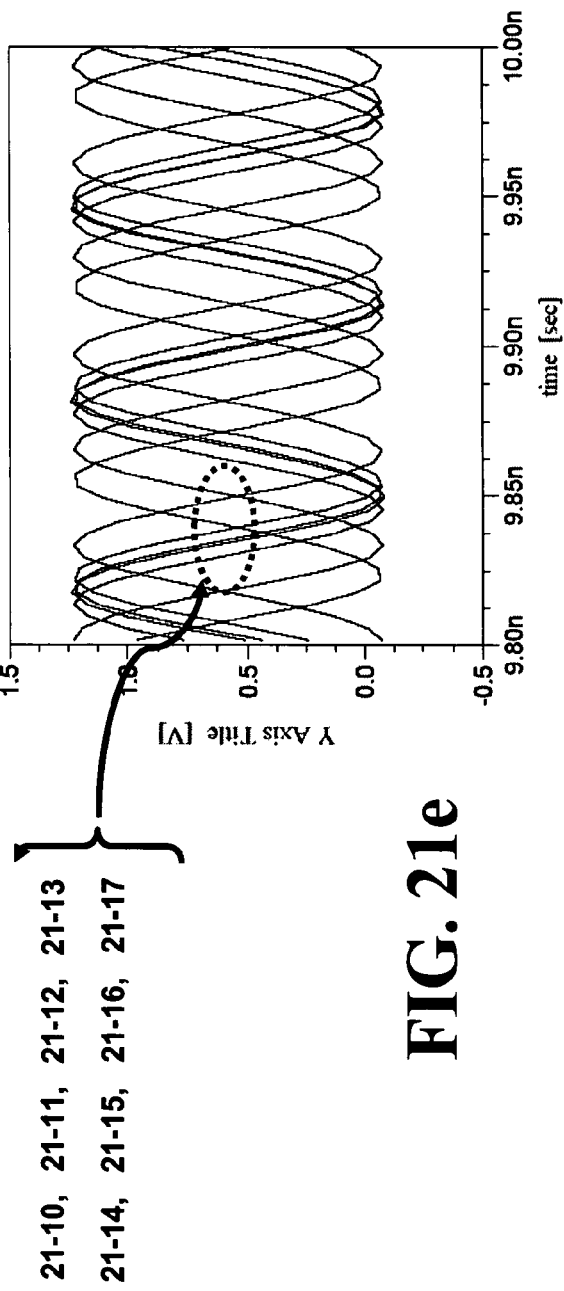

FIG. 21e shows a close-up region of the simulation waveforms for the physical layout of eight instances of a regenerative circuit connected to two inductors where the inductors have no flux linkage in accordance with the present invention.

FIG. 21f depicts the simulation conditions for the circuit in accordance with the present invention.

FIG. 21g presents the simulation results and predictive results for the circuit in accordance with the present invention.

Figures 22A, 22B:
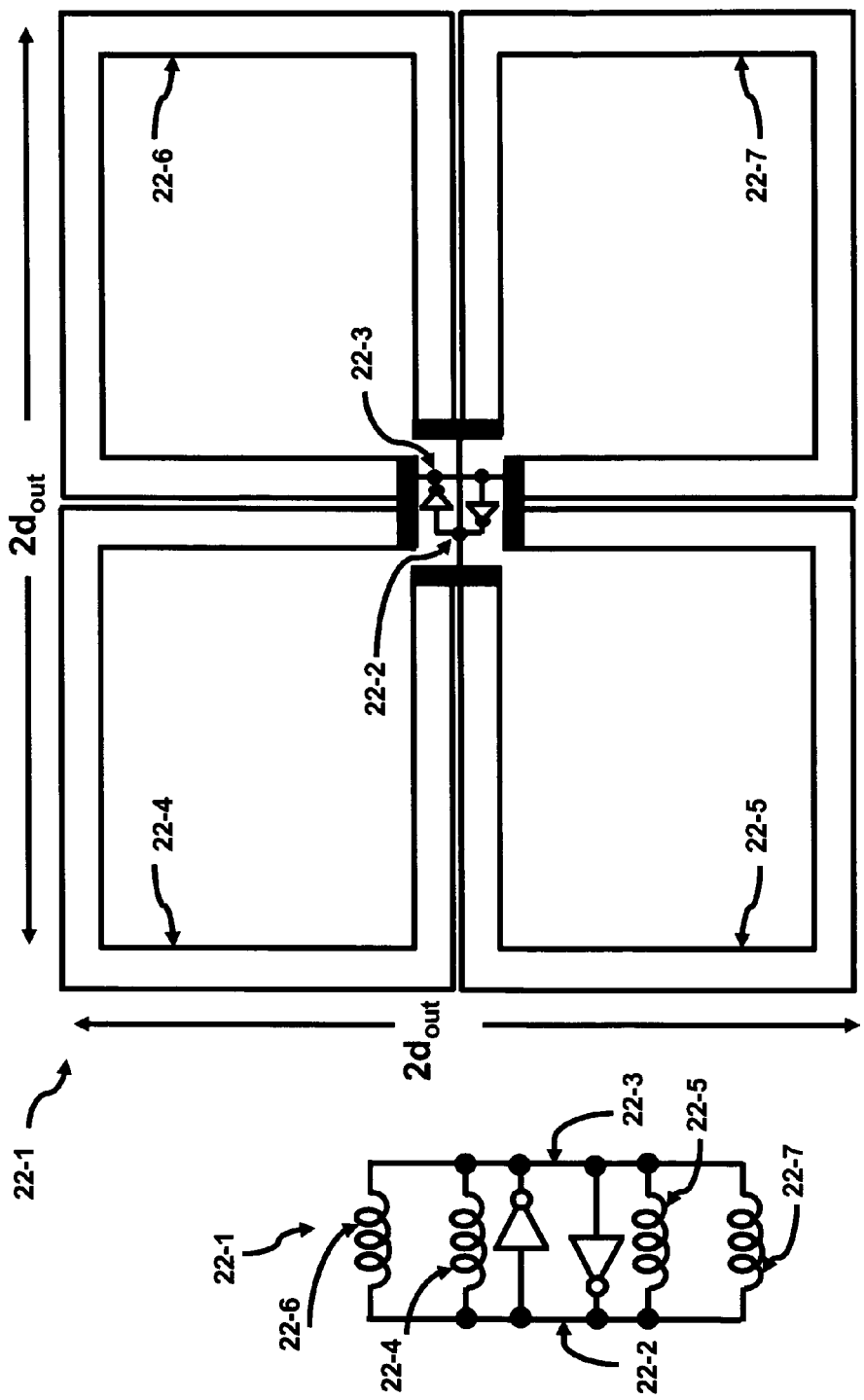

FIG. 22a illustrates a circuit representation of one instance of a regenerative circuit connected to four parallel inductors where the inductors may have flux linkage in accordance with the present invention.

FIG. 22b illustrates the physical layout of one instance of a regenerative circuit connected to four physical inductors where the inductors may have flux linkage in accordance with the present invention.

Figure 23A:
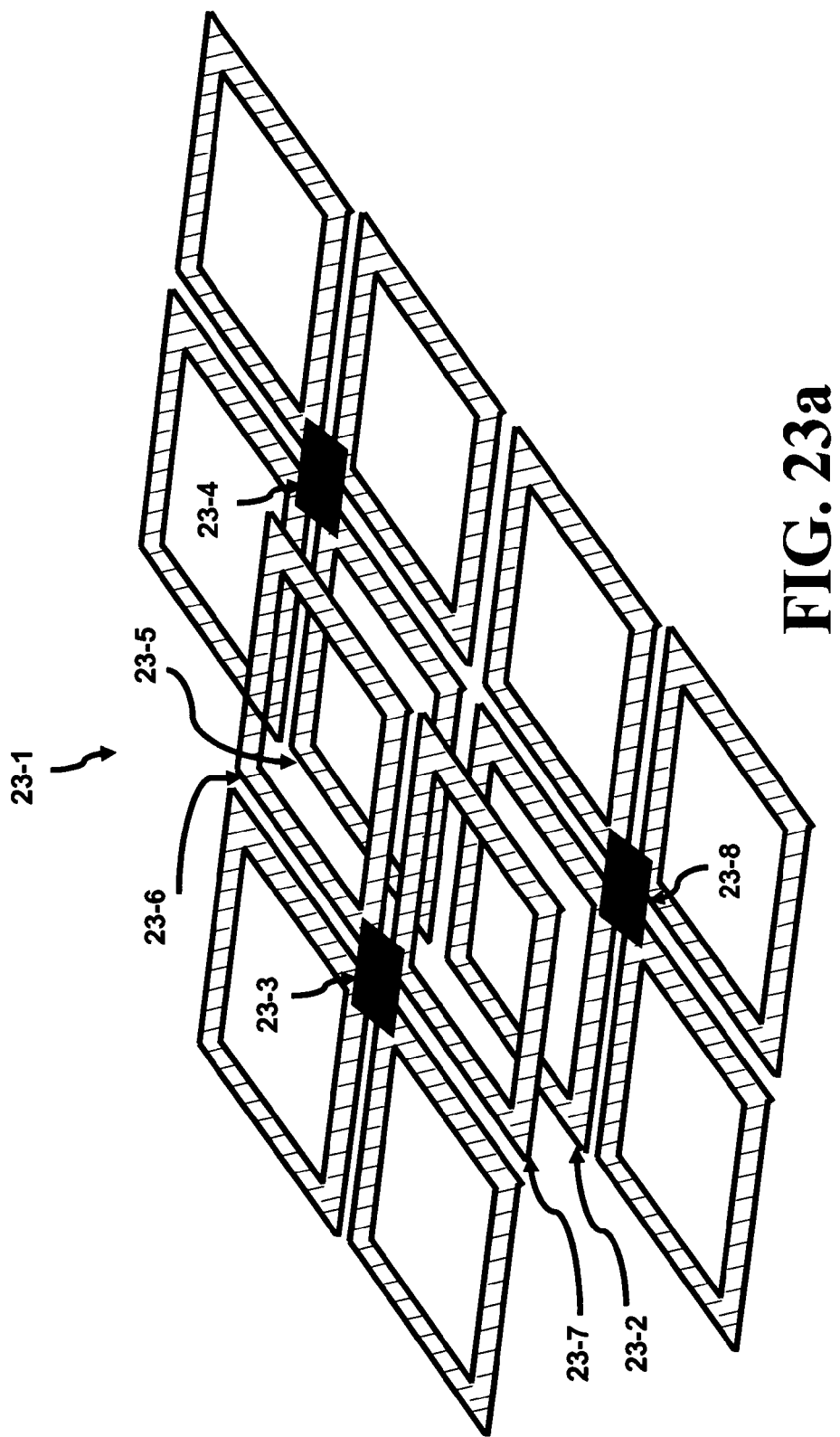

FIG. 23a depicts a two-dimensional view of three instances of a regenerative circuit connected to a four rectangular physical inductors where the inductors have flux linkage in accordance with the present invention.

Figure 23B:
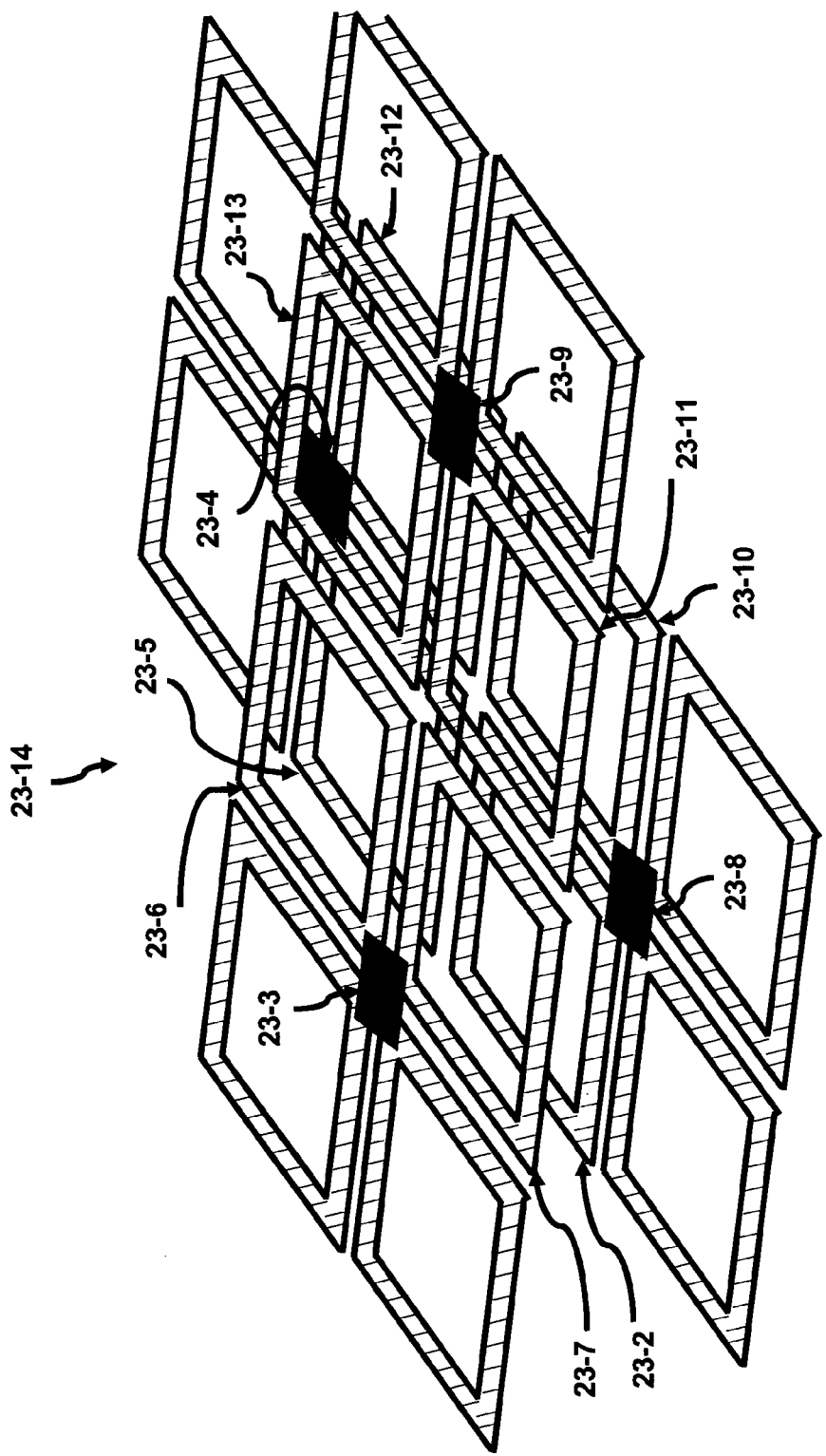

FIG. 23b shows a two-dimensional view of four instances of a regenerative circuit connected to a four rectangular physical inductors where the inductors have flux linkage in accordance with the present invention.

Figure 24:
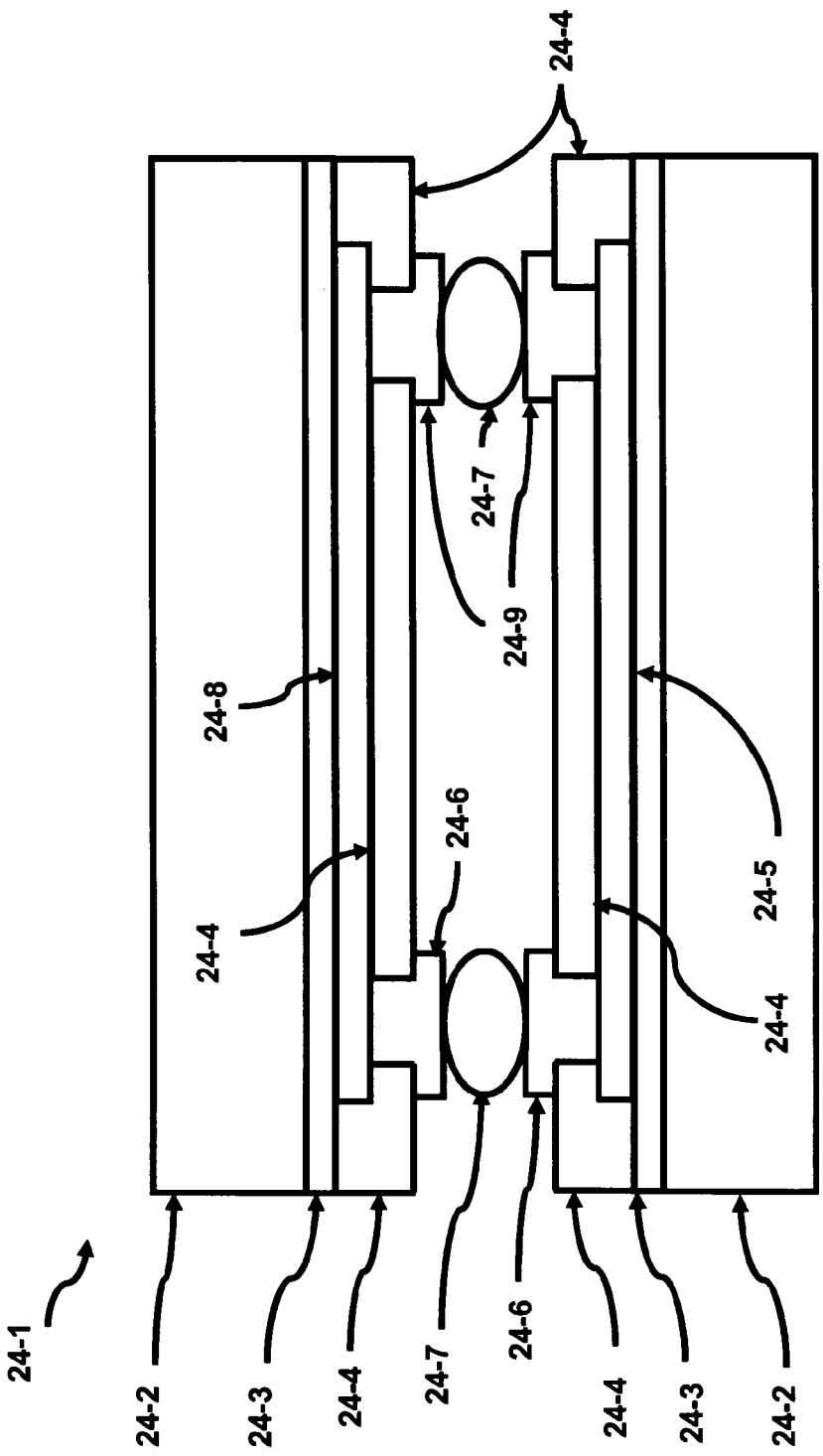

FIG. 24 presents the connection of two coils each on a separate die that are connected together using solder bumps in a MCM technology in accordance with the present invention.

FIG. 25a illustrates the block diagram of a balanced eight-phase clock generator in accordance with the present invention.

FIG. 25b presents the circuit schematic of the block generating the φ1 signal in accordance with the present invention.

FIG. 25c depicts the physical layout of the balanced eight-phase clock generator in accordance with the present invention.

FIG. 25d shows an inductor layout with extended legs in accordance with the present invention.

FIG. 25e illustrates a three dimensional perspective of two inductors placed over one another in accordance with the present invention.

FIG. 25f presents two physical layouts of the balanced eight-phase clock generator where one is rotated 180° in accordance with the present invention.

FIG. 25g illustrates the relative placement of two physical layouts of the balanced eight-phase clock generator in accordance with the present invention.

Figure 26A:
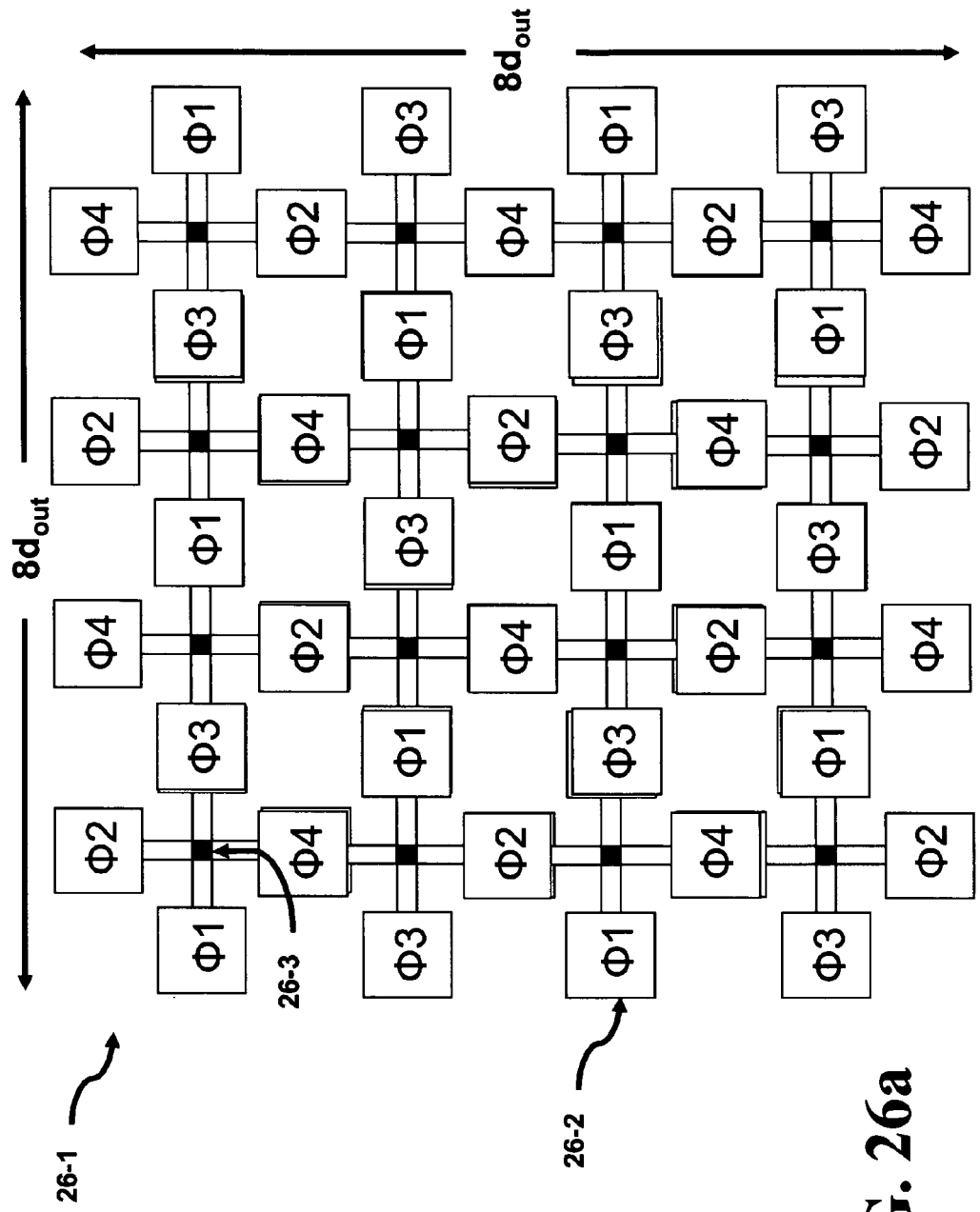

FIG. 26a depicts the physical layout of sixteen instances of the balanced eight-phase clock generator where the inductors have flux linkage in accordance with the present invention.

Figure 26B:
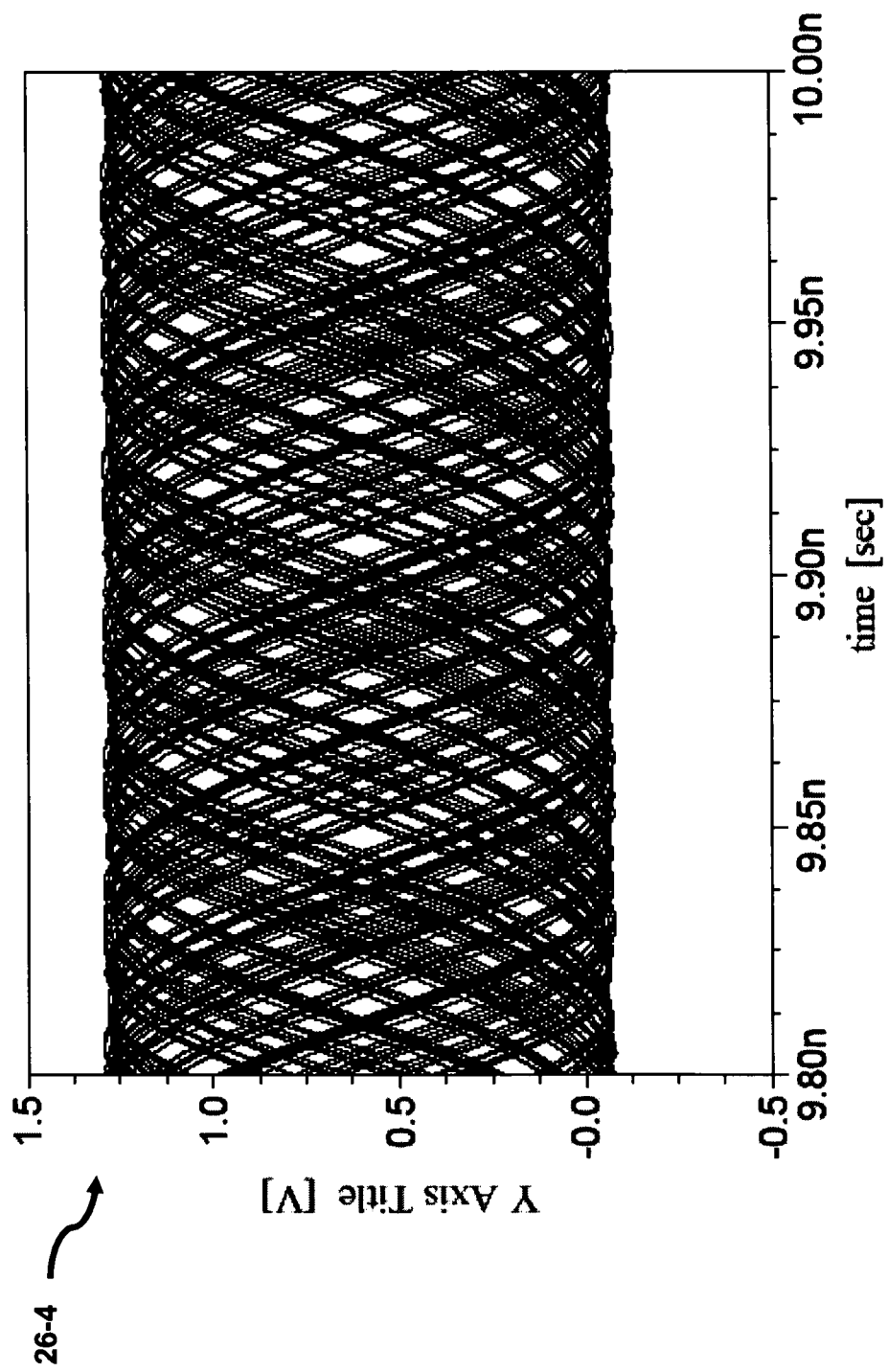

FIG. 26b shows all 64-clock output waveforms of the physical layout given in FIG. 26a during the time period around 10 nsec.

Figure 26C:
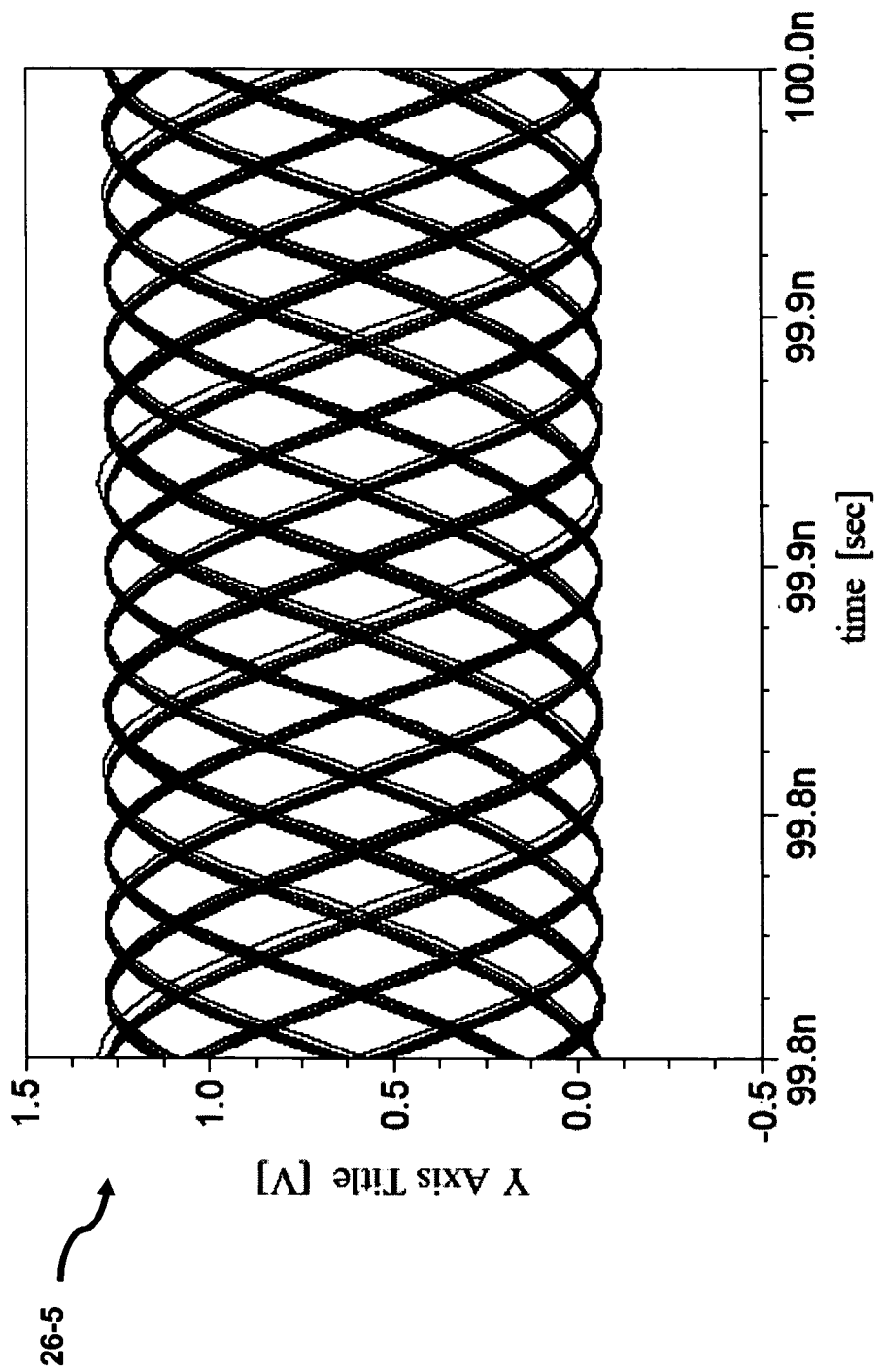

FIG. 26c shows all 64-clock output waveforms of the physical layout given in FIG. 26a during the time period around 100 nsec illustrating the flux linkage synchronizing all outputs in accordance with the present invention.

Figures 26D, 26E:
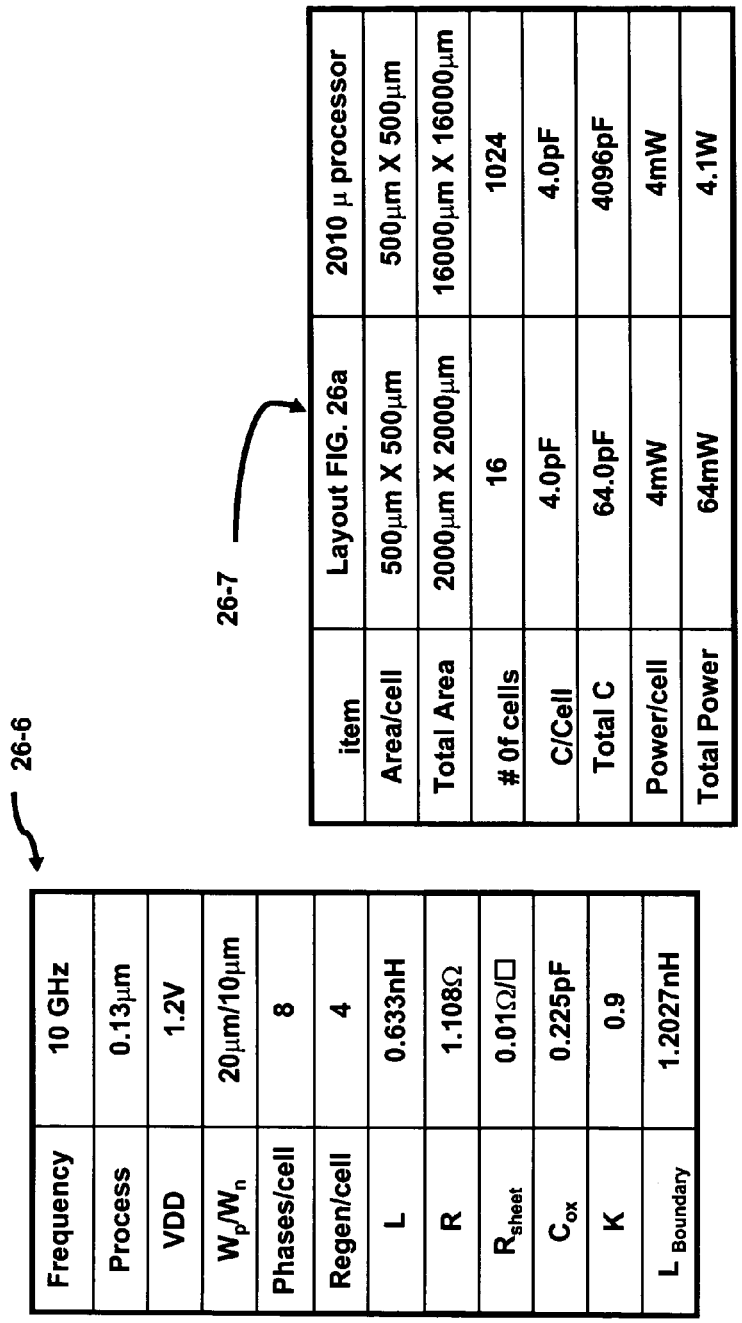

FIG. 26d depicts the simulation conditions for the circuit in accordance with the present invention.

FIG. 26e presents the simulation results and predictive results for the circuit in accordance with the present invention.

Figure 27:
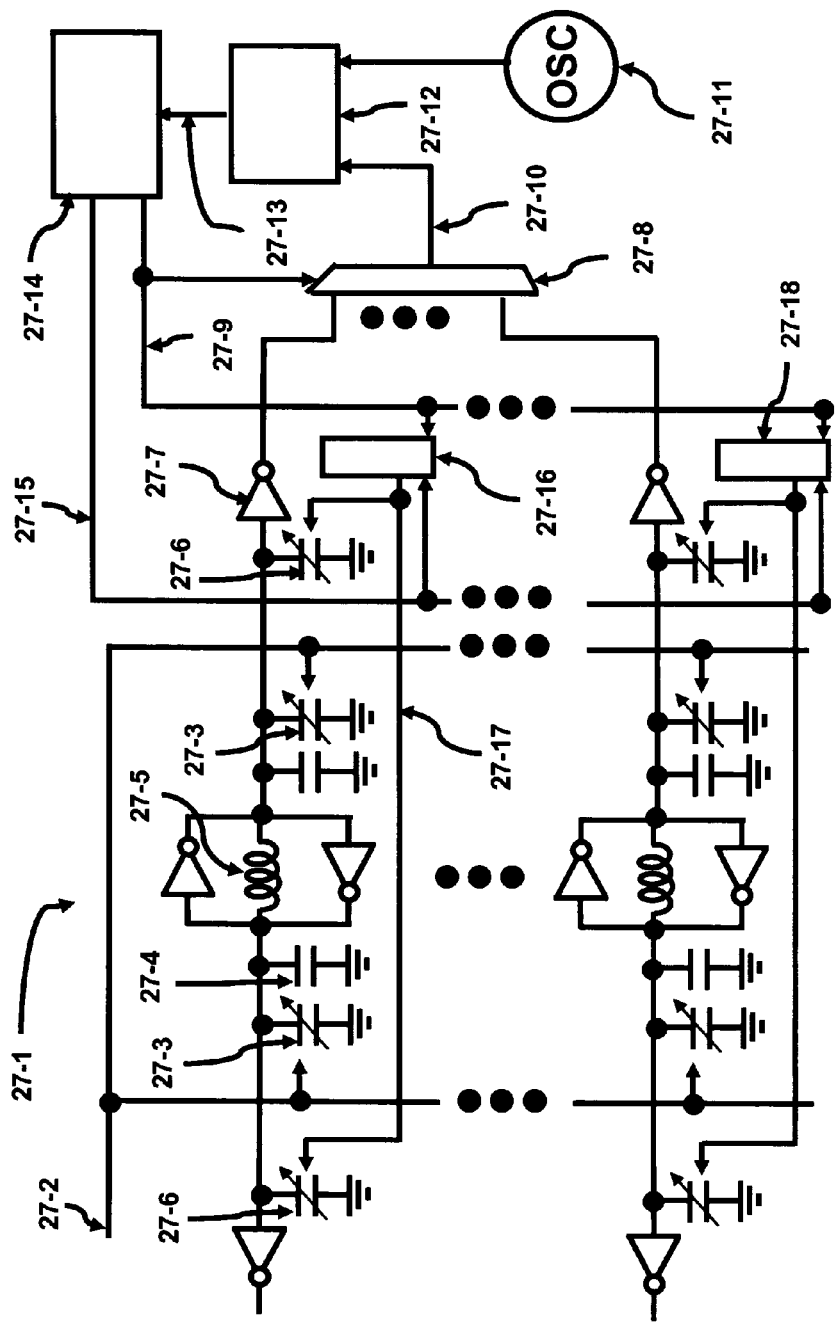

FIG. 27 illustrates the control circuitry to adjust the coarse and fine capacitance in several LC tank circuits in accordance with the present invention.

Figures 28A, 28B:
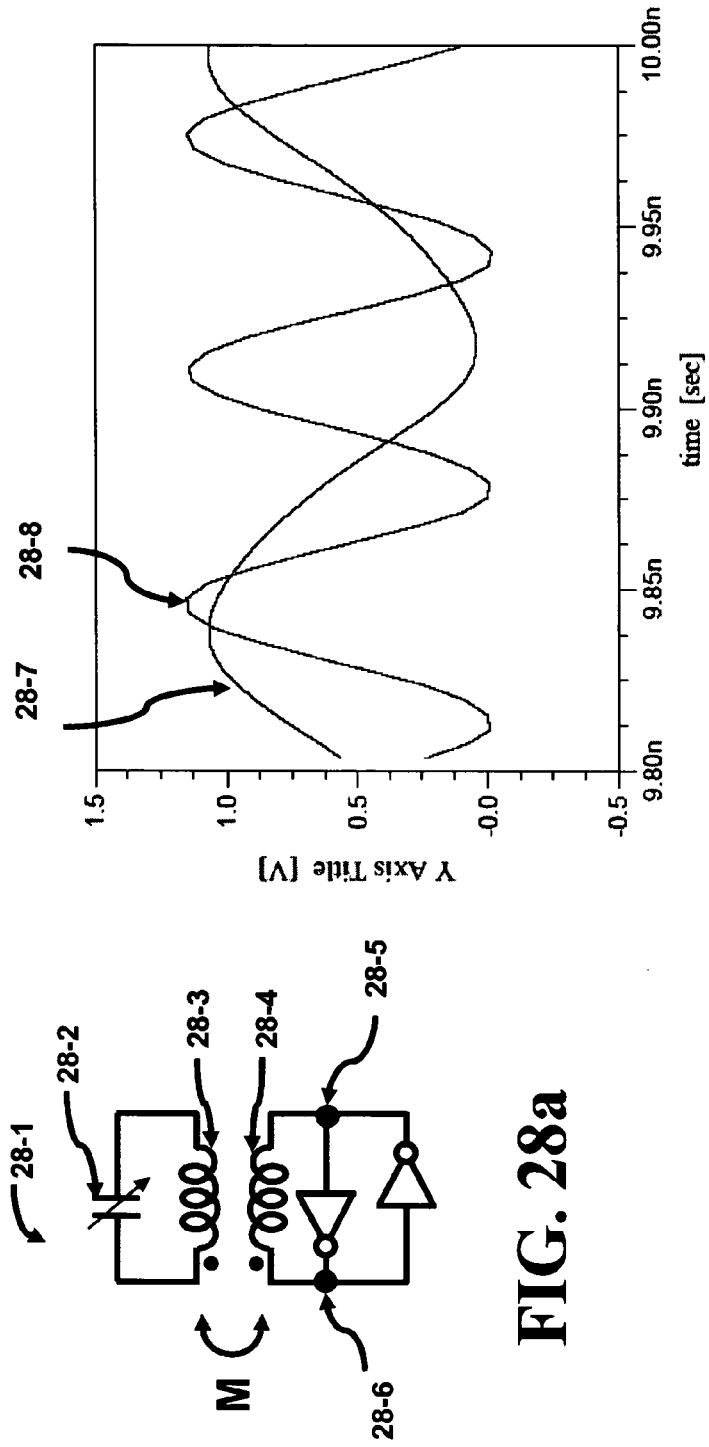

FIG. 28a depicts the schematic of a passive flux linkage frequency adjust circuit in accordance with the present invention.

FIG. 28b shows the simulation waveforms of a passive flux linkage frequency adjust circuit in accordance with the present invention.

FIG. 28c illustrates the use of a varactor to adjust the frequency of an LC tank circuit.

FIG. 28d illustrates the use of a switched array of capacitors to adjust the frequency of an LC tank circuit.

FIG. 28e illustrates the use of a enhancement mode transistor to adjust the frequency of an LC tank circuit.

FIG. 28f illustrates the use of a depletion mode transistor to adjust the frequency of an LC tank circuit.

Figure 29:
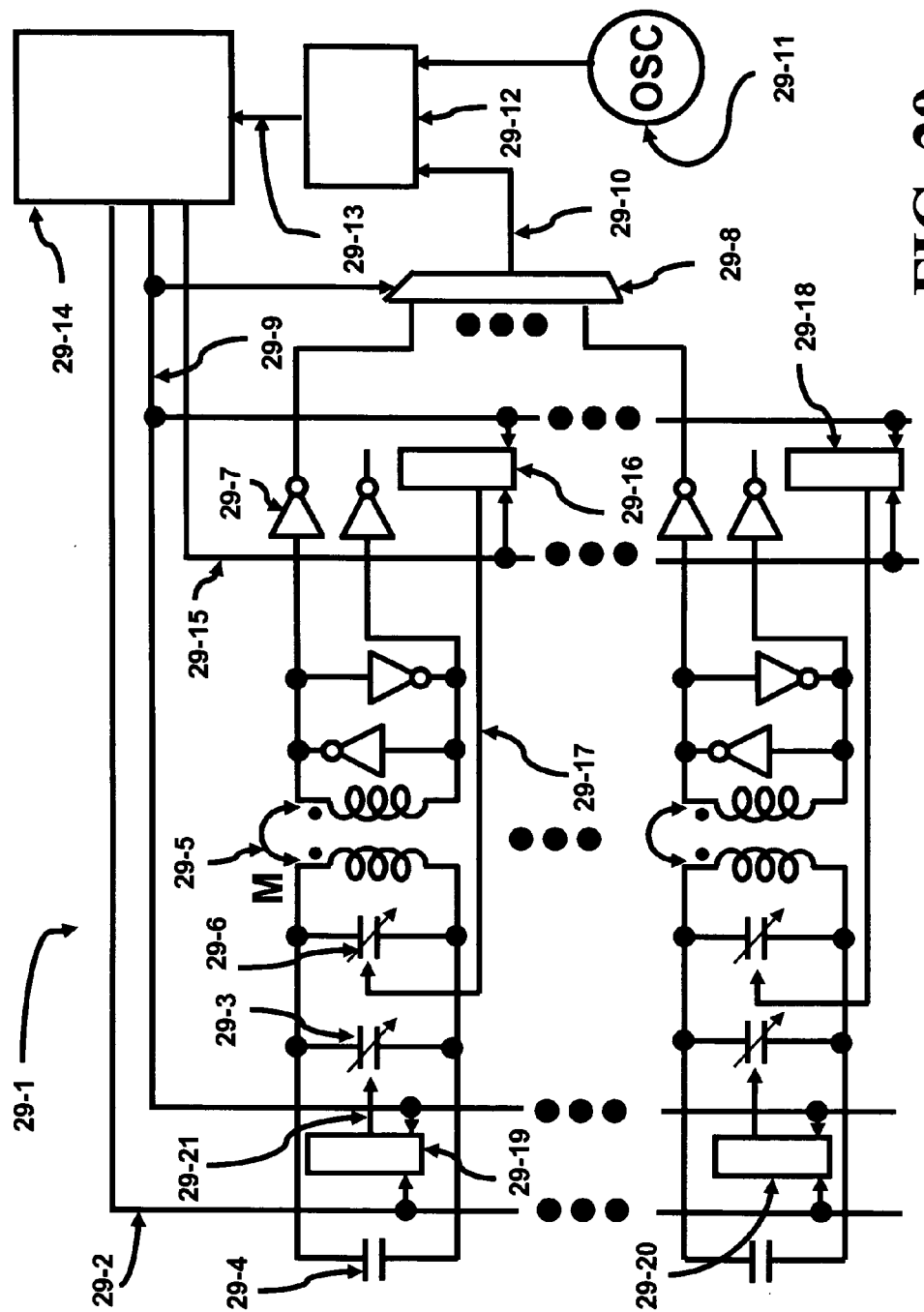

FIG. 29 illustrates a second control circuitry to adjust the coarse and fine capacitance in several LC tank circuits in accordance with the present invention.

Figure 30B:
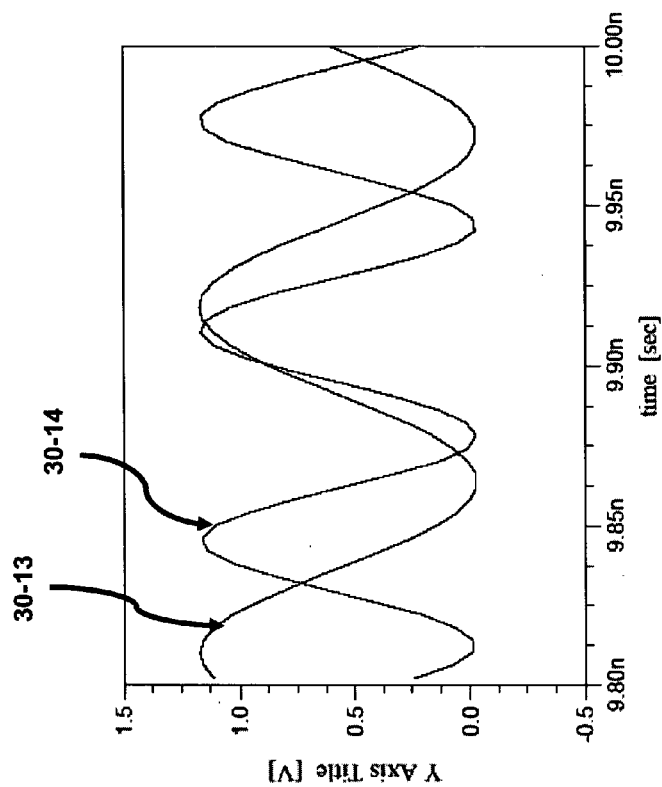
Figure 30A:
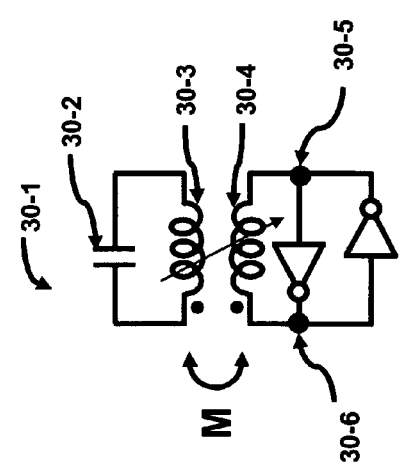

FIG. 30a depicts the schematic of a mechanical flux linkage frequency adjust circuit in accordance with the present invention.

FIG. 30b shows the simulation waveforms of a mechanical flux linkage frequency adjust circuit in accordance with the present invention.

Figure 30C:
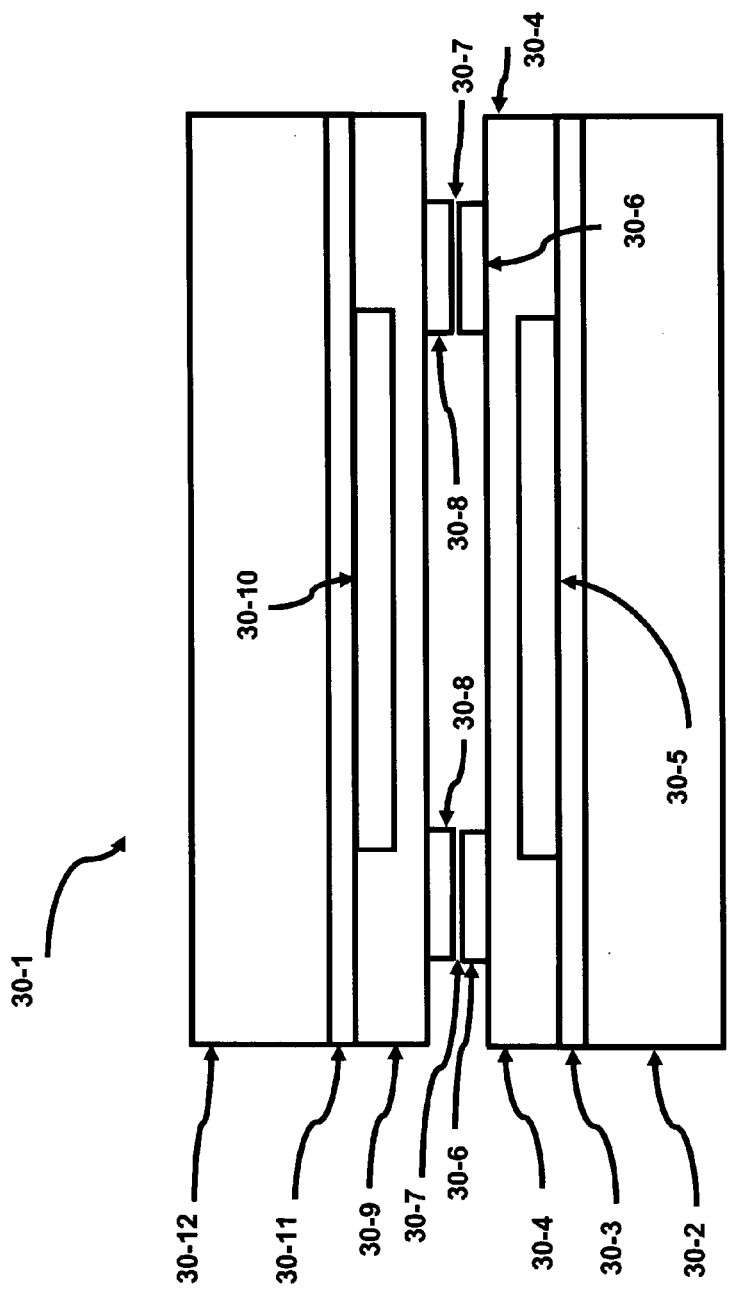

FIG. 30c illustrates the MEMS cross-sectional view of a mechanical flux linkage frequency adjust circuit in accordance with the present invention.

FIG. 31a depicts a top view of two instances of a physical layout of a single regenerative circuit that is parallel connected to four physical coils in accordance with the present invention.

FIG. 31b reveals a cross-sectional view of two instances of a physical layout of a single regenerative circuit that is parallel connected to four physical coils being synchronized by an external flux linkage-generating unit in accordance with the present invention.

DETAILED DESCRIPTION OF THE INVENTION

The LC (inductor-capacitor) tank circuit has been a fundamental building block in many electrical system designs. This circuit is used in wireless, digital, and mixed-signal designs. The basic building elements of the LC tank circuit consist of at least one inductor and at least one capacitor.

The invention is based on the discovery that the flux linkage between inductors can be used to synchronize an interwoven network formed from individual LC tank circuits. The flux linkage that occurs between two inductors forms the basis of a structural unit known as a transformer. The coupling coefficient of the transformer can be utilized to lock an interwoven network of tank circuits so they operate in-phase. The ability to phase and frequency lock the interwoven network of tank circuits over the face of the die allows the generation of a unified clock waveform. The additional benefit is that the adiabatic nature of entire interwoven network reduces the power distribution of the clock network for a VLSI chip by over two orders of magnitude.

In addition, several techniques are offered to control the frequency of operation of the interwoven network. In one case, a coarse and fine adjust capacitance is introduced into the tank circuit to directly alter the frequency. Anther method uses a passive load in a transformer configuration to adjust the frequency of operation of the primary LC tank circuit. And finally, the physical placement of a coil is adjusted within a transformer to alter the coupling coefficient to directly adjust the frequency of operation.

Several basic examples of an LC tank circuit having a regenerative circuit that provides a negative resistance to compensate for the resistive loss of the inductance is provided. Three different regenerative circuits are described, where the third version allows the introduction of external signals to effect the operation of the circuit.

Several assumptions are initially made to simplify the analysis of the inventive entity. This helps identify the key aspects of the invention without losing insight. The first one will be to assume that the self-inductances of the coils in the transformer are equal. The next assumption will assume that the capacitive load elements in a balanced tank circuit are equal. To be more specific, if a tank circuit generates a clock and a clock bar signal, the capacitive load attached to both of these nodes are identical.

It is important to understand that setting these assumptions does not limit the range or scope of the inventive idea. Before a LC tank circuit is utilized in an actual operating system, each of the above assumptions will need to be re-evaluated according to the specifications of the design parameters. Those skilled in the art will recognize that the above assumptions do not limit the scope of the invention.

Figures 1D, 1E:
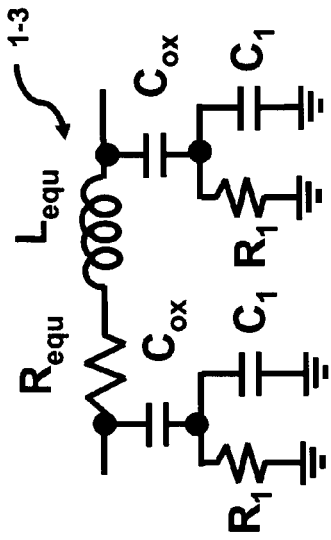
FIG. 1d depicts an equivalent circuit for the planar inductor shown in FIG. 1a-b.
FIG. 1e provides the calculated parameters of several inductors with a width of 20 μm.

FIG. 1a illustrates a square inductor 1-1 with one turn. Note that this inductor has two leads, 1-4 and 1-5, or ways of physically connecting the inductor to a circuit. The width of the metallic trace is shown as W. A two-turn inductor 1-2 is depicted in FIG. 1b. The measurements of the outside diameter is shown as $d_{out}$, while the inside diameter is listed as $d_{in}$. In addition, the distance between traces is identified as S. These type of inductors can occur in an IC (Integrated Circuit), a VLSI chip, an RF (Radio Frequency) chip, a PWB (Printed Wire Board), a MEMS (Micro-Electro-Mechanical-System) die or a MCM (Multi-Chip Module). The equivalent circuit representation 1-3 of the coils 1-1 and 1-2 are provided in FIG. 1d. A simplified version of this equivalent circuit of an inductor will be utilized in many of the circuits analyzed in this paper to help describe the essential idea of this invention.

FIG. 1c depicts a helix structure used to form an inductor 1-3. This inductor has two leads 1-6 and 1-7. A single turn coil 1-12 is formed in a lower metal layer, then a via 1-8 is connect this coil to the single turn coil 1-11 in an upper metal layer. The via 1-9 connects the middle coil to the top coil 1-10 formed in an upper metal layer The inductors 1-1, 1-2 and 1-3 are typical for the type of inductors found in a planar technology layout. These inductors are also called coils where coil can indicate that the conductor forming the inductor has a configuration that spans a portion of 360 degrees.

In all of these planar inductors presented, several aspects were not shown. The substrate of the integrated circuit upon which these planar inductors are fabricated is not shown. In addition, the oxide or dielectric layer surrounding the metal layers is not illustrated. These simplified drawings provide an easier description of the structure of the inductor. The integrated circuit can typically have a plurality of metallization and dielectric layers. In addition, only a square inductor has been shown, however, those skilled in the art will realize that the inductor can be formed in a circular, oval, hexagonal or other shape, and still be within the scope of the invention.

Finally, the tables listed in FIG. 1e and FIG. 1f displays the parameters of several inductors that were determined using the "Mohan" reference. The first column lists the values of the self-inductances $L_{equ}$. The second column indicates N which indicates the number of turns of the coil. The next column gives $d_{out}$ that is the outside dimension of the coil. The remaining dimensions of $d_{in}$ and W are also indicated. Note that one difference between FIG. 1e and FIG. 1f is that the width of the conductive trace used to form the coil is 20 μm and 10 μm, respectively. The number of squares forming the conductive trace of each inductor is indicated in the sixth column. The next column provides the parasitic resistor assuming that the sheet resistance of 0.01Ω/□ is used. Finally, the last column gives the parasitic capacitance $C_{OX}$ of the inductors (see FIG. 1d). Note that this capacitance value is one half of the total parasitic value of the inductor. These inductors provide an indication of the real estate used for several one-turn inductors. In addition, several of these inductors will be simulated in different tank circuits to help describe the invention.

The number of squares can be used with the sheet resistance value to determine an approximate resistance. The skin effect typically increases the resistance of the inductors proportional to the square root of frequency; however, the skin resistance effect will not be addressed in this discussion so that the concepts of the invention can be more easily visualized. For instance, the skin-depth in copper is about 0.66 μm at 10 GHz. Because of this effect, the current is carried near the surface causing the resistance to increase as mentioned earlier.

Figure 2B:
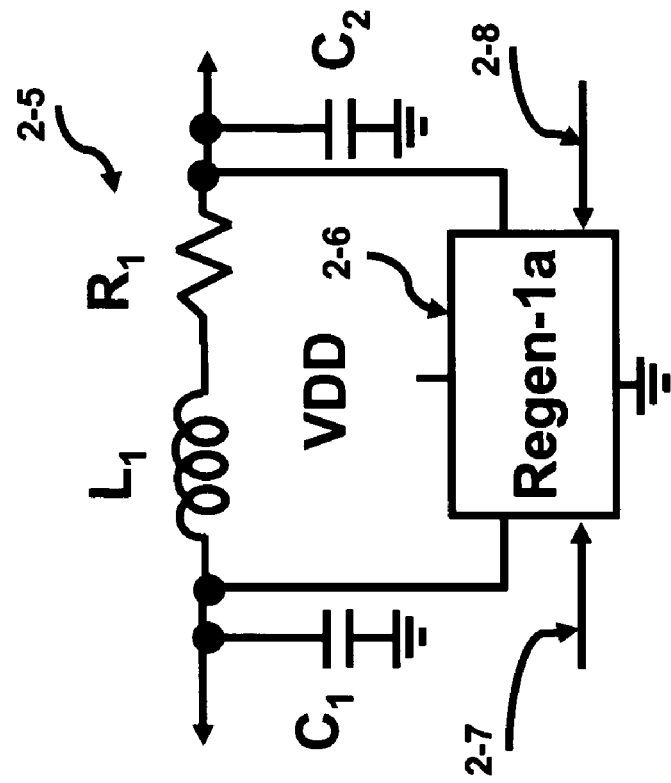
FIG. 2b shows a inductor-capacitor oscillator and connected to a regenerative circuit in accordance with the present invention.
Figure 2A:
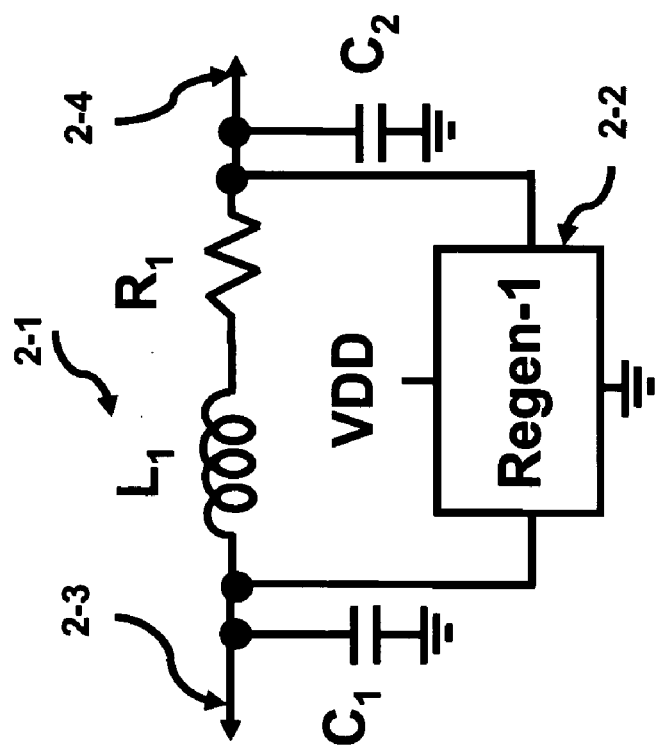
FIG. 2a shows an inductor-capacitor circuit configured as a Colpitts oscillator and connected to a regenerative circuit.

An example of a Colpitts tank circuit oscillator 2-1 having a regenerative circuit 2-2 is given in FIG. 2a. A regenerative circuit 2-2 is required to replace the energy lost by the dissipative process of energy flow through the resistive components within the tank circuit. If the regenerative circuit 2-2 was eliminated, the oscillations generated by the tank circuit 2-1 would eventually die out because of this resistive loss. The regenerative circuit can be formed out of active transistors; such as MOS transistors, CMOS transistors or BJT transistors. The regenerative circuit provides a negative resistance that cancels the parasitic resistance in the tank circuit. The regenerative circuit used is a type regen-1 and, in addition, has a power and ground connection. The oscillator signal is generated across the two capacitors $C_1$ and $C_2$. Thus, this circuit has two outputs 2-3 and 2-4 that originate from the tank circuit. The signals that are developed across these two capacitors are 180 degrees out of phase with each other.

FIG. 2b illustrates a second version of the Colpitts oscillator 2-5 where the regenerative circuit 2-6 of type regen-1a has two additional inputs 2-7 and 2-8. These inputs can be used to introduce other clock signals into the oscillator to control its phase generation.

A Hartley oscillator 3-1 is shown in FIG. 3. In total, this circuit requires at least two inductors. This regenerative circuit 3-2 is type regen-2 and has a ground in this case, but as will be seen shortly may only contain a power connection. The regen-2 has two outputs 3-3 and 3-4 that connect to the tank circuit.

FIG. 4 illustrates several CMOS circuits configured in either regen-1, regen-1a or regen-2 type regenerative circuits. Similar circuits can be designed using BJT transistors as well. In FIG. 4a, a regen-1 type circuit 4-1 is shown; here a p-channel 4-2 serves as a current source to the rest of the circuit. The two p-channel transistor 4-3 and 4-4 are cross coupled to each other; that is, the drain of 4-3 is connected to the gate of 4-4 and the drain of 4-4 is connected to the gate of 4-4. This forms a regenerative circuit, note that the two transistors have the same conductivity type. The two n-channel transistors 4-5 and 4-6 are configured in a similar manner. The drain of 4-6 is connected to the gate of 4-5 and the drain of 4-5 is connected to the gate of 4-6. This forms a second regenerative circuit. The tank circuitry is connected to the drains of the two cross coupled transistor circuits. In addition, the tank circuitry and the cross coupled transistors share the ground and power nodes. The output signal is provided at the two output nodes 4-7 and 4-8. The negative resistance of the circuit compensates for the resistive loss in the tank circuit and allows the oscillation created in the tank circuit to be maintained.

A regen-1 type circuit 4-9 similar to the circuit 4-2 is given in FIG. 4b except that the p-channel current source has been removed. The circuit 4-9 provides the outputs 4-7 and 4-8.

An equivalent representation of the circuit 4-9 is provided in FIG. 4c. This regenerative circuit 4-10 consists of two inverters connected head to tail as shown. This is also the basic building block of a ram-cell that is used to store memory in integrated circuits (IC). The outputs of this circuit 4-10 are indicated as 4-7 and 4-8. This ram-cell has three states; outputs 4-7 and equal, output 4-7 is a logic "1" while output 4-8 is a logic "0", and the case where output 4-7 logic "0" while output 4-8 is a logic "1". The first state given is also know as the meta-stable state, where both outputs are equal. A slight bit of noise introduced into the circuit 4-10 under the meta-stable state condition will cause the circuit 4-10 to enter one of the remaining two states.

Figure 4F:
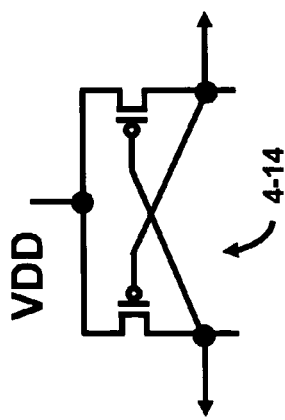

The next three circuits are of type regen-2. In FIG. 4d, only two cross-coupled n-channel transistors form the circuit 4-11 that is used to compensate for the resistive loss of the LC tank circuit. The outputs for this circuit are 4-13 and 4-14. These are the two nodes connected to the LC tank circuit and any external load that is desired to be driven.

Figure 4E:
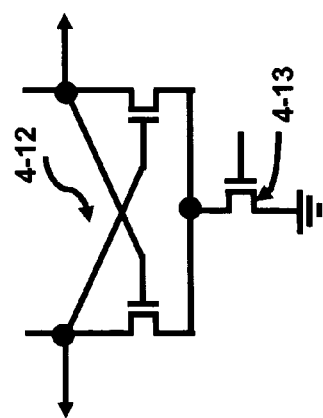
Figure 4D:
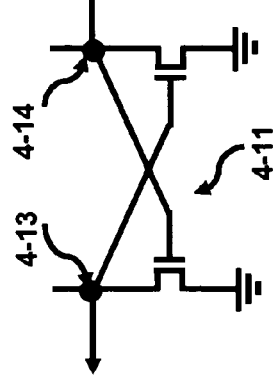

The circuit shown in 4-12 of FIG. 4e includes an n-channel current source 4-13. Otherwise it is similar to the circuit of 4-11.

The circuit 4-14 illustrated in FIG. 4f is the compliment of 4-11, that is all the n-channels are replaced by p-channels and the VSS power supplies (ground) replaced by VDD supplies and vice-versa.

The last two circuits are type regen-1a circuits. FIG. 4g shows a regenerative circuit 4-15 where a p-channel 4-16 serves as a current source to the rest of the circuit. The two p-channel transistors 4-17 and 4-18 allow external signals to be introduced into the regenerative circuit. A regenerative circuit consists of the two cross-coupled n-channels 4-21 and 4-22. The negative resistance of this circuit is provided to the LC tank circuit using the two outputs 4-19 and 4-20. The negative resistance of the circuit compensates for the resistive loss in the tank circuit and allows the oscillation created in the tank circuit to continue.

Figure 4H:
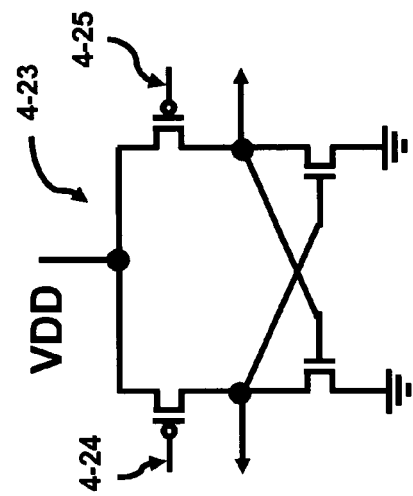
FIG. 4g-h depicts regenerative circuits in accordance with the present invention.
Figure 4G:
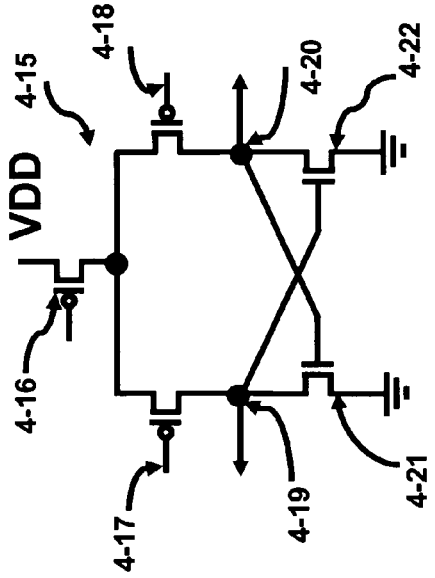

FIG. 4h illustrates the second version 4-23 of the regen-1a circuit. This circuit is similar to the circuit in FIG. 4g, except that the p-channel current source has been eliminated.

FIG. 5a depicts an LC tank circuit 5-1. It contains a regenerative circuit generating two outputs 5-4 and 5-5 that drive two sets of balanced capacitive loads. A capacitor 5-2 combines all of the capacitance that is typically non-adjustable.

This may include the parasitic capacitance of wire interconnections, the capacitance of the gate, drain, overlap capacitance of the transistors forming the regenerative circuit, the capacitance of the inductors 5-4, and the capacitance of the gates or circuits being driven by the LC tank circuit.

The capacitor 5-3 is an adjustable capacitor that is used to adjust the frequency of oscillation of the LC tank circuit. Some examples of frequency adjustment include a voltage-controlled varactor that can be formed using a diode or a MOS transistor. The MOS transistor can be configured as an enhancement or depletion mode transistor. By adjusting the control voltage to these transistors, the capacitance presented to the tank circuit can be modified, thereby, modifying the frequency of operation of the tank circuit. Another form of adjustable capacitor would include an array of MOS transistors. The array would present capacitance to the LC tank circuit through switches that can be controlled by a set of control voltages. By adjusting these voltages, one or many gates can be connected or disconnected to the LC circuit that in turn varies the effective capacitance presented to the LC tank circuit. The frequency of operation of the tank circuit changes according to equation (3) where only the values of C and L are used in the following formula:

$$f = \frac{1}{2\pi\sqrt{LC}} \quad (3)$$

Figure 5B:
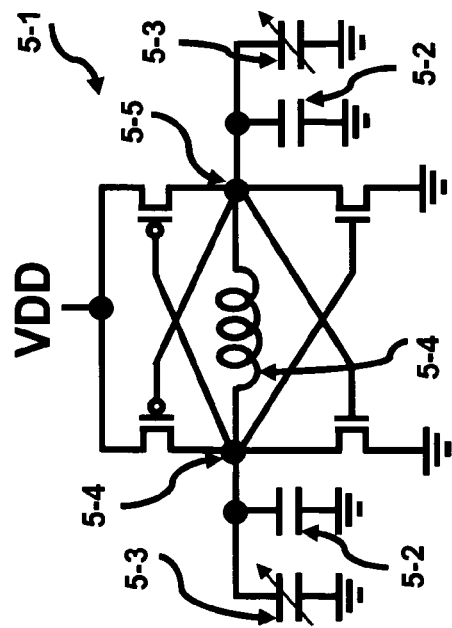
FIG. 5b depicts circuit schematics where an inductor, capacitors and controllable regenerative circuit are combined together in accordance with the present invention.

FIG. 5b shows a LC tank circuit 5-6 where the regenerative circuit type regen-1a is used. Inputs 5-7 and 5-8 can be applied to the gates of the two p-channel transistors. This circuit generates two outputs 5-9 and 5-10. Similar to the previous circuit, this circuit contains both the constant capacitive load 5-12 and the adjustable capacitor 5-11.

Figure 5C:
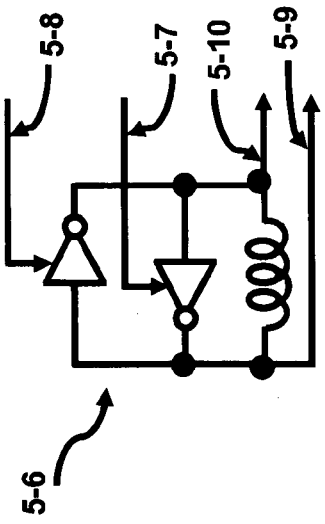

FIG. 5c presents a simplified model 5-1 of the LC tank circuit 5-1 given in FIG. 5a. In addition, the two outputs of the circuit 5-4 and 5-5 are depicted. Although not shown in FIG. 5c, the capacitive loads illustrated in FIG. 5a are assumed to exist in this simpler representation of the circuit. The transistors have been modeled using a ram-cell circuit providing a compact representation of this LC tank circuit. The meta-stable state of the ram-cell combined with the parasitic resistance of the inductor shorting the two outputs 5-4 to 5-5 appears to make the meta-stable state more likely. To overcome this state, a start up circuit can be used to unbalance the two outputs. Startup circuits are well known in the art and will not be described further. This simple circuit representation 5-1 will be used to describe several inventive circuits that will be presented later.

Figure 5D:
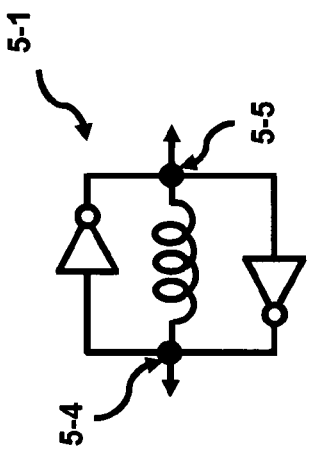
FIG. 5d illustrates a simplified circuit schematic of FIG. 5b in accordance with the present invention.

FIG. 5d presents a simplified model 5-6 of the circuit given in FIG. 5b. The input leads 5-7 and 5-8 are similarly labeled as before. In addition, the two outputs 5-9 and 5-10 are indicated.

Figure 6B:
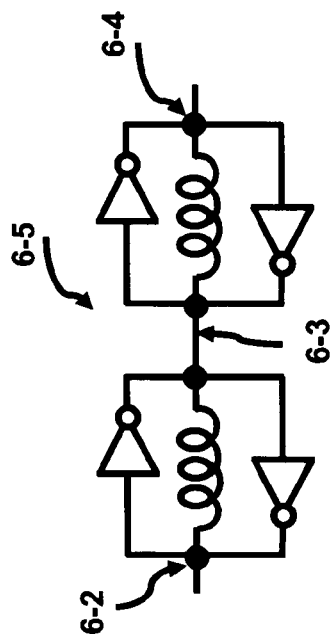
FIG. 6b-c depicts an open loop and closed loop LC tank circuit in accordance with the present invention.
Figure 6D:
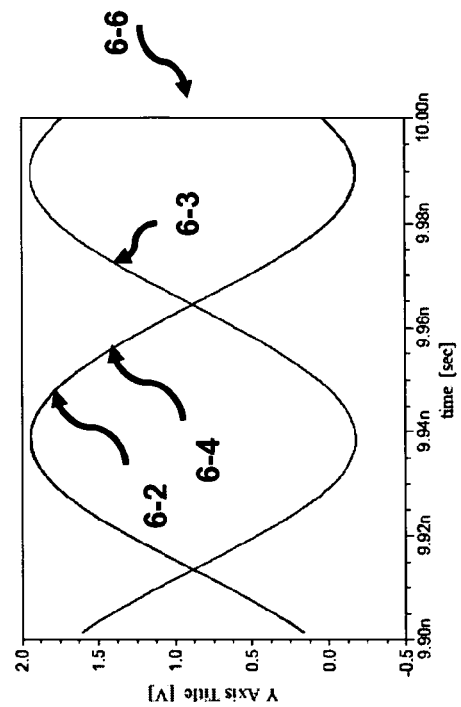
FIG. 6d depicts the simulated waveforms of the open loop and closed loop LC tank circuit in accordance with the present invention.
Figure 6A:
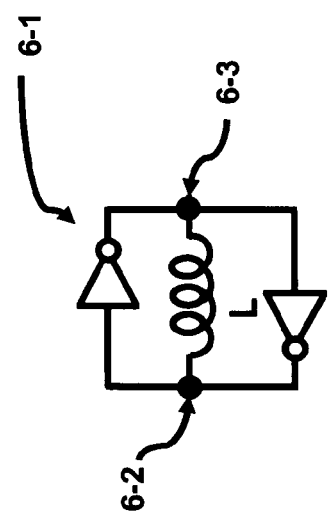
Figure 6C:
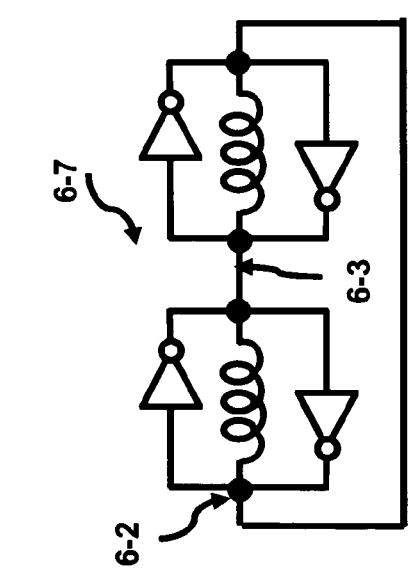

FIG. 6a shows the basic LC tank circuit 6-1 used to describe several different LC tank circuits, hereafter called the "basic LC tank circuit." This circuit has two outputs 6-2 and 6-3. The circuit also contains (but not shown) the capacitor network of the adjustable and constant variety as mentioned in FIG. 5. FIG. 6b illustrates an open series connection 6-5 of two basic LC tank circuits. This circuit 6-5 contains three outputs; 6-2, 6-3 and 6-4. FIG. 6c depicts a closed loop connection 6-7 of the circuit illustrated in FIG. 6b. Note that output 6-4 collapses and becomes the output 6-2.

FIG. 6d presents a simulation 6-6 of the basic LC tank circuit, the open and closed loop series connection of two of the basic LC tank circuits. The 10 GHz outputs 6-2 and 6-4 overlap one another while the output 6-3 is 180° out of phase with the two previous outputs. Thus, there is no difference in the outputs of the waveforms 6-2 and 6-3 for a single and dual connected basic LC tank circuit.

Figure 7A:
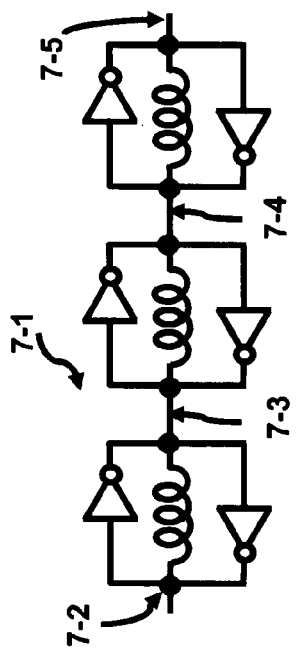
FIG. 7a depicts a three-stage open loop LC tank circuit in accordance with the present invention.
Figure 7B:
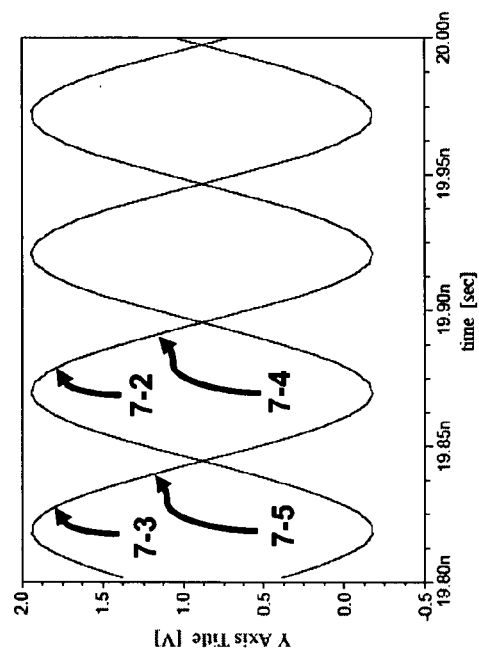
FIG. 7b show the simulated waveforms of the three-stage open loop LC tank circuit in accordance with the present invention.

FIG. 7a illustrates three basic LC tank circuits configured in an open series connection 7-7. This circuit contains four outputs; 7-2, 7-3, 7-4 and 7-5. FIG. 7b presents the simulation results of these four waveforms. Because of the open connection, every other output is similar. For example, waveforms 7-3 and 7-5 overlap each other, while waveforms 7-2 and 7-4 are generated 180° out of phase when compared to waveforms 7-3 and 7-5.

Figure 7C:
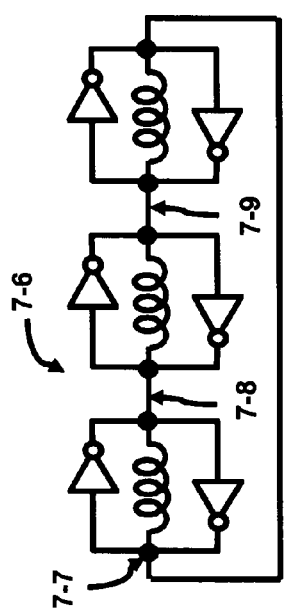
FIG. 7c depicts a there-stage closed loop LC tank circuit in accordance with the present invention.
Figure 7D:
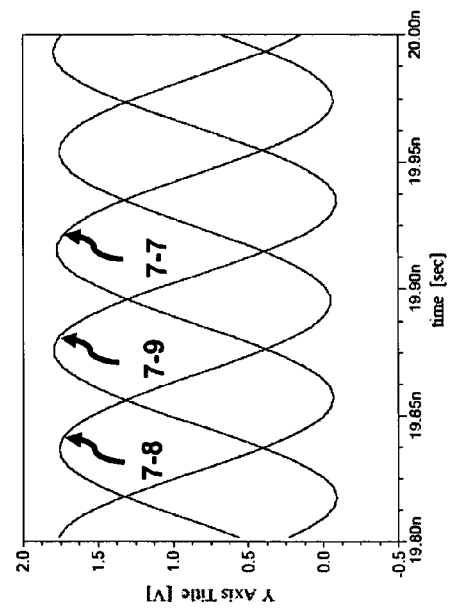
FIG. 7d show the simulated waveforms of the three-stage closed loop LC tank circuit in accordance with the present invention.

FIG. 7c shows a closed loop connection of the three basic LC tank circuits 7-6. Because the loop is closed, there are only three outputs; 7-7, 7-8 and 7-9. Also, note that one possible stable state occurs when the three outputs can be equal to one another. To avoid this situation, a startup circuit can be used to prevent this condition as mentioned earlier This circuit 7-6 generates a single-ended multi-phase output that is shown in FIG. 7d. The waveforms are labeled to correspond to the nodes of the circuit 7-6. Each output 7-8, 7-9 and 7-7 has a phase separation of 120° or;

$$\theta = \frac{360°}{n} \quad (4)$$

from the adjacent waveform where n equals the number of outputs in the closed loop LC tank circuit. The oscillation signal can propagate either clockwise or counter-clockwise in the loop. Finally, the term single-ended implies that the outputs are not balanced. For example, the circuit 7-6 generates waveform 7-8 but does not generate a balanced signal that is 180° out of phase with the waveform 7-8.

Figure 8C:
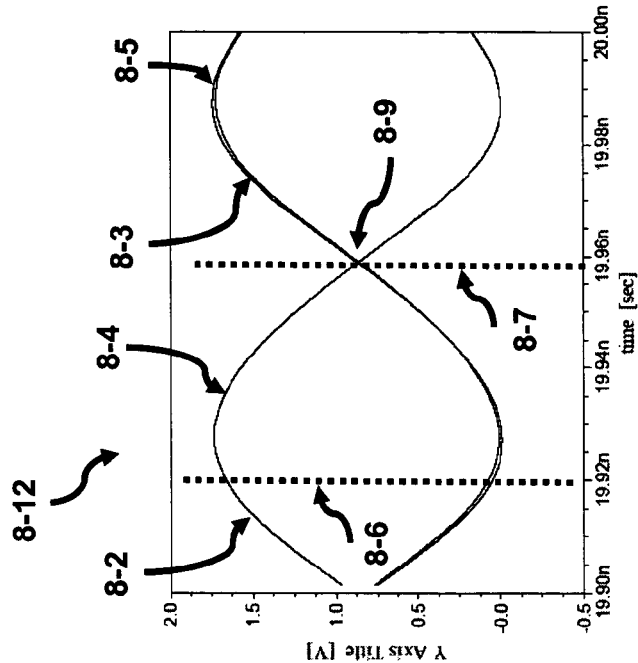
FIG. 8c provides the simulated waveforms of the four-stage closed loop LC tank circuit in accordance with the present invention.
Figure 8A:
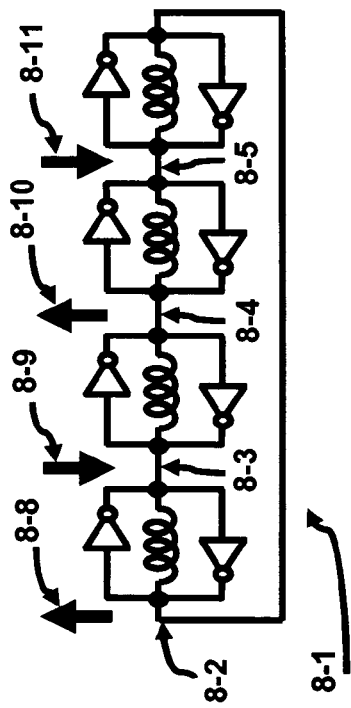
FIG. 8a depicts a four-stage closed loop LC tank circuit in accordance with the present invention.

FIG. 8a illustrates a closed loop connection of four simple LC tank circuits connected in series 8-1. This circuit has four outputs; 8-2, 8-3, 8-4 and 8-5. The simulated waveforms 8-8 of these four outputs are provided in FIG. 8c. The waveforms corresponding to outputs 8-2 and 8-4 overlap one another, while the waveforms of outputs 8-3 and 8-5 overlap each other and are 180° out of phase with the output waveforms 8-2 and 8-4.

Figure 8B:
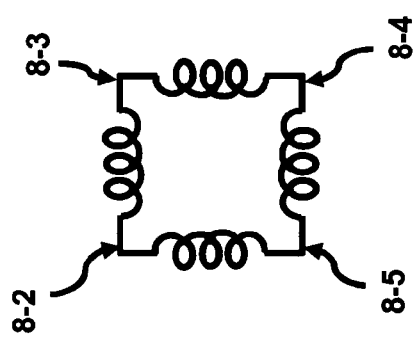
FIG. 8b depicts a the inductor connectivity in the four-stage closed loop LC tank circuit in accordance with the present invention.

FIG. 8b illustrates the closed loop connection of the four inductors joined at the outputs 8-2, 8-3, 8-4 and 8-5. These inductors provide an initial DC operating point to the circuit 8-1 time equals to 0. Assuming the inductors in the circuit 8-1 were removed, the series connection of the even number of ram-cells would cause the circuit 8-1 to enter a stable state. That is, adjacent outputs would latch into either a high or low state. Thus, the inclusion of the inductors into the circuit 8-1 provide the ability of an even number of series connected LC tank to oscillate with the limitation that the generated adjacent signals are 180° out of phase with each other.

Note that when the closed loop contains an even number of LC tank circuits, the phase separation does not satisfy equation (4). This can be seen by comparing the arrows 8-8, 8-9, 8-10 and 8-11 in the circuit 8-1 against the plots of these outputs in the waveform simulation 8-12. When the time equals 19.92 nsec, the dotted line 8-6 is used to help determine the direction of the arrows in the circuit 8-1. During time 8-6, the output waveforms 8-2 and 8-4 are increasing which is indicated by the upwards arrows 8-8 and 8-10 in circuit 8-1. Similarly, the output waveforms 8-3 and 8-5 are decreasing as indicated by the downward arrows 8-9 and 8-11 in circuit 8-1. In effect, all of the arrows in circuit 8-1 are 180° out of phase with its adjacent neighbor. Note that at time 8-7 all the waveforms converge to a point 8-9. This corresponds to the case where all the transient outputs of the circuit 8-1 are equal. After the point 8-9, the arrows in the circuit 8-1 flip polarity.

FIG. 9*a* depicts a closed loop series connection 9-1 of five basic LC tank circuits. The five outputs; 9-2, 9-3, 9-4, 9-5 and 9-6 are labeled in the circuit 9-1. The simulated waveforms for these five outputs are provided in FIG. 9*b* which also shows that the oscillation signal propagates in a counter-clockwise direction in the loop.

Figure 10B:
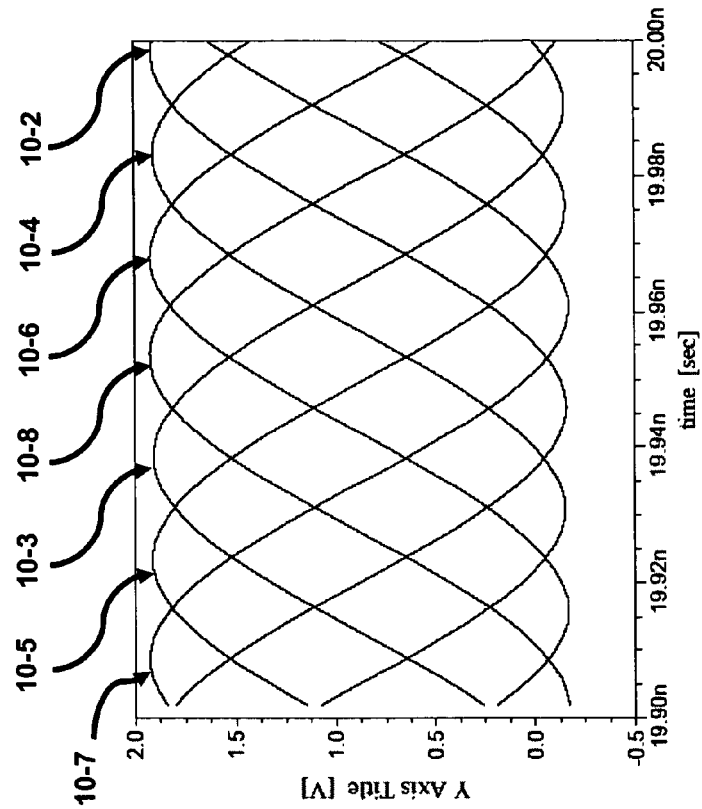
FIG. 10b provides the simulated waveforms of the seven-stage closed loop LC tank circuit in accordance with the present invention.
Figure 10A:
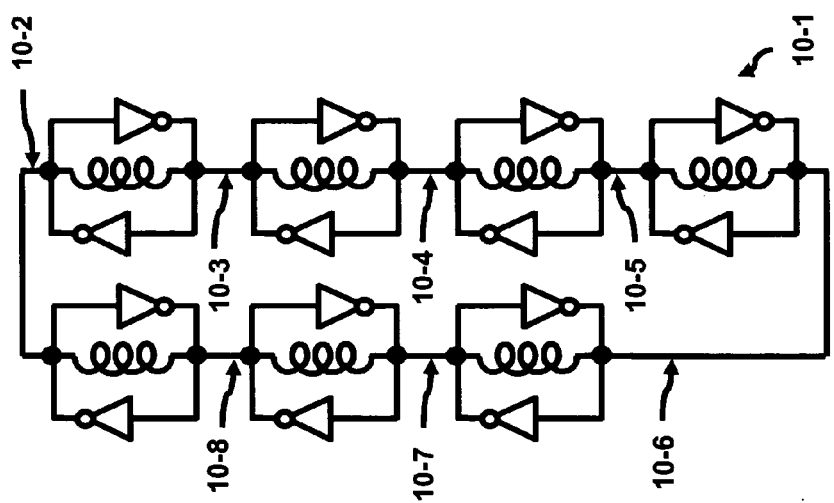
FIG. 10a depicts a seven-stage closed loop LC tank circuit in accordance with the present invention.

FIG. 10*a* depicts a closed loop series connection 10-1 of seven basic LC tank circuits. The five outputs; 10-2, 10-3, 10-4, 10-5, 10-6, 10-7 and 10-8 are indicted in the circuit 10-1. The simulated waveforms for these seven outputs are provided in FIG. 10*b* which also shows that the oscillation signal propagates in a counter-clockwise direction in the loop.

Figure 11B:
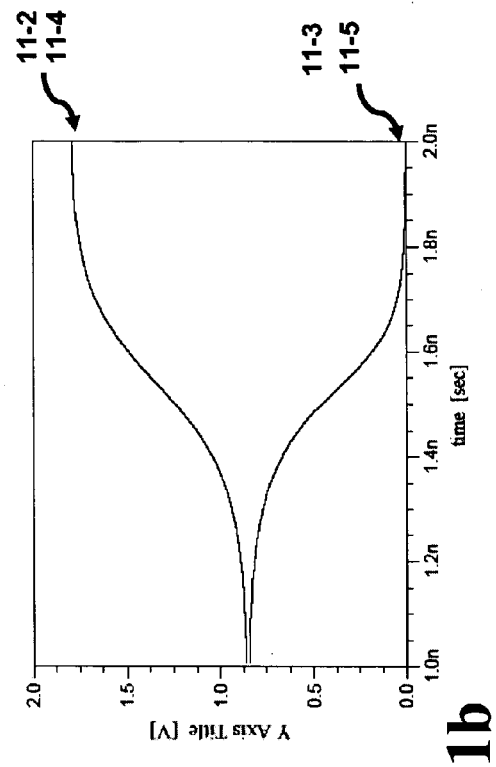
FIG. 11b-c shows the simulated waveforms of the balanced closed loop LC tank circuit in accordance with the present invention.
Figure 11C:
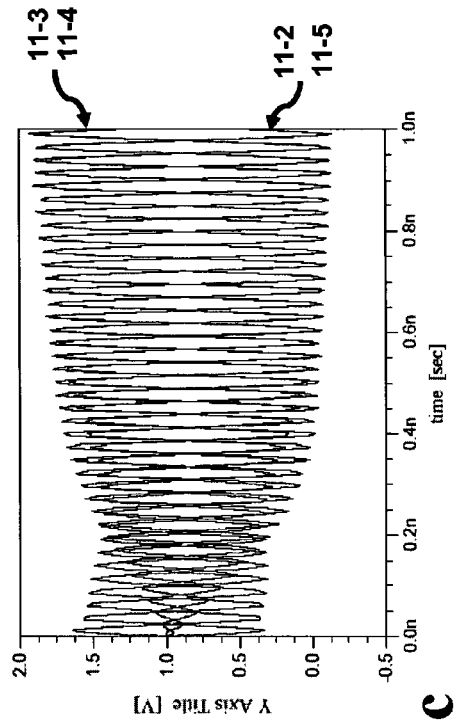
Figure 11A:
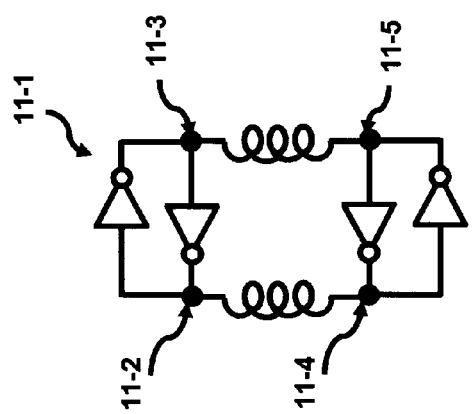
FIG. 11a depicts a balanced closed loop LC tank circuit in accordance with the present invention.

FIG. 11 and FIG. 12 both present another form of an LC tank circuit. The circuit 11-1 in FIG. 11*a* consists of a ram-cell generating outputs 11-2 and 11-3, a second ram-cell generating outputs 11-4 and 11-5, a first inductor connecting output 11-2 to 11-4 and a second inductor connecting output 11-3 to 11-5.

The simulation results for circuit 11-1 are provided in FIG. 11*b* and FIG. 11*c*. FIG. 11*b* illustrates a stable state different from that described when the circuit given in FIG. 6 was covered. The circuit 11-1 can end in state where the ram-cells latch their outputs into a high and low state. FIG. 11*b* shows the outputs 11-2 and 11-4 both ending in a high state, while the outputs 11-3 and 11-5 end in a low state. However, using a startup circuit, the circuit 11-1 can go into oscillation as indicated by the simulation results given in FIG. 11*c*. When the circuit 11-1 oscillates, the simulated results show that outputs 11-3 and 11-4 overlap one another, while outputs 11-2 and 11-5 overlap each other and are 180° out of phase with the waveforms 11-3 and 11-4.

Figure 12B:
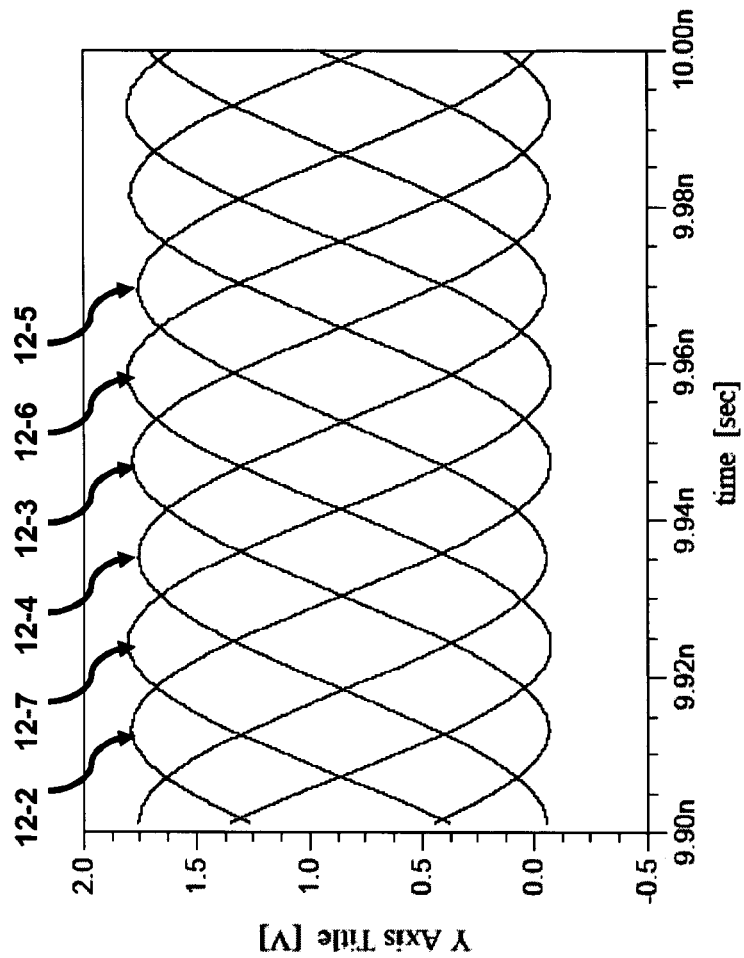
FIG. 12a provides a balanced three-phase closed loop LC tank circuit in accordance with the present invention. FIG.
Figure 12A:
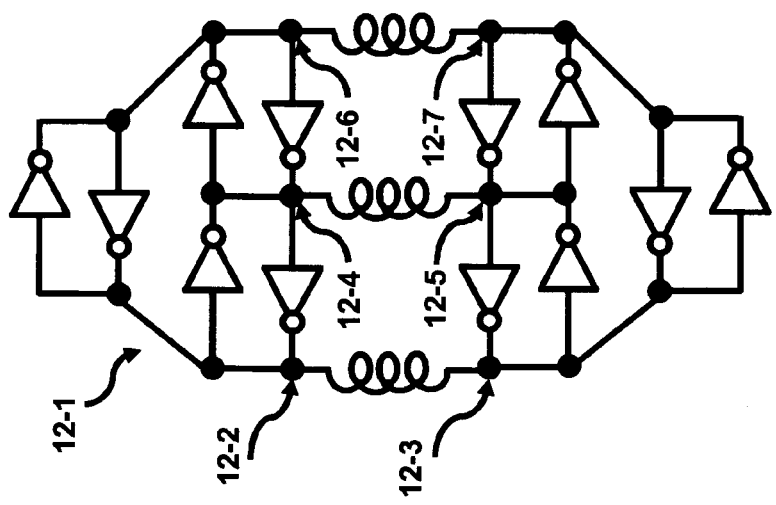

The circuit 12-1 in FIG. 12*a* generates three balanced clock signals that are 120° out of phase with one another. Three ram-cells are placed between outputs 12-2 and 12-4, 12-4 and 12-6 and 12-6 and 12-2 forming a ring structure located in the upper portion of circuit 12-1. Another three ram-cells are placed between outputs 12-3 and 12-5, 12-5 and 12-7 and 12-7 and 12-3 forming a second ring structure. Finally, inductors are positioned between outputs 12-2 and 12-3, 12-4 and 12-5, and 12-6 and 12-7. A startup circuit insures that the circuit goes into oscillation. FIG. 12*b* illustrates the waveforms at the outputs 12-2, 12-3, 12-4, 12-5, 12-6 and 12-7. Note that the outputs located across each inductor generate a set of balanced output oscillation signals.

FIG. 13*a* illustrates two LC tank circuits 13-1 that are connected to each other. The outputs 13-2 and 13-3 of the upper LC tank circuit are cross connected to the gates of the two p-channels 13-7 and 13-8 in the lower LC tank circuit. In addition, the outputs of the lower LC tank circuit 13-4 and 13-5 are directly connected to the gates of the two p-channels 13-9 and 13-10 in the upper LC tank circuit. This circuit 13-1 generates a quadrature signal. Note that the circuit 13-1 uses the two sets of the regen-1*a* regenerative circuit.

The upper LC tank circuit is drawn in the simplified form 13-6 that was given earlier as the circuit in FIG. 5*d* and is redrawn in FIG. 13*b*. The input signals 13-4 and 13-5 control the inverter symbols and correspond to the gates of the two p-channel transistors 13-9 and 13-10. The outputs 13-2 and 13-3 are formed across the inductor. The circuit 13-6 is further simplified to the block diagram 13-11 depicted in FIG. 13*c*. The input signals are 13-4 and 13-5, while the output signals are 13-2 and 13-3. The labeling of these signals are in agreement with the signal names given in FIG. 13*b* and FIG. 13*a*.

The block diagram 13-11 is substituted for the circuits in FIG. 13*a* to generate the equivalent block diagram 13-12 depicted in FIG. 13*d*. The simulation results for this circuit are given in FIG. 13*e*. Note that the output signals 13-3 and 13-2 generate the balanced 0° and 180° signals, while the outputs 13-5 and 13-4 generate the balanced 90° and 270° signals.

A block diagram 14-1 that generates six balanced signals 14-2, 14-3, 14-4, 14-5, 14-6, and 14-7 are illustrated in FIG. 14*a*. The circuit 14-1 was simulated and the waveforms are presented in FIG. 14*b*. The three sets of balanced signals are; the 0° and 180° signals 14-4 and 14-5 the 60° and 240° signals 14-7 and 14-6, and the 120° and 300° signals 14-2 and 14-3.

Note that the outputs of each block feeding the next one do not cross one another as it did in the quadrature block diagram in FIG. 13*d*. Thus, for an even balanced output signal generation, the outputs should cross an odd number of times. In an odd balanced output circuit, the outputs should cross an even number of times.

FIG. 15*a* shows a block diagram of an eight balanced output clock generator 15-1. The outputs are 15-2 to 15-9. Simulation results of the circuit in FIG. 15*a* are given in FIG. 15*b*. Note that there are four balanced sets of clock signals. Each output waveform is labeled to correspond to the output of the block diagram 15-1.

All of the previous circuits, block diagrams, and schematics provided the connectivity of several LC tank circuits to generate oscillations which could have multi-phase components. Such circuits are useful for RF designs, clock generation for VLSI chips, adiabatic circuitry, analog circuitry, and high-speed digital circuitry. The interconnectivity of these LC tank circuits were performed by a physical connection such as a metal interconnect. The next group of circuits will interconnect the LC tank circuits using the flux linkage between inductors or coils.

Coils and inductors sometimes have the similar meanings. Inductors are metallic elements that have a self-inductance. Coils are also inductors, where the name coil can imply that the shape of the inductor has a circular twist in its physical structure. In addition, the word coil can be used when there may be more than one inductor in the system where the two inductors may form a transformer. Thus, the coils share a flux linkage and signals can be sent between the coils using this flux linkage that exists in a transformer.

FIG. 16*a* reproduces a circuit 16-1 that was shown in FIG. 5*c*. The two outputs are 16-2 and 16-3. The inductor 16-4 connects the two outputs. FIG. 16*b* redraws the equivalent circuit but this time replaces the inductor with a metallic trace shaped as a coil 16-4. The coil has a width W, an outside dimension $d_{out}$, and an inside dimension $d_{in}$. The coil is connected to the regenerative circuit by outputs 16-2 and 16-3. Note that this coil only has one turn and the turn is rectangular and represents a basic cell. Those skilled in the art realize that the coil may have a variety of shapes; circular, hexangular, spiral, etc. In addition, the number of turns can be a portion of one or several turns.

FIG. 17*a* illustrates the physical placement for two of the basic cells given in FIG. 16*b*. The area covered by this structure is $2d_{out}$ by $d_{out}$. Because of this placement, the flux produced by the coil 17-4 is linked to the coil 17-5 and vice versa. A circuit schematic 17-1 is given in FIG. 17*b* representing the placement of the coils shown in FIG. 17*a*. The circuit 17-1 illustrates the outputs of the upper regenerative circuit 17-2 and 17-3 and the connection to the coil 17-4. The lower coil is indicated as 17-5 and connects to a second regenerative circuit generating outputs 17-6 and 17-7. The coils link the upper and lower circuits. This flux linkage is also known as mutual coupling and is indicated by the symbol M and the double arrowed line. In addition, the dots on the coils indicated the induced voltage generated in each coil according to Lenz's Law. The combination of the double coil, the M symbol, and the dots are referred collectively as a transformer. In simulation tools, the coupling coefficient k is used to simulate the flux linkage. The mutual inductance M is related to the coupling coefficient k according to:

$$M = k\sqrt{L_1 L_2} \quad (5)$$

The circuit 17-1 was simulated and the results are indicated in FIG. 17c. The inductance of both coils was assumed to be equal ($L_1 = L_2$) and the k in the simulator was set to 0.4. The waveforms at outputs 17-2 and 17-6 overlay one another. This result also agrees with the position of the dots.

Furthermore, this simulation demonstrates that a clock signal can be synchronized over an area of the die. In this case, by reviewing the structural layout of FIG. 17a, the area is $2d_{out} \times d_{out}$. Thus, this illustrates one aspect of the invention: the flux linkage can be used to synchronize a clock signal over an area of the die.

The dot position in the circuit 17-8 was modified as shown in FIG. 17d where otherwise all the named nodes as compared to the circuit 17-1 remain the same. The simulation results are indicated by the waveforms shown in FIG. 17e. Now the outputs 17-3 and 17-6 overlay one another. Thus, in a transformer, the flux linkage tends to force the oscillation at the dotted terminals to have the same phase. And furthermore, the flux linkage tends to force the oscillation at the dotted and un-dotted terminals to have a phase difference of 180°.

FIG. 18 illustrates how a larger area can be encompassed by the placement of additional basic cells that are flux linked to at least the neighboring coils. Four coils; 18-10 through 18-13 are positioned near one another in an IC chip. The regenerative circuits generate the outputs; 18-2 through 18-9. The total area is $2d_{out} \times 2d_{out}$. This concept can be extended across the entire surface of the die.

The coil formation may occur in the upper layer metals of the die where the metal thickness can be made thicker so that the parasitic resistance of the metal trace forming the inductance can be minimized. Active circuitry which will be clocked by the oscillations generated by the LC tank circuits can be placed anywhere on the die if the active circuitry does not need these upper layers of metal for routing or forming interconnections between the active circuitry. However, if the active circuitry requires a partial use of these upper layers of metal then it would be desirable to increase the area of the coil without necessarily decreasing the frequency of operation.

For example, referring to FIG. 1e, the inductor in the first row has an inductance of 0.565 nH and a $d_{in}$ of 210 µm. The inductor in the second row has an inductance of 1.266 nH and a din of 460 µm. Thus, the second inductor has a little over twice the inductance but has an internal area ($d_{in} \times d_{in}$) that is more than four times that of the first inductor. Using equation (3) reveals that the second inductor would drop the frequency of oscillation by a factor of $1/\sqrt{2}$ while the internal area increases by a factor of 4. One approach to achieving a larger usable area while maintaining a higher frequency of operation is to use parallel connections of inductors. For example, look at the physical layout 19-1 of FIG. 19b showing a second basic cell. This cell measures $2d_{out} \times d_{out}$. Two inductors 19-2 and 19-5 are connected in parallel to a single regenerative circuit that generates two outputs 19-3 and 19-4. Assume that the inductor in the second row of FIG. 1e was used for the inductors 19-2 and 19-5. The equivalent inductance of parallel-connected inductances is given by;

$$\frac{1}{L_1} + \ldots + \frac{1}{L_n} = \frac{1}{L_{equ}} \quad (6)$$

or the equivalent inductance is determined as 0.633 nH by using equation (6). This value of inductance approaches that of the inductance given in the first row. As mentioned earlier, the encompassed area of a single 1.266 nH inductor increased the area by a factor of 4× compared to the 0.565 nH inductor. Furthermore, since there are two of these encompassed areas enclosed by the inductors 19-2 and 19-5. The overall encompassed area for this second basic cell using only one regenerative circuit is increased by 8× when compared to the prior basic cell consisting of a regenerative circuit connected to a single 0.565 nH inductor. Also note that the equivalent parasitic resistance of parallel-connected inductors is decreased as given by;

$$\frac{1}{R_1} + \ldots + \frac{1}{R_n} = \frac{1}{R_{equ}} \quad (7)$$

so the resistance presented to the regenerative circuit is 0.467Ω as determined by using equation (7). This is very similar to the parasitic resistance value of the first inductor in the first row. Thus, the parallel combination of larger inductances or coils in an IC offers benefits of increasing the encompassed area. In addition, the frequency of operation and the value of parasitic resistance can maintain their initial values. Furthermore, only one regenerative circuit is necessary to drive two inductors that offers the potential benefit of decreasing the power dissipation since one regenerative circuit has been eliminated. These are all advantages of the second aspect of his invention. Although the parasitic capacitance increases by a factor of two, the power dissipation of driving this capacitance is adiabatic (because of the tank circuit) and is lower than the power dissipation arrived at by using equation (1).

FIG. 20a depicts the placement of two basic cells with the physical layout of 19-1 placed next to one another to form the physical layout 20-1 shown. The coils are 20-2 through 20-5 and the two regenerative circuits generate the outputs 20-6 through 20-9. The schematic representation of the physical layout 20-1 is shown in FIG. 20b. The numbering of the nodes and devices follows the convention used in FIG. 20a. In particular, note that only two sets of dots are indicated on the transformers. Note that not all of the dots are shown so that the circuit is simplified. For example, depending on the level of the accuracy desired in the determination of the flux interaction (a CAD tool would be a useful addition to help determine the full interaction), there will be a k coupling interaction between coil 20-2 and the three coils 20-3, 20-4 and 20-5. A k coupling interaction will also occur between coil 20-3 and the two coils 20-4 and 20-5. Finally, the coil 20-4 will have a k coupling interaction to coil 20-5. Thus, for the above description there should be 6 sets of dots on the transformers. Furthermore, note that there are effectively six sets of transformers; 20-2 and 20-3, 20-2 and 20-4, 20-2 and 20-5, 20-3 and 20-4, 20-3 and 20-5 and finally 20-4 and 20-5. This is a very simplified flux interaction between each coil and the other one. A more detailed flux interaction would occur if each coil was broken into several segments; and each of these segments interacted with all of the remaining segments. The number of transformers would increase dramatically thus showing the need for a CAD (Computer Aided Design) tool that would aid in the determination of all these calculations.

FIG. 21b illustrates a physical layout 21-1 that incorporates eight of the basic cells with the physical layout 19-1 given in FIG. 19b. Each of the eight basic cells is labeled 21-2 through 21-9. In addition, only one of the two outputs of each regenerative circuit is labeled 21-10 through 21-17. The total size of this physical layout is $4d_{out} \times 4d_{out}$. An inductor from the first row of FIG. 1f was used; thus, the area is estimated at 1000 µm×1000 µm.

A schematic circuit for the physical layout 21-1 is given in FIG. 21a. Again note that only a fraction of the dot pairs are indicated. The numbering system used to identify the components in FIG. 21a corresponds to those used in FIG. 21b.

FIG. 21c provides the simulation result when the circuit of FIG. 21a is simulated. Note that the waveforms of the eight outputs 21-10 through 21-17 start up randomly and then at about 2 nsec the outputs start to synchronize and overlap one another. As pointed by the arrow, all eight waveforms are in unison. Thus, the flux linkage between the coils can be used to synchronize the clock oscillation circuits between several interacting coils over a region of a die. The flux linkage allows the clock network to exchange information so that the clock oscillation circuits can self-align their clock outputs and become synchronized.

FIG. 21d illustrates a close-up of the eight outputs 21-10 through 21-17. The skew between these eight signals is about 3 psec. This result is very promising since this value is only about 2.4% of the 125 psec period or for the clocks running at 8 GHz.

FIG. 21e depicts the situation when all the k coupling coefficients are reduced to 0. Thus, there is no interaction between the eight LC tank circuits. As can be seen, the waveforms of the eights outputs spread out over the period dependant only on the initial conditions that were applied to each LC tank circuit before time t=0.

FIG. 21f provides a table 21-18 indicating the simulation conditions when the circuit in FIG. 21a representing the physical layout 21-1 was simulated in SPICE. The frequency of operation of the layout was targeted at 8 GHz and is an expected frequency of future VLSI and µprocessor chips. The process was a 0.13 µm CMOS technology having a core VDD of 1.2V. A sheet resistance of 0.01Ω/□ was used for the coils, while each of the inverters had a p-channel width of 30 µm and an n-channel width of 15 µm. The inductor was selected from the first row of the table given in FIG. 1f. The inductance of each individual coil was 0.633 nH and had a parasitic resistance of 0.868Ω. Because two inductors were placed in parallel in each cell, equations (6) and (7) were used to determine that the equivalent inductance and resistance is 0.322 nH and 0.434Ω, respectively. The k coupling coefficient value ranged from 0.4 to 0.03 dependent on the relative placement between two coils.

FIG. 21g gives a table 21-19 that uses the results of the current simulation of the physical layout 21-1 to determine expected parameters when the physical layout is increased in size to a die size of 1.6 cm×1.6 cm. The area of one of the eight cells in the physical layout is 500 µm×250 µm. The total area of the layout 21-1 in FIG. 21b is 1,000 µm×1,000 µm, while the size of the µprocessor chip is 16,000 µm×16,000 µm. This data can be used to estimate the number of cells required in the µprocessor. In the layout 21-1, 8 basic cells were placed together. A simple calculation indicates that the µprocessor would require 2048 cells to cover the surface of the die.

Each basic cell contains a regenerative circuit and as indicated earlier has a balanced output that drives a capacitive load consisting of parasitic and adjustable components. In this simulation, each output had an additional capacitive load of 0.5 pF connected to each output; part of which accounts for the two parallel-connected inductors that have a capacitive load of 0.35 pF. In addition, the gate and drain capacitance of the transistors within the regenerative circuit adds another 0.6 pF. The capacitance load that each output of the basic cell drives is approximately is 1.1 pF while the total capacitance each cell drives is 2.2 pF. However, since the transistor parasitics will not change significantly in a given technology, their contribution of "drivable" capacitive load will be subtracted from the 2.2 pF figure leaving about 1 pF of "drivable" load. The capacitive load of the inductor was not subtracted from this figure because it is possible that the inductor can be fabricated off-chip (MCM, for example) and may have a lower capacitance. Thus, the total "drivable" capacitance is 1 pF and the total "drivable" capacitance of the layout 21-1 would be 8 pF. The corresponding capacitive value for the µprocessor is 2048 pF as indicated in the table.

The power per cell was simulated to be 2 mW. Thus, the total power for the layout 21-1 is 16 mW while the µprocessor would dissipate about 4.1 W.

The idea of placing more than two parallel inductors across a single regenerative circuit 22-1 is illustrated in FIG. 22b. Four inductors 22-4 through 22-7 are positioned in four quadrants and connected to the regenerative circuit that generates the outputs 22-2 and 22-3 located at the origin. A schematic representation of the physical layout is shown in FIG. 22a. The numbers correspond to the same element between the two diagrams. This type of structure allows a large inductor (both physically and numerically) to be used in 22-4 through 22-7, yet due to equation (6) and (7), presents a much smaller inductance and resistance to the regenerative circuit.

The parallel combination of inductors is useful for several reasons. First, the larger inductance value implies a physically larger inductor. For example, (see FIG. 1e, bottom row) a 3.46 nH inductor has a $d_{out}$ of 1250 µm. Thus, the total size of the layout 22-1 would be 2500 µm×2500 µm. So, one regenerative circuit can be used to cover a large area. Second, the parallel combination reduces the resistance value from 4.868Ω to 1.434Ω. This helps reduce the size of the transistors in the regenerative circuit. The benefit is that the power dissipation decreases two ways: 1) smaller transistors that switch a load dissipate less power, 2) the leakage current is proportional to the size of the transistors, thus there would be less power dissipation due to leakage current. Third, the parallel combination reduces the inductance and allows a higher frequency to be achieved according to equation (3).

To increase the k coupling coefficient, the adjacent inductors can be placed over the inductors of an adjacent cell. FIG. 23a illustrates how a multi-level metallization can be used to increase the flux linkage. Assume that the physical layout or cell 22-1 is used in FIG. 23a. The physical structure 23-1 shows two cells formed on a lower metal layer while a third cell is formed in an upper metal layer. Note the relative placement of the inductors from top cell in relation to the inductors of the remaining two lower cells. The top cell has two physical inductors 23-6 and 23-7 identified while the regenerative circuit is positioned at 23-3.

The active transistors within 23-3 may in fact be located in the semiconductor portion of the die. Thus, 23-3 can symbolically represent the regenerative circuit. In addition, there are dielectric or oxide layers between the metal layers that are not indicated, nor is the substrate indicated. Those with average skill in the art will appreciate that these layers can be incorporated without losing the meaning of this description.

An inductor 23-5 from one of the lower cells is positioned under the inductor 23-6 of the top cell. In addition, an inductor 23-2 from the other lower cell is positioned under the inductor 23-7 of the top cell. Thus, the top cell has a flux linkage with two lower cells. This pattern can be extended to encompass all of the cells in both metal layers to create a strongly coupled interwoven flux linkage network that operates as a single unit. A feed forward continuous flux linkage path formed by the flux linkage and the electrical portions of the regenerative circuit would be the energy arriving at the regenerative circuit 23-4, then being electrically sent to the inductor 23-5, having a flux linkage path to the inductor 23-6 above it, sent electrically to the regenerative circuit 23-3, passed electrically to the inductor 23-7, having a flux linkage path to the inductor 23-2 below it, sent electronically to the regenerative circuit 23-8, and passed further down the chain.

A feedback continuous flux linkage path is illustrated with FIG. 23b which shows an additional cell added to the top metal layer. The fourth cell has its regenerative circuits in the region 23-9. Thus, 23-9 electrically drives the inductors 23-11 and 23-13. The inductor 23 over inductor 23-10 driven by the regenerative circuit 23-8, while the inductor 23-13 is over the inductor 23-12 driven by the regenerative circuit 23-4. A feedback path would occur starting from the regenerative circuit 23-3, sending the electronic signal to the inductor 23-6, having a flux linkage path to the inductor 23-5 below it, sending the electronic signal to the regenerative circuit 23-4, passed electrically to the inductor 23-12, having a flux linkage path to the inductor 23-13 above it, sent electrically to the regenerative circuit 23-9, passed electrically to inductor 23-11, having a flux linkage path to the inductor 23-10 below it, sent electronically to the regenerative circuit 23-8, passed electrically to the inductor 23-2, having a flux linkage to the inductor 23-7 above it, and finally having the electrical signal ending at the regenerative circuit 23-3.

This is one of the benefits of this invention: the flux linkage between the cells have feedback and feed forward paths that lock the operation of the network to oscillate in a unified fashion. All of the paths converge to create a circuit that synchronizes the clock signal.

FIG. 24 illustrates a MCM (Multi-Chip Module) 24-1 containing an inductor on each of the two die making up the MCM. The cross-sectional view has been simplified to provide the crux of the idea. For example, only one metal layer is shown on each die but those skilled in the art will appreciate that additional metal and dielectric layers can be added to the diagram without altering the idea. The lower die contains a substrate 24-2 and a dielectric layer 24-3 has been deposited on the substrate. A metal layer 24-5 with the shape of a coil (not shown) has been patterned on top of the dielectric layer 24-3. The coil 24-5 has its first lead electrically connected to a via and a metal layer 24-6. The second lead of the coil is electrically connected to the via and a metal layer 24-9. The solder bumps 24-7 connect the lower die to the upper die.

The upper die has a similar structure as the lower die to simplify the description and many of the numerals describing the features are the same. A dielectric layer 24-3 is deposited on the substrate 24-2. A metal layer 24-8 with the shape of a coil (not shown) has been patterned on top of the dielectric layer 24-3. The coil 24-8 has its first lead electrically connected to a first via and a metal layer 24-6. The second lead of the coil is electrically connected to a second via and a metal layer 24-9. The solder bumps 24-7 not only provide mechanical support to the two die but electrically connect the two coils in parallel as well. These two coils are now electrically connected in parallel and the flux of each coil is linked to the other coil due to their proximity to each other.

So far, all of the flux linkage structures to distribute a clock signal over the surface of an IC were for one clock signal and its inverse. It is possible to create a flux linkage network that synchronizes a multi-phase signal. The intent would be to try to isolate each of the different clock phases from one another as much as possible and attempt to link up only the flux of the coils responsible for generating the same phase clock signals. The basic circuit, which will be distributed over the surface of the die, is illustrated in FIG. 25a which was discussed earlier. This circuit 25-1 generates a set of balanced clock signals separated by 45°. Each block 25-2, 25-8, 25-9 and 25-10 generates a set of clocks. The top block 25-2 that generates φ1 has two inputs 25-3 and 25-4 and two outputs 25-5 and 25-8.

The circuit schematic within the top block 25-2 is illustrated in FIG. 25b. The inputs 25-3 and 25-4 are applied to the gates of the two p-channel transistors, while the two outputs 25-5 and 25-6 are generated by the cross-coupled n-channel structure connected to the inductor 25-7.

The inductor 25-7 of the top block 25-2 is shown in its physical structure in FIG. 25c responsible in part for generating the clock signal φ1. Each of the remaining blocks 25-8, 25-9 and 25-10 contain an inductor 25-11, 25-12 and 25-13 and is used to generate the clock signals φ2, φ3 and φ4, respectively, as indicated. The physical structure and the relative positioning of the three additional inductors with respect to each other is provided in FIG. 25c as 25-17. Note that the layout of each inductor contains an extension leg that is connected to the solid square 25-14. This extension leg helps to segregate the flux within one inductor from each of the other inductors. The square 25-14 symbolically contains all the transistors within the circuit 25-1 with the exception of the inductors. Thus, this square 25-14 contains the transistors, capacitors, varactors, and electrical outputs.

A single layout of the inductor with the extension leg 25-7 is indicated in FIG. 25d. The extension leg has two leads and carries current 25-15 in both directions. If the leads are placed close together, Lenz's law will negate the value of the inductance of these two conductor trances; however, these trances will still add both parasitic capacitance and resistance into the circuit and needs to be accounted for during simulations. The square loop uses the measurements of $d_{out}$ and $d_{in}$ for the loop as given earlier. Assume that the extension leg has a length of $\frac{1}{2}d_{out}$.

The physical overlap flux linkage structure 25-16 of an inductor with a leg extension with another inductor with a leg extension is provided in FIG. 25e. This type of layout will help to increase the flux linkage between the two coils, thus correspondingly increasing the coupling coefficient k.

FIG. 25f depicts the physical placement of two physical layouts 25-17 where the second one on the right is being rotated counter-clockwise by 180°. In addition, the physical representation of these layouts has been simplified where the detail of the inductor trace has been eliminated. After the rotation, the φ3 coil of the left layout 25-17 is placed over the φ3 coil of the right layout forming the physical overlap flux linkage structure 25-16. This linkage improves as the two coils are aligned over one another along their edges. The entire physical structure 25-18 forms the basic building cell to generate a large array.

The physical structure 25-18 is used to form the network 26-1 in FIG. 26a. Note that to build this network, the physical structure 25-18 is duplicated and the odd phases are flux linked together horizontally while the even phases are flux linked together vertically. This layout is a 4×4 array having a size of $8d_{out}$ by $8d_{out}$. Each basic cell generates the eight balanced outputs in each of their respective square 26-3. In total, this layout 26-1 generates (4)*(4)*(8) or 128 outputs. The inductors along the periphery 26-2 need to be altered in value to account for the boundary condition. The inductor within these periphery locations are modified according to:

$$L_{boundary} = L_{internal}(1+k) \quad (8)$$

The value in equation (8) uses the k coupling coefficient value for the physical overlap flux linkage structure 25-16 of the overlapping coils.

The physical layout 26-1 was modeled and simulated in SPICE. FIG. 26b illustrates a 200 psec window at time t=10 nsec where the simulated results of all 128 outputs in the array are shown. These outputs appear to be randomly distributed. However, the same 128 outputs waveforms are plotted in a 200 psec window at time t=100 nsec, revealing the results of FIG. 26c. The flux linkage was given enough time to synchronize the network and generate the multi-phase signals that are separated 45° apart from one another. This is a fabulous result. This indicates that flux linkage can synchronize and distribute multi-phase signals over the surface of an IC. The measured spread of the skew at 100 nsec is 3 psec.

FIG. 26d provides a table 26-6 indication the simulation conditions when the circuit in FIG. 26a representing the physical layout 26-1 was simulated in SPICE. The frequency of operation of the layout was targeted at 10 GHz and is an expected frequency of future VLSI and μprocessor chips. The process was a 0.13 μm CMOS technology having a core VDD of 1.2V. The transistor sizes in the regenerative circuit had a p-channel width of 20 μm and an n-channel width of 10 μm. Each basic cell generates 4 sets of balanced outputs and contains 4 regenerative circuits, one for each set of balanced outputs. The inductor was selected from the first row of the table given in FIG. 1f. The inductance of each individual coil was 0.633 nH and had a parasitic resistance of 0.868Ω+0.24Ω for the extension leg providing a total of 1.108Ω, where a sheet resistance of 0.01Ω/□ was used for the coils. The parasitic capacitance $C_{OX}$ of the coil and extension leg is 0.225 pF. The k coupling coefficient value was set at 0.9.

FIG. 26e gives a table 26-7 that uses the results of the current simulation of the physical layout 21-1 to determine expected parameters when the physical layout is increased in size to a die size of 1.6 cm×1.6 cm. The area of one of the sixteen cells in the physical layout is 500 μm×500 μm. The total area of the layout 26-1 in FIG. 26a is 2,000 μm×2,000 μm, while the size of the μprocessor chip is 16,000 μm×16,000 μm. This data can be used to estimate the number of cells required in the μprocessor. In the layout 26-1, 16 basic cells were placed together. A simple calculation indicates that the μprocessor would require 1024 cells to cover the surface of the 1.6 cm ×1.6 cm die.

Each basic cell contains four regenerative circuits and as indicated earlier has a balanced output that drives a capacitive load consisting of parasitic and adjustable components. In this simulation, each output had an additional capacitive load of 0.5 pF connected to each output; part of which accounts for the inductor that have a capacitive load of 0.2225 pF. Thus, the total "drivable" capacitance (discussed earlier) in each cell is 4 pF and the total "drivable" capacitance of the layout 26-1 would be 64 pF. The corresponding capacitive value for the μprocessor is 4096 pF as indicated in the table.

The power per cell was simulated to be 4 mW. Thus, the total power for the layout 26-1 is 64 mW while the μprocessor would dissipate about 4.1 W. The power dissipation for the μprocessor is similar to the previous case mentioned earlier where only one phase is distributed within the die. When the second stage buffers are added into the simulation, the power estimation increases to 7.6 W. This power is over an order of magnitude less than what is being predicted for these die. These simulations indicate that flux linkage is a very viable technique for present and future clocking networks of VLSI chips.

Due to processing, voltage, and temperature (PVT) variations, a method of adjusting the frequency of the oscillators may be necessary. FIG. 27 illustrates a circuit description 27-1 that can be utilized to adjust the frequency of each individual oscillator. A coarse adjust signal is introduced at input 27-2 and applied to all coarse adjustment capacitors 27-3. Note that the oscillators generate a balanced signal so that both outputs need to be adjusted. There is also non-adjustable capacitor 27-4 that models the transistor, inductor and interconnect wiring parasitic capacitances. The signal 27-2 can be a digital bus signal, analog, or a combination of both. After the coarse adjustment, each oscillator is probed for its frequency signal after being amplified by the buffer 27-7. This buffer can be a diff-amp, inverter, or any high speed buffer. A finite state machine (FSM) 27-14 generates a bus signal 27-9 that enables the mux 27-8 and enables the register 27-16. The buffer 27-7 passes the signal through the enabled mux to the output signal 27-10. This signal is applied to the frequency detect circuit 27-12 which compares it against a reference oscillation signal 27-11. The output of the frequency detect determines whether the frequency is too low, within range, or too high and generates a signal 27-13. This signal is applied to the FSM 27-14 which then decides what to do. If the frequency is very far off, the FSM 27-14 may command a change in the coarse signal 27-2, otherwise information is sent to the register 27-16 via the line 27-15 so that the register is set to a weight that will adjust the fine adjust capacitors 27-6 within the oscillator. If the frequency comparison in 27-12 is acceptable, the signal 27-13 instructs the FSM 27-14 to select the next oscillator using the signal 27-9. This signal enables the next buffer to place its signal onto the lead 27-10 to be analyzed. In addition, the register 27-16 is disabled from being altered and the contents it holds remains fixed which maintains the correct fine adjust value for the capacitors 27-6 in the first oscillator. The next oscillator's register 27-18, for example, is enabled to get ready to set its register to the unique fine adjust value.

Another form of frequency adjustment is depicted in FIG. 28a. This is a passive capacitance flux linkage frequency adjustment circuit 28-1. An LC tank circuit contains a regenerative circuit, an inductor 28-4 and generates two outputs 28-6 and 28-5. The inductor is mutually coupled via flux linkage to a second inductor 28-3. This second inductor 28-3 forms part of a tank circuit where the capacitor 28-2 forms the other part. The capacitor 28-2 is adjustable and by adjusting its value the frequency of operation of the circuit 28-1 can be altered.

The simulated waveforms for this circuit 28-1 are illustrated in FIG. 28b. When the capacitance of the capacitor 28-2 is set to 1.7 pF, the waveform 28-8 is generated which is about 13.8 GHz. When the capacitance of the capacitor 28-2 is set to 1.0 pF, the waveform 28-7 is generated which is about 5.8 GHz. Thus, by varying the capacitance of a passive circuit that has a flux linkage to an LC tank circuit, the frequency of operation of the LC tank circuit can be altered.

The use of a varactor 28-10 to adjust the frequency of a oscillator 28-7 is illustrated in FIG. 28c. The oscillator outputs 28-8 and 28-9 are loaded with the capacitance of the varactor 28-10 controlled by the application of a DC voltage 28-11. As the voltage 28-11 is changed, the capacitance of the varactor changes and adjusts the frequency of the oscillator.

FIG. 28d illustrates the use of a digitally controlled capacitor 28-13 and 28-14 to adjust the frequency of the oscillator 28-12. As before, the capacitive loads 28-13 are applied to the outputs 28-7 and 28-8 of the oscillator 28-12. The switches 28-14 control the amount of capacitance connected to the oscillator. As more capacitance is added, the frequency decreases.

FIG. 28e shows the use of an enhancement mode transistor 28-16 used as an adjustable capacitor applied to the oscillator 28-15. The DC voltage 28-17 controls the adjustment of the amount of capacitance applied to the nodes 28-7 and 28-8 of the oscillator 28-15.

FIG. 28f illustrates a depletion transistor 28-19 used as an adjustable capacitor being applied to the nodes 28-7 and 28-8 of the oscillator 28-18. A DC voltage 28-20 makes the adjustment.

Due to (PVT) variations, a method of adjusting the capacitance of the flux linkage frequency adjustment circuit may be necessary. FIG. 29 illustrates a circuit description 29-1 that can be utilized to adjust the frequency of each individual oscillator. A finite state machine (FSM) 29-14 generates a bus signal 29-9 that enables the mux 29-8. The top oscillator sends its frequency signal after being amplified by the buffer 29-7 and passes the signal through the enabled mux to the output signal 29-10. This buffer can be a diff-amp, inverter, or any high speed buffer. This signal 29-10 is applied to the frequency detect circuit 29-12 which compares it against a reference oscillation signal 29-11. The output of the frequency detect determines whether the frequency is too low, within range, or too high and generates a signal 29-13. This signal is applied to the FSM 29-14, which then decides what to do. If the frequency is very far off, the FSM 29-14 may enable register 29-19 by the bus 29-9. Then the FSM will issue a coarse adjust weight on bus 29-2 that sets the register 29-19. This signal 29-2 can be digital signal or bus, analog, or a combination of both. The register 29-19 outputs a signal 29-21 to the coarse adjust capacitor 29-3. Then the process of comparing the signal from the top oscillator against the reference oscillator 29-11 is performed in the frequency detect circuit 29-12 again. This time if the frequency comparison is off less than a coarse adjust change, the FSM 29-14 can decide to reduce the frequency slightly, keep the frequency the same or increase it slightly. Assume that the FSM decides to alter the frequency, a signal is issued on 29-9 to disable register 29-19, holding the previously determined coarse adjust values, and to enable register 29-16. Fine adjust information is sent to the register 29-16 via the line 29-15. The register 29-16 issues the fine adjust on bus 29-17 which sets the weight that will adjust the fine adjust capacitors 29-6 within the top oscillator. There is also non-adjustable capacitor 29-4 that models the inductor and interconnect wiring parasitic capacitances. After the fine adjustment, if the frequency comparison in 29-12 is acceptable, the signal 29-13 instructs the FSM 29-14 to select the next oscillator using the signal 29-9. This signal 29-9 alters the mux connection so that the next buffer in the next oscillator can place its signal onto the lead 29-10 to be analyzed. In addition, the register 29-16 is disabled from being altered and the contents it holds remains fixed which maintains the correct fine adjust value for the capacitors 29-6 in the first oscillator. The next oscillator's coarse adjust register 29-20, for example, is enabled to get ready to set its register to the unique coarse adjust value.

FIG. 30a illustrates another method of adjusting the frequency of the LC tank circuit. This is a passive mechanical flux linkage frequency adjustment circuit 30-1. An LC tank circuit contains a regenerative circuit, an inductor 30-4 and generates two outputs 30-6 and 30-5. The inductor is mutually coupled via flux linkage to a second inductor 30-3. This second inductor 30-3 forms part of a tank circuit where the capacitor 30-2 forms the other part. The flux linkage is adjustable by varying the position of the second coil 30-3 with respect to the first coil 30-4. Thus, adjusting the k coupling coefficient can alter the frequency of operation of the adjustment circuit 30-1.

The simulated waveforms for this circuit 30-1 are illustrated in FIG. 30b. When the k value is set to 0.1, the waveform 30-14 is generated which is about 13.6 GHz. When the k value is set to 0.9, the waveform 30-13 is generated which is about 8.8 GHz. Thus, by varying the position of an inductor that has a flux linkage to an LC tank circuit, the frequency of operation of the LC tank circuit can be altered.

FIG. 30c illustrates a MEMS (Micro Electro Mechanical System) 30-1 containing an inductor on each of the two die making up the MEMS. The cross-sectional view has been simplified to provide the crux of the idea. For example, only one metal layer is shown on each die but those skilled in the art will appreciate that additional metal and dielectric layers can be added to the diagram without altering the idea. The lower die contains a substrate 30-2 and a dielectric layer 30-3 has been deposited on the substrate. A metal layer 30-5 with the shape of a coil (not shown) has been patterned on top of the dielectric layer 30-3. This inductor has its leads connected to the regenerative circuit (not shown). A dielectric layer 30-4 is deposited on the metal layer 30-5. Two posts 30-6 are placed on the dielectric layer 30-4. A second inductor is formed on the opposing substrate 30-12. A dielectric layer 30-11 is deposited on the substrate 30-12. A coil is patterned in the meal layer 30-10. A dielectric layer 30-9 is deposited on the metal. Two posts 30-8 are placed on the dielectric layer 30-10. The two sets of posts form a sliding surface which allows the top substrate to move vertically in and out of the page. This displacement causes the flux linkage between the two inductors to change. This change causes the frequency of the lower LC tank circuit to change that is the desired effect.

FIG. 31a depicts two instances of a representation of the physical layout 31-1 of the LC tank circuit given in FIG. 22b. This corresponds to a single regenerative circuit connected in parallel to four inductors. In addition, each of the inductors has an extension leg. This layout only generates only one balanced signal. The layout of the inductors insures that the current within the inductors flows in the same direction (clockwise, for example) within each inductor. Furthermore, note that the two layouts minimize the flux linkage between each other since there is a distance between the placement of these two layouts 31-1.

FIG. 31b illustrates these two physical layouts in a cross section view of an IC. Not all the layers are shown; for example, the semi-conducting layers where the transistors are formed are not depicted. In addition, not all the metal, poly, and oxide layers are indicated. This simplification only presents the crux of the invention without explaining the full detail of the cross sectional view. The IC has a substrate 31-4, and then an oxide layer 31-5 is deposited on the substrate. The metal conductors forming the inductors of 31-1 are deposited next as the layer 31-6. Finally, an oxide layer 31-7 coats the metal layer.

The top structure 31-9 is placed close to the surface of the IC. This structure 31-9 contains circuitry to generate RF signals. These signals can originate from individual inductors, cavity oscillators, antennas, or other forms of RF signal generation. These signals 31-8 are applied to the surface of the IC and are detected by the coils formed in the metallization 31-6. These signals 31-8 are used to force each of the LC tank circuits into synchronism. Thus, the external signal provides the stimulus to synchronize individual non-interacting LC tank circuits 31-1. That is, although the flux linkage between the layouts 31-1 is zero, the external stimulus 31-8 can be used to synchronize these independent cells.

Finally, it is understood that the above description are only illustrative of the principle of the current invention. It is understood that the various embodiments of the invention, although different, are not mutually exclusive. In accordance with these principles, those skilled in the art may devise numerous modifications without departing from the spirit and scope of the invention. For example, the inductor in a flux linkage system can be portioned into a physical layout that may be, but not limited to, circular, hexagonal, or rectangular. In another example, the MOS transistors illustrated in the regenerative circuit can be replaced by BJT transistor to provide a negative impedance and maintain the oscillations.

The invention claimed is:

1. An oscillator frequency adjustment apparatus comprising;
    a first output and a second output,
    one or more transformers where each transformer comprises at least two coils,
    an oscillator circuit comprising;
        at least one coil from the transformer,
        at least one capacitor,
        at least one regenerative circuit, and
        a means of coupling the coils, capacitors and regenerative circuits to form the oscillator circuit,
    the oscillator circuit is coupled to the first and second output,
    at least one adjustable tank circuit comprising;
        the second coil of the transformer, and
        at least one adjustable capacitor,
    the oscillator circuit is fabricated on a first substrate,
    the adjustable tank circuit is fabricated on a second substrate,
    the second coil of the adjustable tank circuit is placed over the coil of the oscillator circuit,
    wherein
    the first and second substrates form part of a MCM,
    at least one coil from the oscillator circuit has a flux linkage with the second coil from the
    adjustable tank circuit, and
    adjusting the one adjustable capacitor changes the frequency of operation of the apparatus.

2. An oscillator frequency adjustment apparatus comprising;
    a first output and a second output,
    an oscillator circuit comprising;
        two or more coils connected in parallel,
        at least one capacitor,
        at least one regenerative circuit, and
        a means of coupling the coils, capacitors and regenerative circuits to form the oscillator circuit,
    the oscillator circuit is coupled to the first and second output,
    at least one tank circuit comprising;
        at least one additional coil, and
        at least one capacitor, wherein
    at least one coil from the oscillator circuit has an adjustable flux linkage with the additional coil from the tank circuit, and
    the adjustable flux linkage is formed by a mechanical movement between the two coils, thereby adjusting the frequency of operation of the apparatus.

3. The apparatus of claim 2 further comprising;
    the oscillator circuit coil is fabricated on a first substrate,
    the additional tank circuit coil is fabricated on a second substrate, and
    the oscillator circuit coil is placed over the additional tank circuit coil, wherein
    the mechanical movement comprises;
    a parallel displacement of the second substrate with respect to the first substrate.

4. The apparatus of claim 2 further comprising;
    the oscillator circuit coil is fabricated on a first substrate,
    the additional tank circuit coil is fabricated on a second substrate, and
    the placement of the oscillator circuit coil over the additional tank circuit coil, wherein
    the mechanical movement comprises;
    a vertical displacement of the second substrate with respect to the first substrate.

5. The apparatus of claim 2, wherein the mechanical movement occurs within a MEMS.

6. An oscillator frequency adjustment apparatus comprising;
    a first output and a second output,
    one or more transformers where each transformer comprises at least two coils,
    an oscillator circuit comprising;
        at least one coil from the transformer,
        at least one capacitor,
        at least one regenerative circuit, and
        a means of coupling the coils, capacitors and regenerative circuits to form the oscillator circuit,
    the oscillator circuit is coupled to the first and second output,
    at least one tank circuit comprising;
        the second coil of the transformer, and
        at least one capacitor,
    the first coil from the oscillator circuit has an adjustable flux linkage with at least one coil from
    the tank circuit,
    the adjustable flux linkage is formed by a mechanical movement between the two coils, and
    the mechanical movement that occurs within a MCM can adjust the frequency of operation of the apparatus.

7. An oscillator frequency adjustment apparatus comprising;
    a first and second coil;
    a first tank circuit comprising;
        at least one coil, and
        at least one capacitor,
    an additional tank circuit comprising;
        at least one coil, and
        at least one capacitor,
    at least one coil from the first tank circuit has a flux linkage with at least one coil from the additional tank circuit,
    the first tank circuit is fabricated on a first substrate,
    the additional tank circuit is fabricated on a second substrate, and
    the coil of the additional tank circuit is placed over the coil of the first tank circuit, wherein
    the first and second substrates form part of a MCM, and
    at least one capacitor from the additional tank circuit can be adjusted, thereby
    to change the frequency of operation of the apparatus.

8. An oscillator frequency adjustment apparatus comprising;
    at least two tank circuits, wherein
    each tank circuit comprising;
        at least one coil, and
        at least one capacitor, wherein at least one coil from the first tank circuit has an adjustable flux linkage with at least one coil from the second tank circuit, wherein
the adjustable flux linkage is formed by a mechanical movement between the two coils, thereby adjusting the frequency of operation of the apparatus.

9. The apparatus of claim 8 further comprising;
the first coil is fabricated on a first substrate,
the second coil is fabricated on a second substrate, and
the first coil is placed over the second coil, wherein
the mechanical movement comprises;
a parallel displacement of the second substrate with respect to the first substrate.

10. The apparatus of claim 8 further comprising;
the first coil is fabricated on a first substrate,
the second coil is fabricated on a second substrate, and
the first coil is placed over the second coil, wherein
the mechanical movement comprises;
a vertical displacement of the second substrate with respect to the first substrate.

11. An oscillator frequency adjustment apparatus comprising:
a first output and a second output,
one or more transformers where each transformer comprises at least a first and second coil,
an oscillator circuit comprising:
the first coil of the transformer, and
at least one regenerative circuit, wherein
the oscillator circuit is coupled to the first and second outputs,
a first circuit comprising:
the second coil of the transformer, and
a first capacitor,
a first substrate comprising the oscillator circuit,
a second substrate comprising the first circuit,
the first coil of the first transformer is placed over the second coil of the first transformer, wherein an MCM is formed by the first and second substrates, and
a flux linkage is formed between the first coil and the second coil of the transformer, wherein the first capacitor can be adjusted to change the frequency of operation of the apparatus.

12. An oscillator frequency adjustment apparatus comprising;
an oscillator circuit comprising;
a first and second coil connected in parallel, and
a regenerative circuit, wherein
the oscillator circuit is coupled to a first and a second output,
a first circuit comprising a third coil, and
a flux linkage formed between the first coil of the oscillator circuit and the third coil of the first circuit, and
a mechanical movement between the first and third coils which adjusts the flux linkage, whereby the frequency of operation of the apparatus is adjusted.

13. The apparatus of claim 12 further comprising;
a first substrate comprising the first and second coils, and
a second substrate comprising the third coil, wherein
the mechanical movement is caused by a parallel displacement of the first substrate with respect to the second substrate.

14. The apparatus of claim 12 further comprising;
a first substrate comprising the first and second coils, and
a second substrate comprising the third coil, wherein
the mechanical movement is caused by a vertical displacement of the first substrate with respect to the second substrate.

15. The apparatus of claim 12, wherein the mechanical movement occurs within a MEMS.

16. An oscillator frequency adjustment apparatus comprising;
one or more transformers where each transformer comprises at least a first and a second coil,
an oscillator circuit comprising;
the first coil from the transformer, and
a regenerative circuit, wherein
the oscillator circuit is coupled to a first and a second output,
a first circuit comprising;
the second coil of the transformer,
a flux linkage formed between the first coil of the oscillator circuit and the second coil of the first circuit, and
a mechanical movement between the first and second coils changes the flux linkage, whereby the frequency of operation of the apparatus is adjusted.

17. The apparatus of claim 16 further comprising;
a first substrate comprising the first coil, and
a second substrate comprising the second coil, wherein
the mechanical movement is caused by a parallel displacement of the first substrate with respect to the second substrate.

18. The apparatus of claim 16 further comprising;
a first substrate comprising the first and second coils connected in parallel, and
a second substrate comprising the third coil, wherein
the mechanical movement is caused by a vertical displacement of the first substrate with respect to the second substrate.

19. The apparatus of claim 16, wherein the mechanical movement occurs within a MEMS.

20. An oscillator frequency adjustment apparatus comprising;
a first substrate comprising;
a first circuit comprising;
a first and second output,
a plurality of coils each having a first and second lead, and
the first and second leads of the plurality of coils directly connected respectively to the first and second outputs,
a second substrate comprising;
a second circuit comprising;
a second coil,
a first coil from the plurality of coils having a flux linkage with the second coil from the second circuit, and
a mechanical movement between the first and second substrates adjusting the flux linkage,
whereby
the frequency of operation of the apparatus is adjusted.

21. The apparatus of claim 20, wherein
the mechanical movement is caused by a parallel displacement of the first substrate with respect to the second substrate.

22. The apparatus of claim 20, wherein
the mechanical movement is caused by a vertical displacement of the first substrate with respect to the second substrate.

23. The apparatus of claim 20, wherein the mechanical movement occurs within a MEMS.

* * * * *